(12) United States Patent
Lee et al.

(10) Patent No.: US 12,501,660 B2
(45) Date of Patent: Dec. 16, 2025

(54) FIELD EFFECT TRANSISTOR WITH MERGED EPITAXY BACKSIDE CUT AND METHOD

(71) Applicant: Taiwan Semiconductor Manufacturing Co., Ltd., Hsinchu (TW)

(72) Inventors: Wei Ju Lee, Hsinchu (TW); Zhi-Chang Lin, Hsinchu (TW); Chun-Fu Cheng, Hsinchu (TW); Chung-Wei Wu, Hsinchu (TW); Zhiqiang Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 672 days.

(21) Appl. No.: 17/564,125

(22) Filed: Dec. 28, 2021

(65) Prior Publication Data

US 2022/0336613 A1  Oct. 20, 2022

Related U.S. Application Data

(60) Provisional application No. 63/176,000, filed on Apr. 16, 2021.

(51) Int. Cl.
*H01L 29/423* (2006.01)
*H10D 30/67* (2025.01)
(Continued)

(52) U.S. Cl.
CPC ..... *H10D 30/6735* (2025.01); *H10D 30/6713* (2025.01); *H10D 30/6757* (2025.01); *H10D 62/116* (2025.01); *H10D 62/118* (2025.01); *H10D 84/0128* (2025.01); *H10D 84/013* (2025.01); *H10D 84/0151* (2025.01); *H10D 84/038* (2025.01)

(58) Field of Classification Search
None
See application file for complete search history.

(56) References Cited

U.S. PATENT DOCUMENTS 9,236,267 B2   1/2016   De et al.
9,368,496 B1 *  6/2016   Yu ......................... H10D 84/834
(Continued)

*Primary Examiner* — Long Pham
(74) *Attorney, Agent, or Firm* — Seed Intellectual Property Law Group LLP

(57) ABSTRACT

A device includes a substrate, a first semiconductor channel over the substrate, and a second semiconductor channel over the substrate and laterally separated from the first semiconductor channel. A gate structure covers and wraps around the first semiconductor channel and the second semiconductor channel. A first source/drain region abuts the first semiconductor channel on a first side of the gate structure, and a second source/drain region abuts the second semiconductor channel on the first side of the gate structure. An isolation structure is under and between the first source/drain region and the second source/drain region, and includes a first isolation region in contact with bottom surfaces of the first and second source/drain regions, and a second isolation region in contact with sidewalls of the first and second source/drain regions, and extending from a bottom surface of the first isolation region to upper surfaces of the first and second source/drain regions.

20 Claims, 43 Drawing Sheets

(51) Int. Cl.
*H10D 62/10* (2025.01)
*H10D 84/01* (2025.01)
*H10D 84/03* (2025.01)

(56) References Cited

U.S. PATENT DOCUMENTS

| | | | |
|---|---|---|---|
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,014,296 B1* | 7/2018 | Dou | H10D 30/024 |
| 10,121,788 B1* | 11/2018 | Wang | H01L 21/762 |
| 10,804,375 B2* | 10/2020 | Yun | H10D 30/026 |
| 2021/0020763 A1* | 1/2021 | Yun | H10D 30/025 |

* cited by examiner

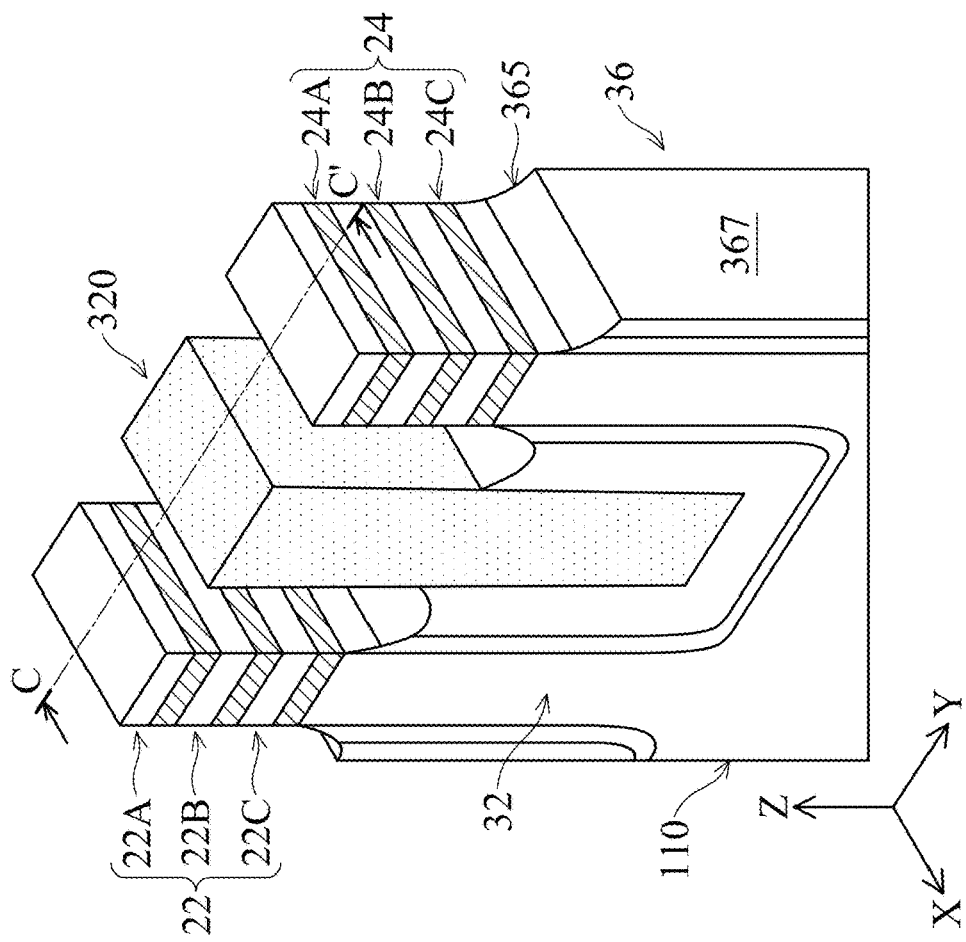
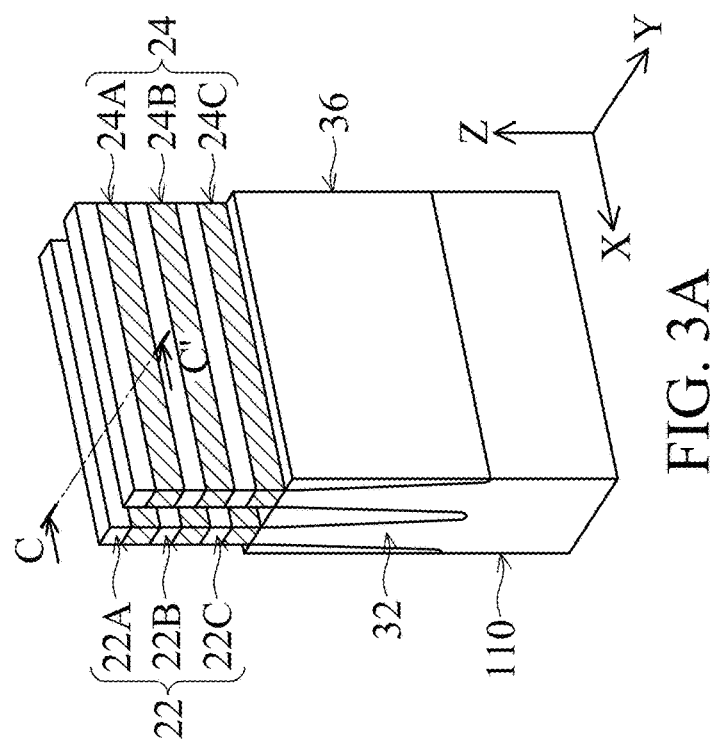
FIG. 3B
FIG. 3A

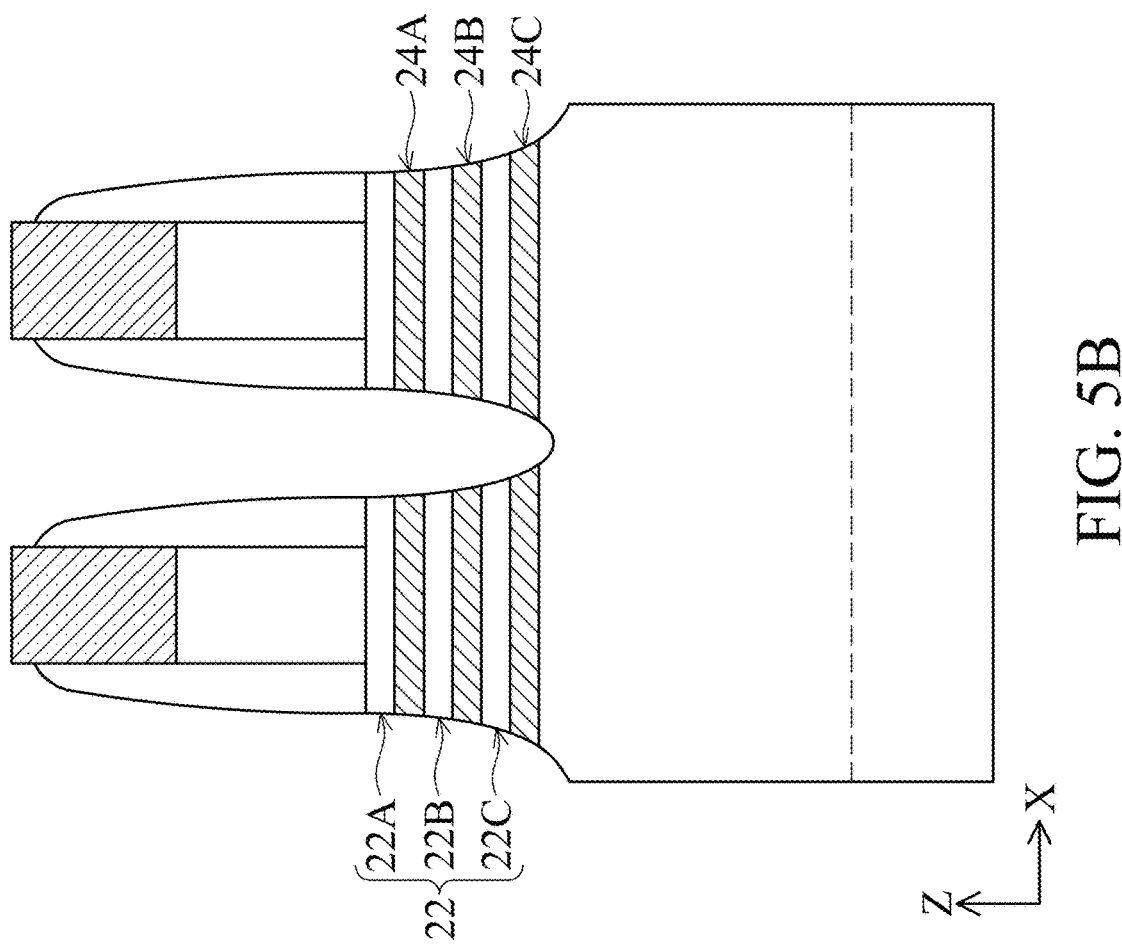
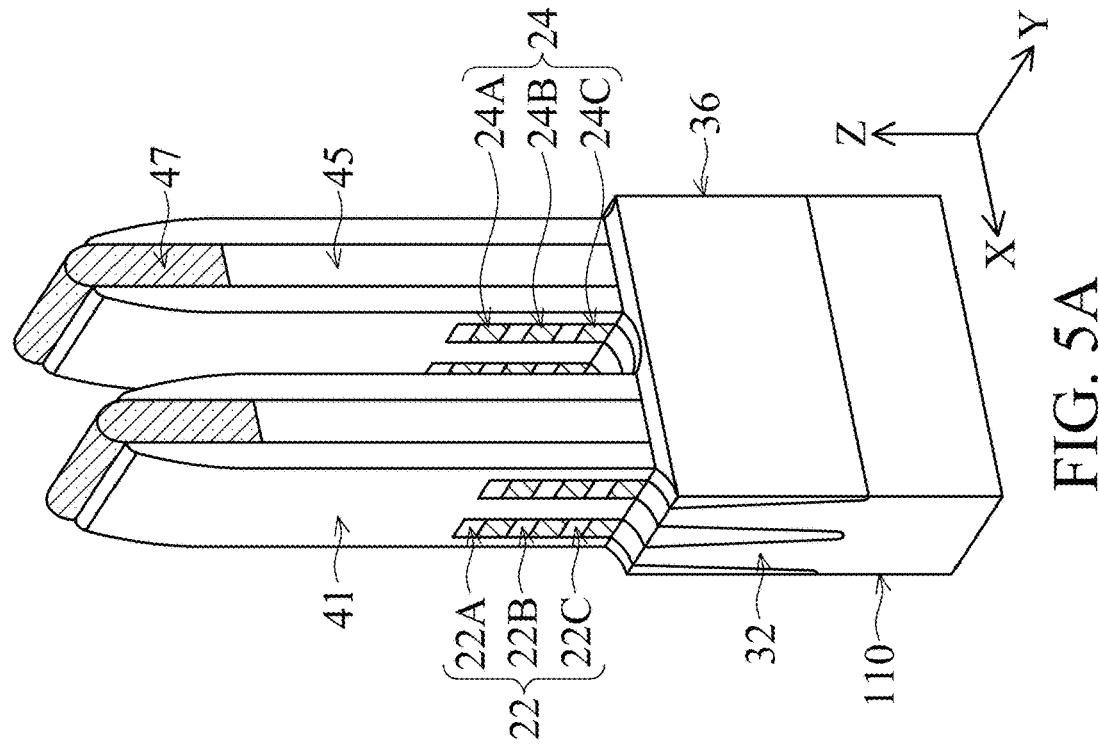
FIG. 5B
FIG. 5A

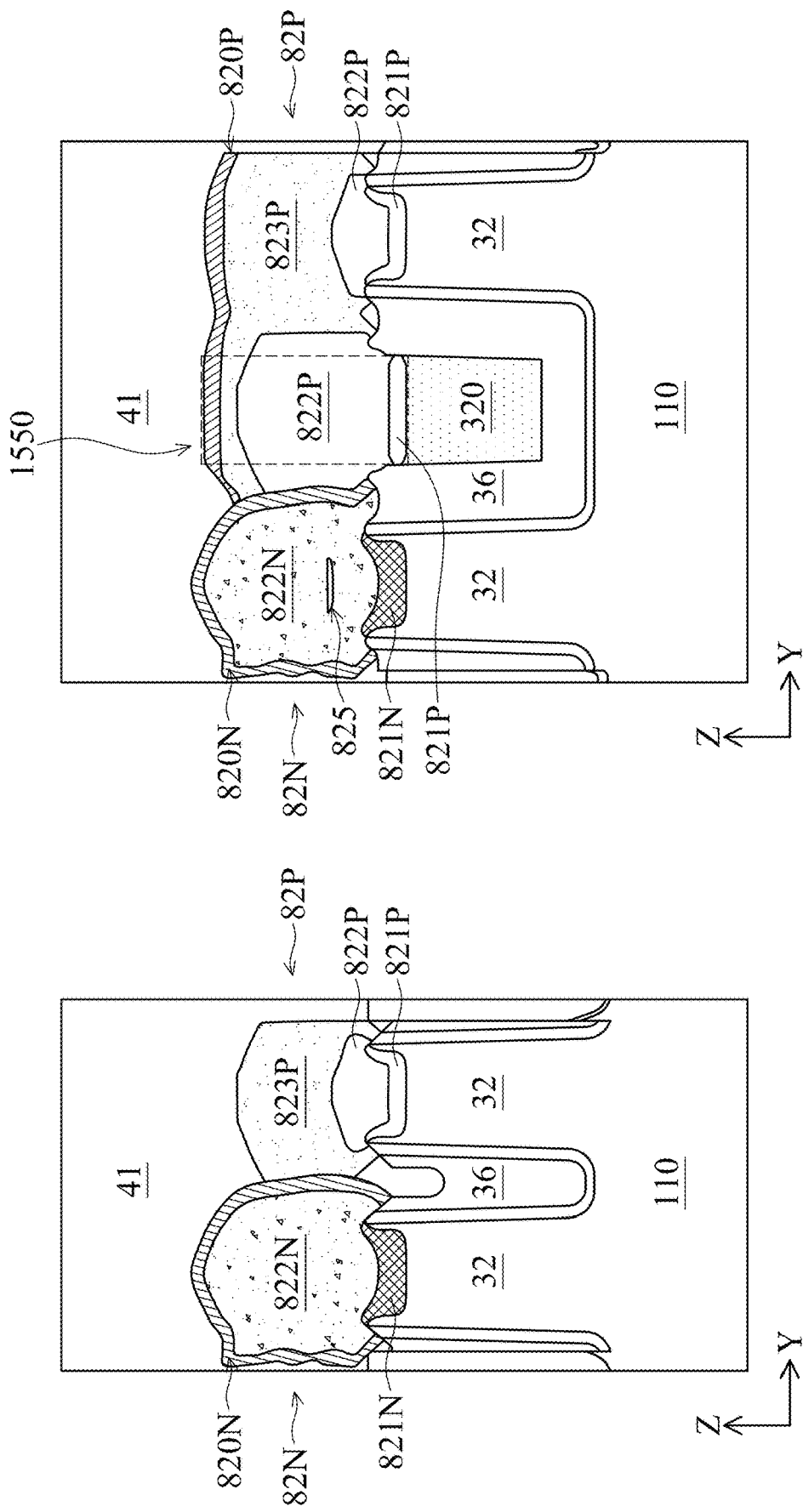

FIELD EFFECT TRANSISTOR WITH MERGED EPITAXY BACKSIDE CUT AND METHOD

PRIORITY CLAIM AND CROSS-REFERENCE

This application claims the benefit of priority to U.S. Provisional Application Ser. No. 63/176,000, entitled "NANOSHEET SEMICONDUCTOR DEVICE AND PROCESSING METHOD THEREOF," filed on Apr. 16, 2021, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
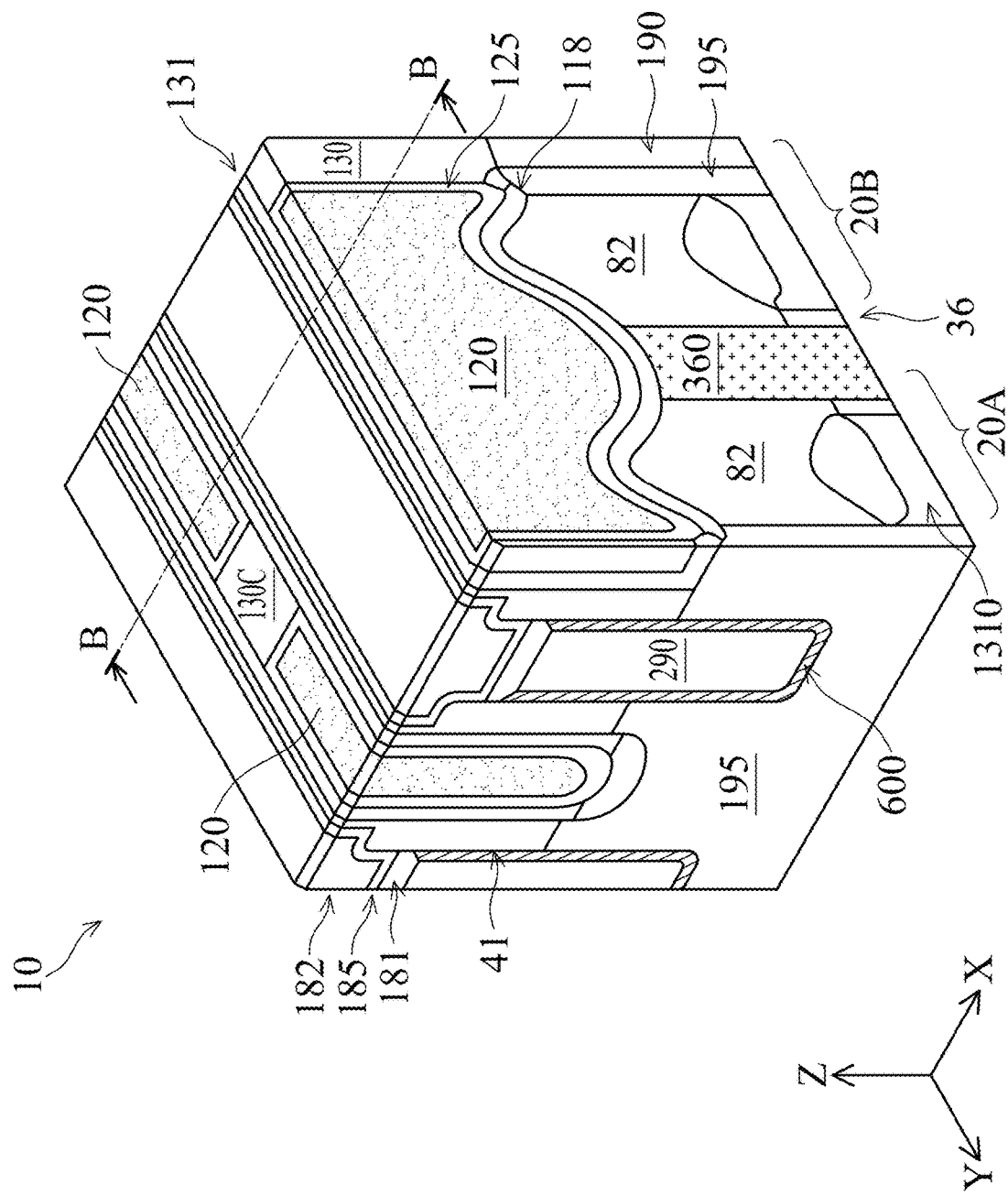
FIGS. 1A and 1B are diagrammatic perspective and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. Nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA gate structure.

As transistor dimensions shrink, merger of source and drain epitaxial features of neighboring transistors becomes difficult to avoid. If merger is avoided, source and drain epitaxial features formed may be insufficiently separated, leading to undesirable parasitic capacitance between lateral sidewalls of the neighboring source and drain epitaxial features. As such, the source and drain epitaxial features may be formed to merge intentionally, with the expectation that the merged features will be separated in a subsequent operation.

Embodiments include additional backside processing that cuts the merged source and drain epitaxial features, then fills the opening with a dielectric material, such as silicon oxide. For neighboring transistors that are separated by a short space, good merger may occur, such that an etching operation in the cutting substantially effects the source and drain epitaxial features without overetching into neighboring layers, such as an interlayer dielectric (ILD) covering the source and drain epitaxial features. When the neighboring transistors are separated by a long space, the merger may be incomplete or not present, such that the etching operation, while removing the lateral sidewalls of the source and drain epitaxial features, also removes a substantial portion of the ILD.

Transistors disclosed herein have source and drain epitaxial features that are sufficiently merged prior to cutting regardless of spacing between neighboring transistors. A silicon feature that acts as a seed layer during formation of the source and drain epitaxial features is formed as a dummy fin in and on a shallow trench isolation (STI) region between the neighboring transistors, or as a buried silicon feature in the STI region, when the neighboring transistors are separated by a long space. As such, during formation of the source and drain epitaxial features, the merger is substantially complete, allowing for cutting of the source and drain epitaxial features without overetching into the ILD. Better lateral separation between the source and drain epitaxial features of the neighboring transistors is also accomplished, dramatically reducing parasitic capacitance.

FIG. 1A illustrates a perspective view of a portion of an IC device 10 fabricated according to embodiments of the present disclosure, where the IC device 10 includes nanostructure devices 20A, 20B, which may be gate-all-around (GAA) devices 20A, 20B. The nanostructure devices 20A, 20B may include at least an NFET or a PFET in some embodiments. For example, the nanostructure device 20A is an NFET, and the nanostructure device 20B is a PFET, in accordance with some embodiments. In some other embodiments, the nanostructure device 20A is a PFET and the nanostructure device 20B is an NFET. In yet other embodiments, the nanostructure devices 20A, 20B are both NFETs or are both PFETs.

Figure 1B:
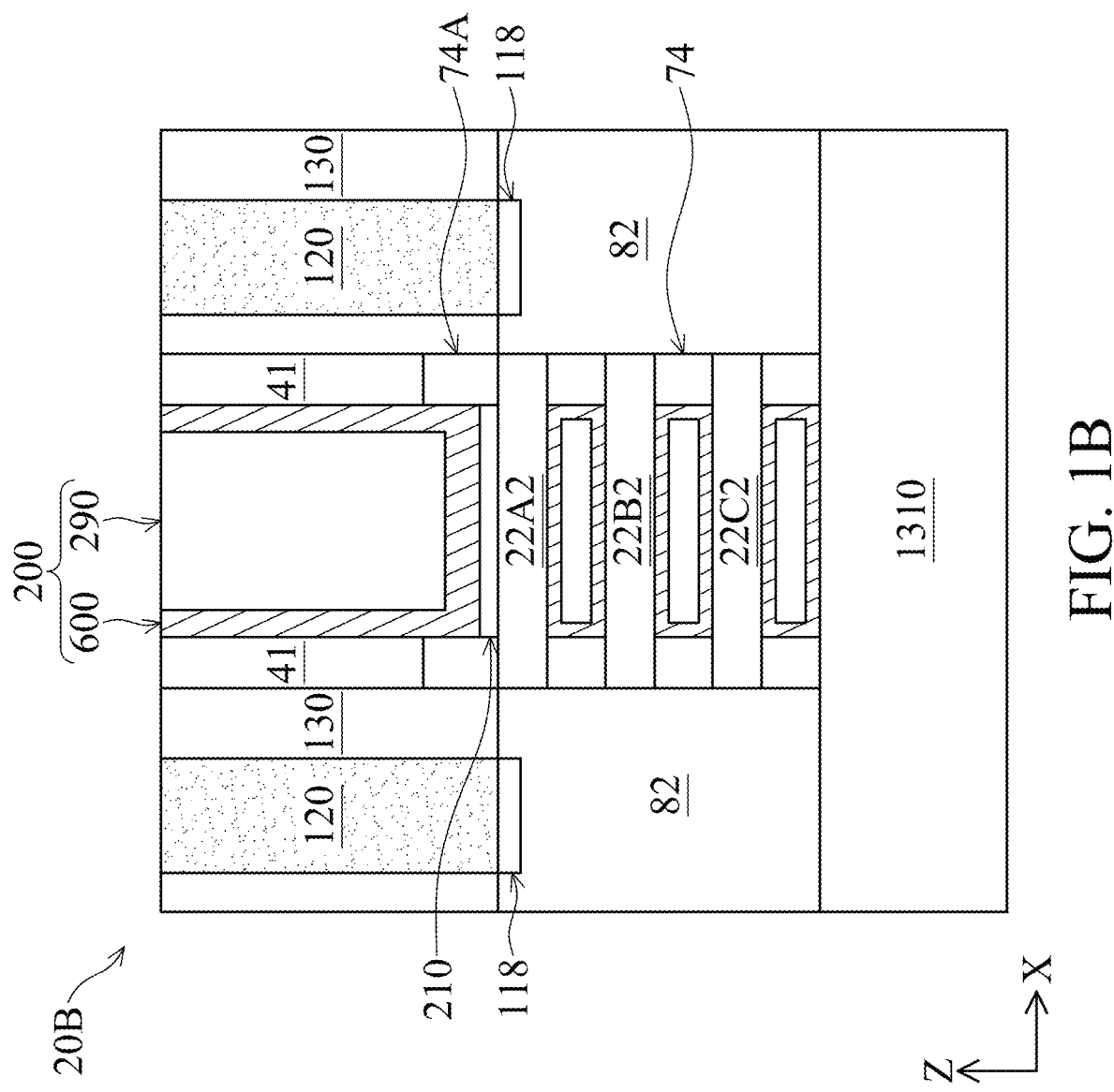

The cross-sectional view of the IC device 10 in FIG. 1B is taken along an X-Z plane, where the X-direction is the horizontal direction, and the Z-direction is the vertical direction. The nanostructure device 20B is shown as an example in FIG. 1B. The nanostructure devices 20A, 20B each include channels 22A1-22C1, 22A2-22C2 (alternately referred to as "nanostructures") over a substrate or a fin structure 32. In the nanostructure device 20B shown in FIG. 1B, the channels 22A2-22C2 are laterally abutted by source/drain features 82, and covered and surrounded by gate structure 200B. The gate structure 200B controls flow of electrical current through the channels 22A2-22C2 based on voltages applied at the gate structure 200B and at the source/drain features 82.

In some embodiments, the fin structure 32 includes silicon, silicon germanium, silicon carbide, silicon carbon phosphide or another suitable semiconductor material. The fin structure 32 may have width (along the X-direction) in a range of about 5 nm to about 50 nm, and height in a range of about 100 nm to about 300 nm, or other suitable dimensions. In some embodiments, the nanostructure device 20A is an NFET, and the source/drain features 82 thereof include silicon phosphorous (SiP) or another suitable material. In some embodiments, the nanostructure device 20B is a PFET, and the source/drain features 82 thereof include silicon germanium (SiGe) or another suitable material.

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nano-wire/nanowire (NW) shape, a nano-sheet/nanosheet (NS) shape, a nano-tube/nanotube (NT) shape, or other suitable nanoscale shape. The cross-sectional profile of the channels 22A2-22C2 may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A may be less than a length of the channel 22B, which may be less than a length of the channel 22C. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape.

In some embodiments, the spacing between the channels 22A2-22C2 (e.g., between the channel 22B and the channel 22A or the channel 22C) is in a range between about 5 nanometers (nm) and about 20 nm. In some embodiments, a thickness (e.g., measured in the Z-direction) of each of the channels 22A2-22C2 is in a range between about 2 nm and about 8 nm. In some embodiments, a width (e.g., measured in the Y-direction, not shown in FIG. 1A, orthogonal to the X-Z plane) of each of the channels 22A2-22C2 is at least about 5 nm, or in a range of about 5 nm to about 60 nm.

The gate structure 200 is disposed over and between the channels 22A2-22C2, respectively. A first interfacial layer ("IL") 210, which may be an oxide of the material of the channels 22A2-22C2, is formed on exposed areas of the channels 22A2-22C2 and the top surface of the fin 32. The first IL layer 210 promotes adhesion of the gate dielectric layer 220 to the channels 22A2-22C2. In some embodiments, the first IL layer 210 has thickness of about 5 Angstroms (A) to about 50 Angstroms (A). In some embodiments, the first IL layer 210 has thickness of about 10 A. The first IL layer 210 having thickness that is too thin may exhibit voids or insufficient adhesion properties. The first IL layer 210 being too thick consumes gate fill window, which is related to threshold voltage tuning, resistance and reliability as described above.

A gate dielectric layer 600 includes a high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. In some embodiments, the gate dielectric layer 600 has thickness of about 5 A to about 100 A. In some embodiments, the gate dielectric layer 600 comprises at two HK layers, such as a first high-k dielectric layer including, for example, $HfO_2$ with dipole doping (e.g., La, Mg), and a second high-k dielectric layer including, for example, ZrO with crystallization, which is a higher-k material than $HfO_2$. Other suitable combinations of high-k dielectric layers including other suitable materials may also be substituted.

The gate structure 200 also includes metal fill layer 290. The metal fill layer 290 may include a conductive material such as tungsten, cobalt, ruthenium, iridium, molybdenum, copper, aluminum, or combinations thereof. Between the channels 22A2-22C2, the metal fill layer 290 is circumferentially surrounded (in the cross-sectional view) by the gate dielectric layer 600. In the portion of the gate structure 200 formed over the channel 22A most distal from the fin 32, the metal fill layer 290 may be formed over a work function metal layer structure 900 (see FIG. 18). The work function metal layer structure 900 wraps around the metal fill layers 290. The gate dielectric layer 600 also wraps around the work function metal layer structure 900.

Figure 18:
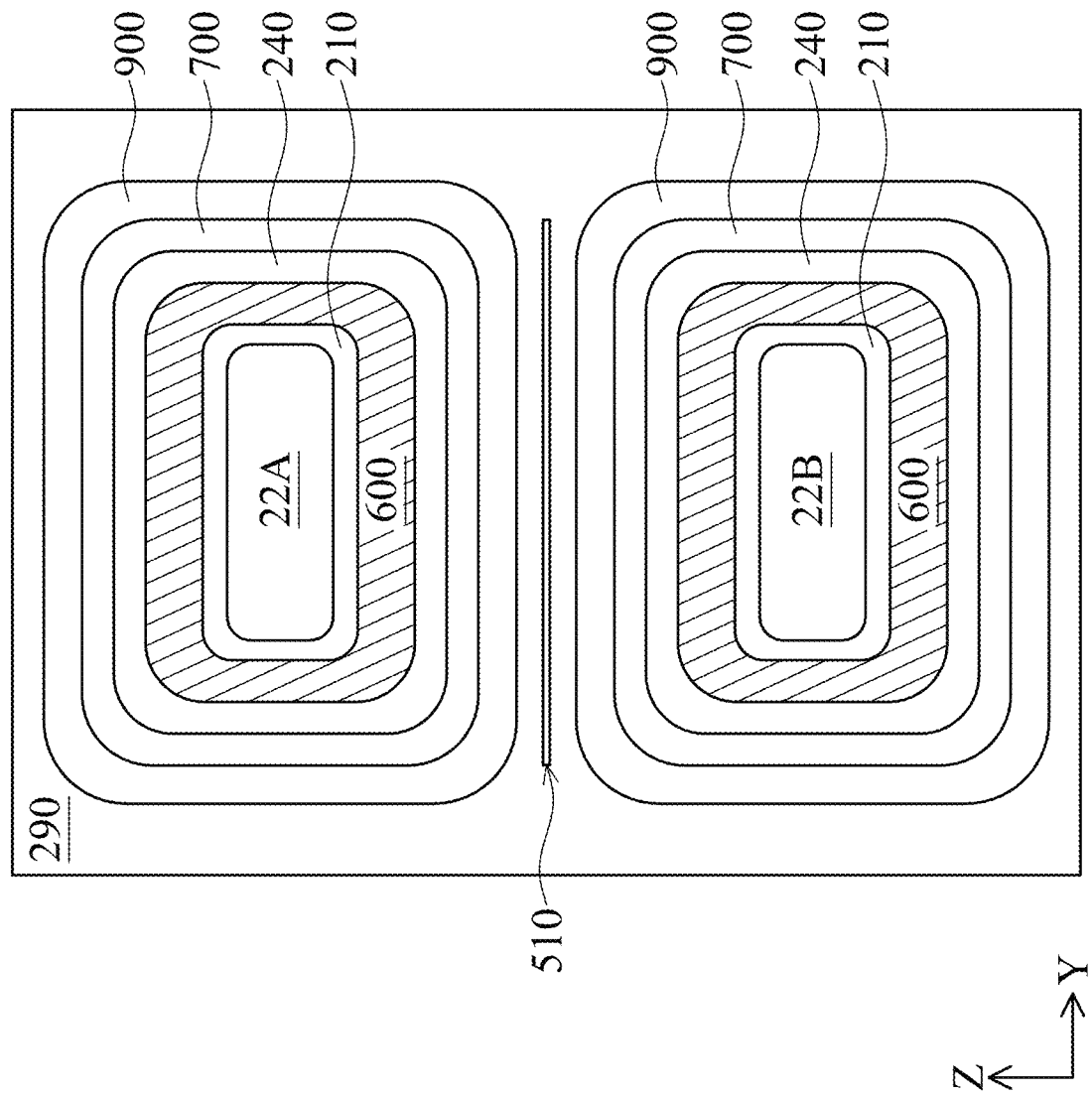

The gate structure 200 may further include one or more work function metal layers 300, a protection layer structure 270, and a glue layer 280, which may be referred to collectively as the work function metal layer structure 900 (see FIG. 18). In the nanostructure device 20A, which is an NFET in most embodiments, the work function metal layer structure 900 may include at least an N-type work function metal layer, an in-situ capping layer, and an oxygen blocking layer. In some embodiments, the work function metal layer structure 900 includes more or fewer layers than those described.

The nanostructure devices 20A, 20B also include gate spacers 41 and inner spacers 74 that are disposed on sidewalls of the gate dielectric layer 220. The inner spacers 74 are also disposed between the channels 22A2-22C2. The gate spacers 41 and the inner spacers 74 may include a dielectric material, for example a low-k material such as SiOCN, SiON, SiN, or SiOC.

The nanostructure devices 20A, 20B further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The nanostructure devices 20A, 20B further include an interlayer dielectric (ILD) 130. The ILD 130 provides electrical isolation between the various components of the nanostructure devices 20A, 20B discussed above, for example between the gate structure 200 and the source/drain contacts 120.

Referring again to FIG. 1A, overlying the gate dielectric layer 600 and the gate fill layer 290 are a conductive layer 181, an optional hard dielectric layer 185, and a capping layer 182. The conductive layer 181 reduces contact resistance between a gate contact (not shown in FIG. 1A) and the gate fill layer 290. In some embodiments, the conductive layer 181 comprises a metal, such as tungsten, aluminum, copper, ruthenium, or the like. The capping layer 182, also referred to as a "self-aligned capping" (SAC) layer, may be a dielectric layer including a dielectric material, such as silicon nitride, or other suitable dielectric material. Between the capping layer 182 and the conductive layer 181 is the optional hard dielectric layer 185. The hard dielectric layer 185 may prevent current leakage following one or more etching operations, which may be performed to form gate contacts, source/drain contacts 120, isolation structures (e.g., source/drain contact isolation structures 130C), or the like. In some embodiments, the hard dielectric layer 185 is or comprises a dielectric material that is harder than, for example, the capping layer 182, such as aluminum oxide, or other suitable dielectric material. The hard dielectric layer 185 may also be between the capping layer 182 and the spacer layer 41. In some embodiments, one or more of the source/drain contacts 120 may be isolated by the source/drain contact isolation structure 130C. In some embodiments, the source/drain contact isolation structure 130C is or comprises the same material as the ILD 130.

FIG. 1A further illustrates cell boundary structures, which may include a liner layer 195 and a fill layer 190. In some embodiments, the liner layer 195 abuts the source/drain regions 82 and the gate dielectric layers 600. The liner layer 195 may be or include a high-k dielectric material, such as $HfO_2$, HfSiO, HfSiON, HfTaO, HfSiO, HfZrO, $ZrO_2$, $Ta_2O_5$, or combinations thereof. The fill layer 190 may be laterally surrounded by the liner layer 195, and may be or include a low-k dielectric material, such as SiOCN, SiON, SiN, SiOC, or the like. The cell boundary structures may be configured to isolate a circuit cell, such as a memory cell, from neighboring circuits, which may be other similar circuit cells, or may be driver circuits, logic circuits, or other suitable circuits.

Figure 19:
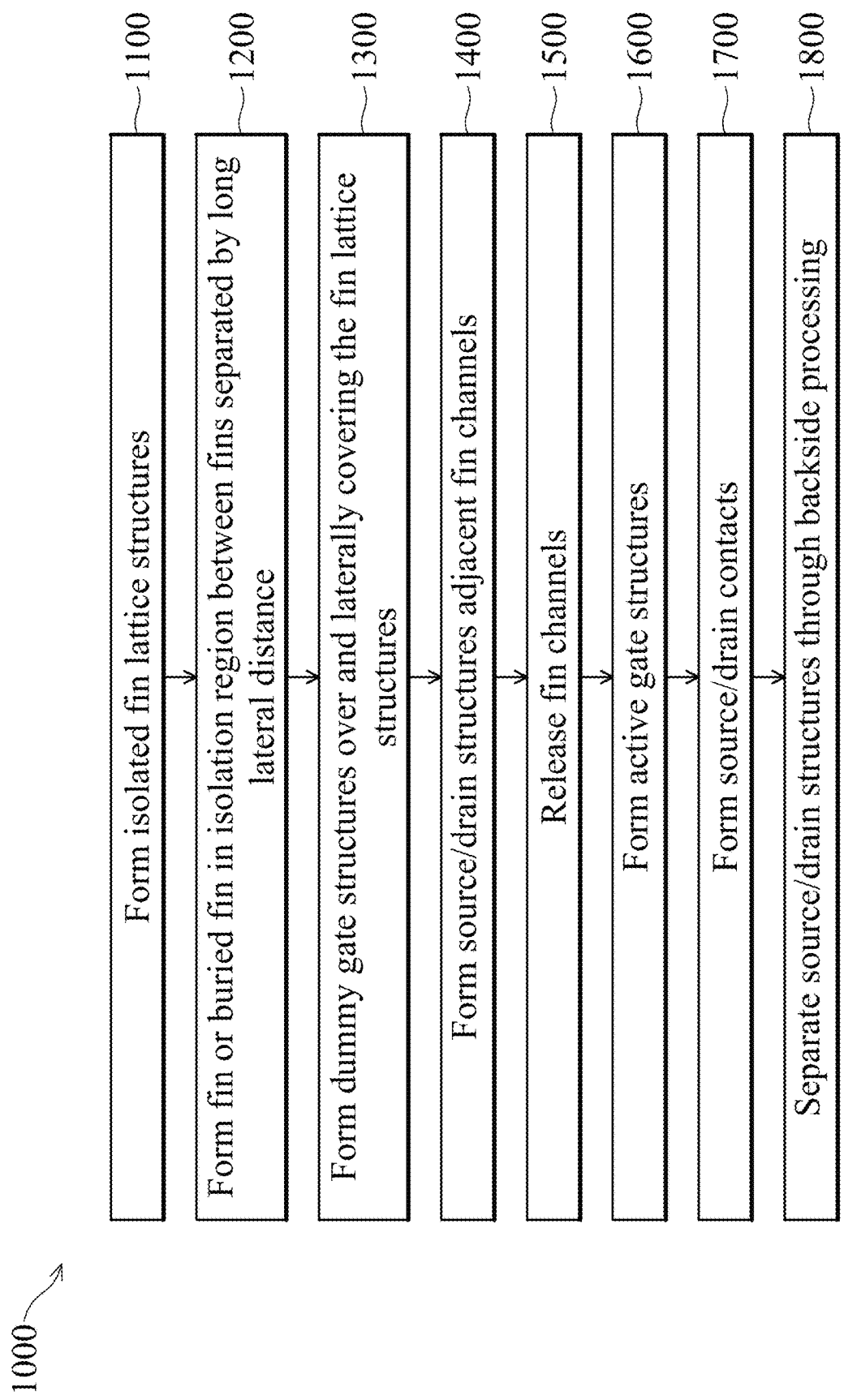
FIGS. 19 and 20 are flowcharts illustrating a method of fabricating a semiconductor device in accordance with various embodiments.
Figure 20:
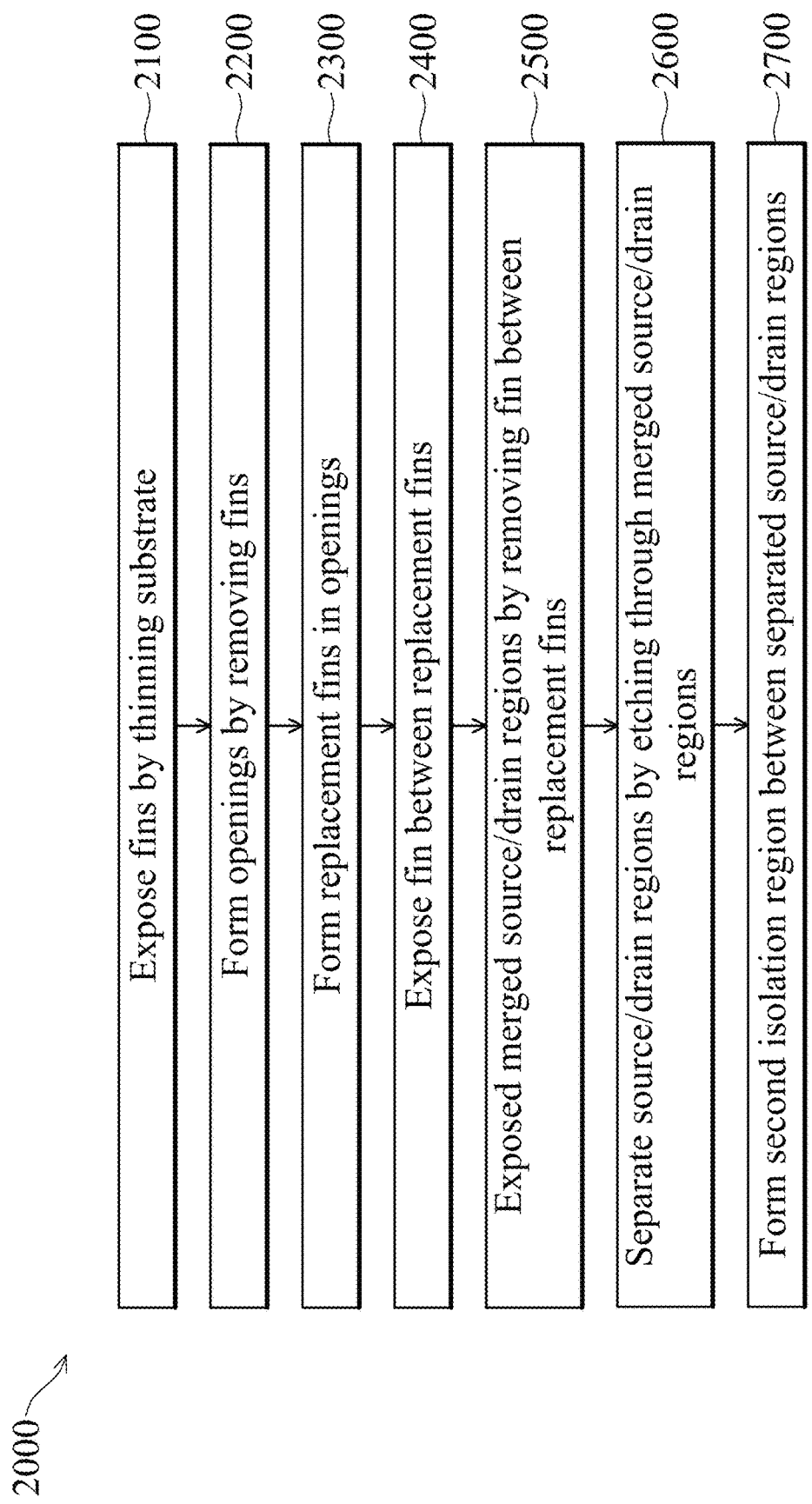

FIGS. 19, 20 illustrate flowcharts illustrating methods 1000, 2000 for forming an IC device or a portion thereof from a workpiece, according to one or more aspects of the present disclosure. Methods 1000, 2000 are merely examples and are not intended to limit the present disclosure to what is explicitly illustrated in methods 1000, 2000. Additional acts can be provided before, during and after the methods 1000, 2000 and some acts described can be replaced, eliminated, or moved around for additional embodiments of the methods. Not all acts are described herein in detail for reasons of simplicity. Methods 1000, 2000 are described below in conjunction with fragmentary cross-sectional views of a workpiece (shown in FIGS. 2A-18) at different stages of fabrication according to embodiments of methods 1000, 2000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 2B:
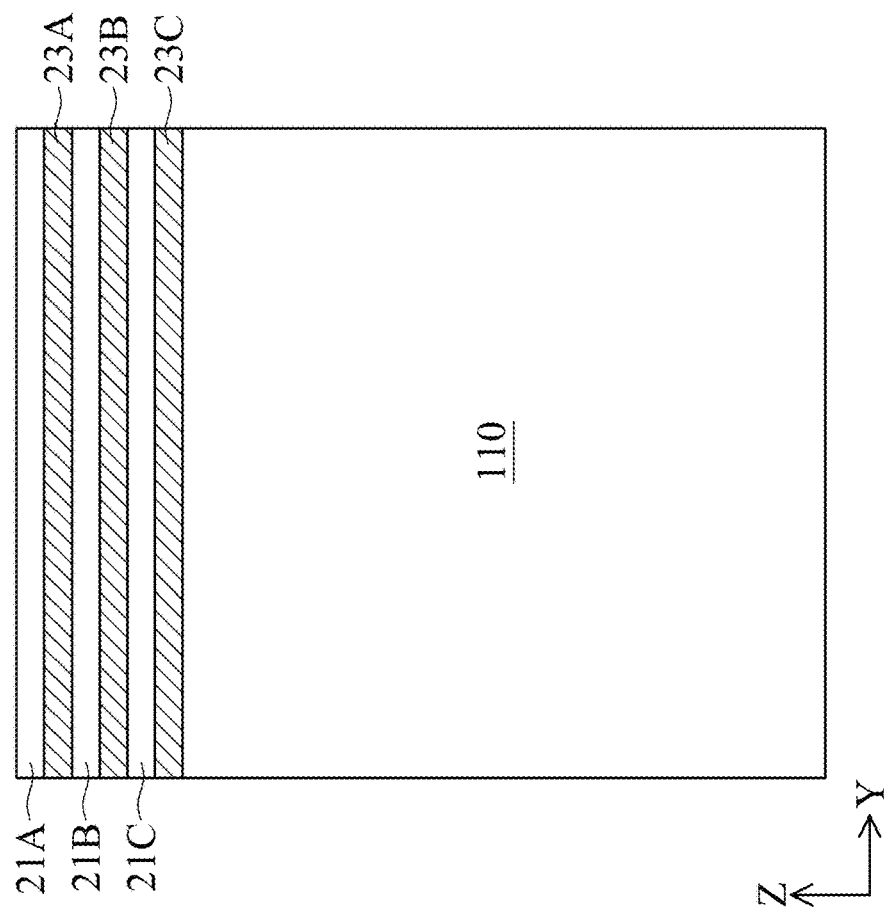
FIGS. 2A-18 are views of various embodiments of an IC device of at various stages of fabrication in accordance with various embodiments.
Figure 2A:
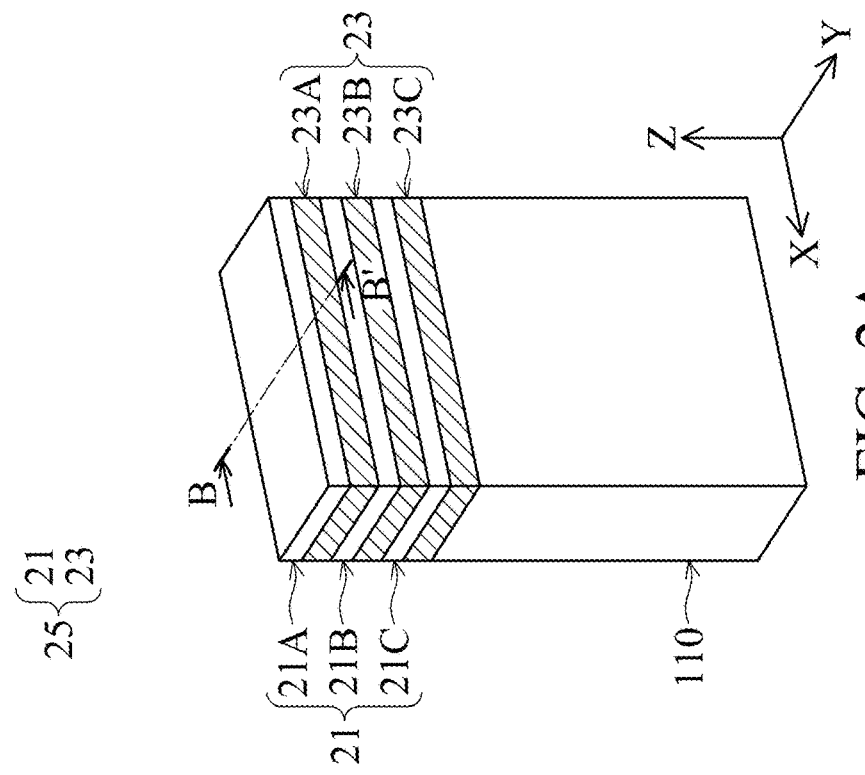

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3D:
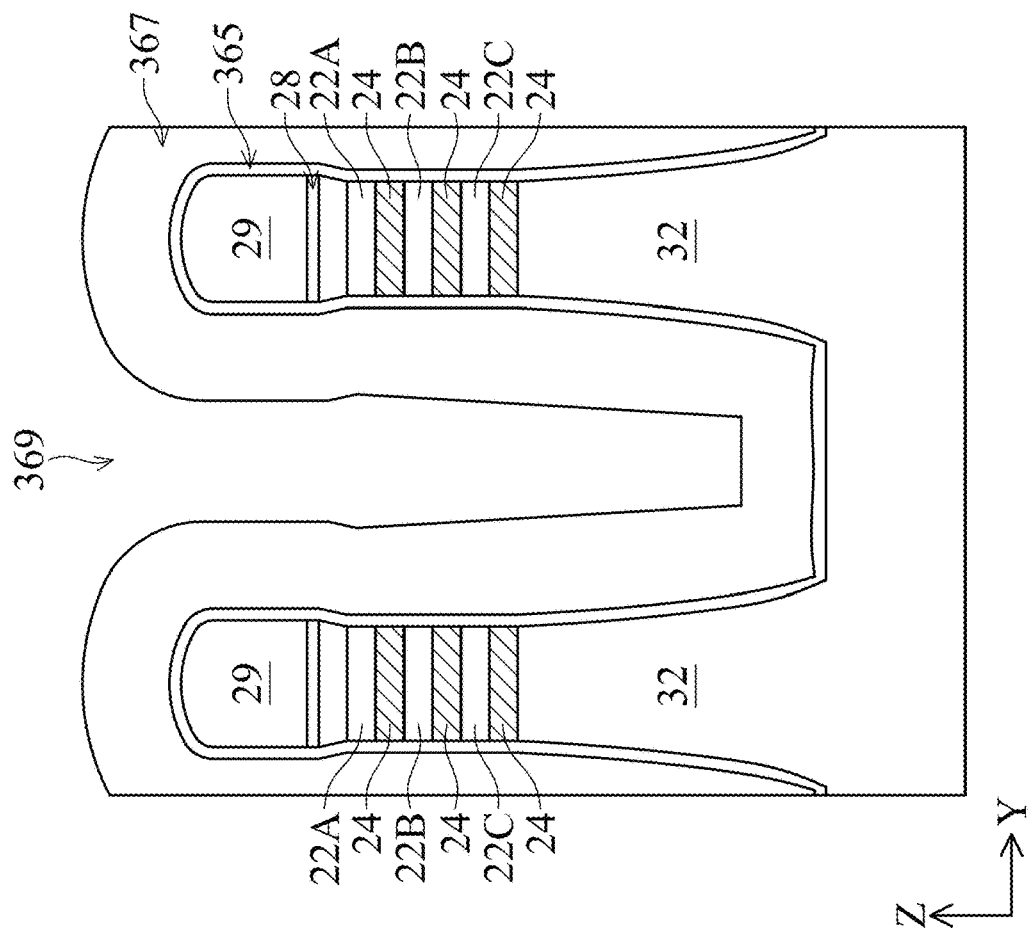
Figure 3C:
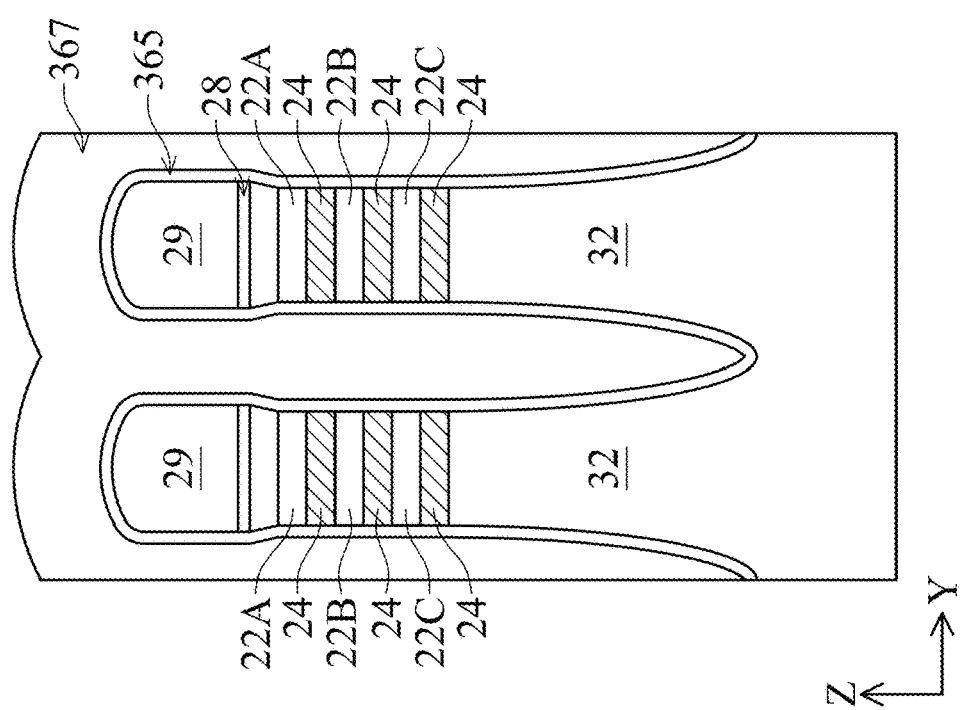
Figure 3F:
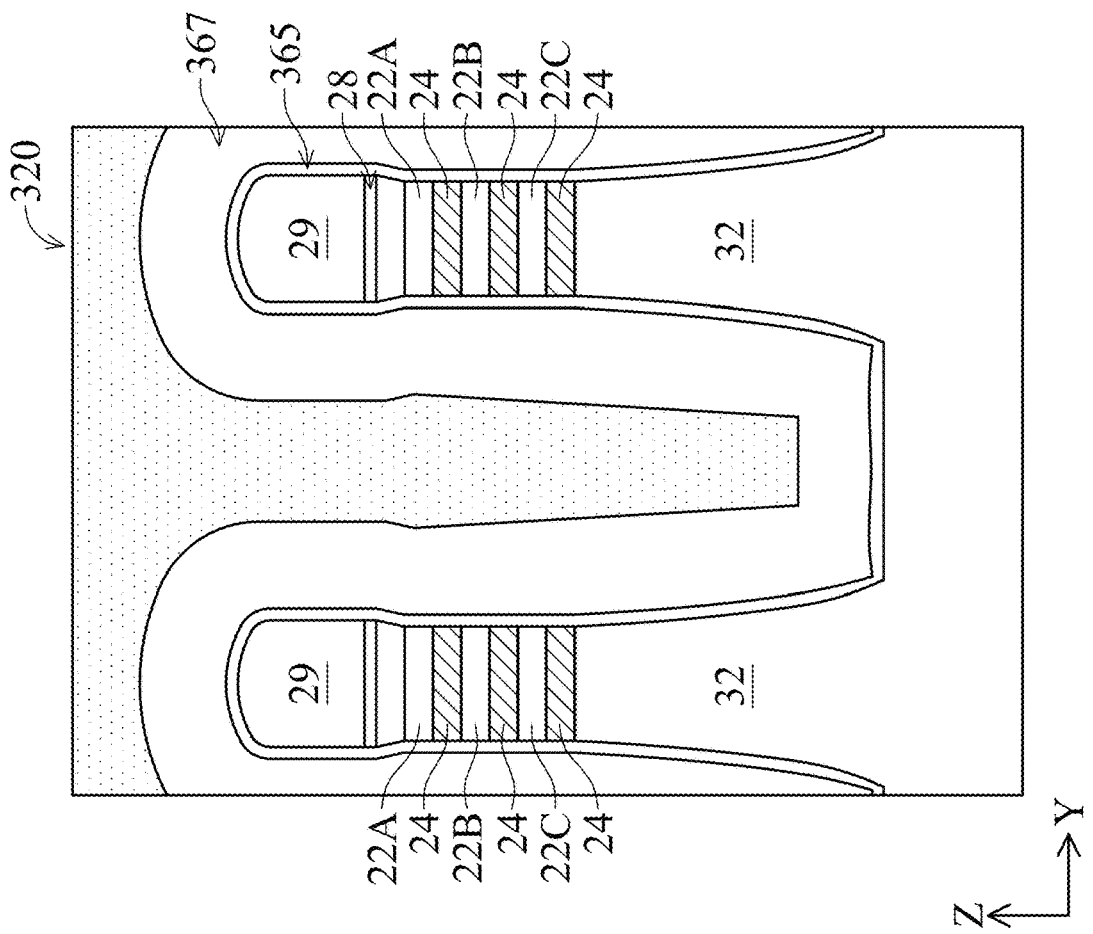
Figure 3E:
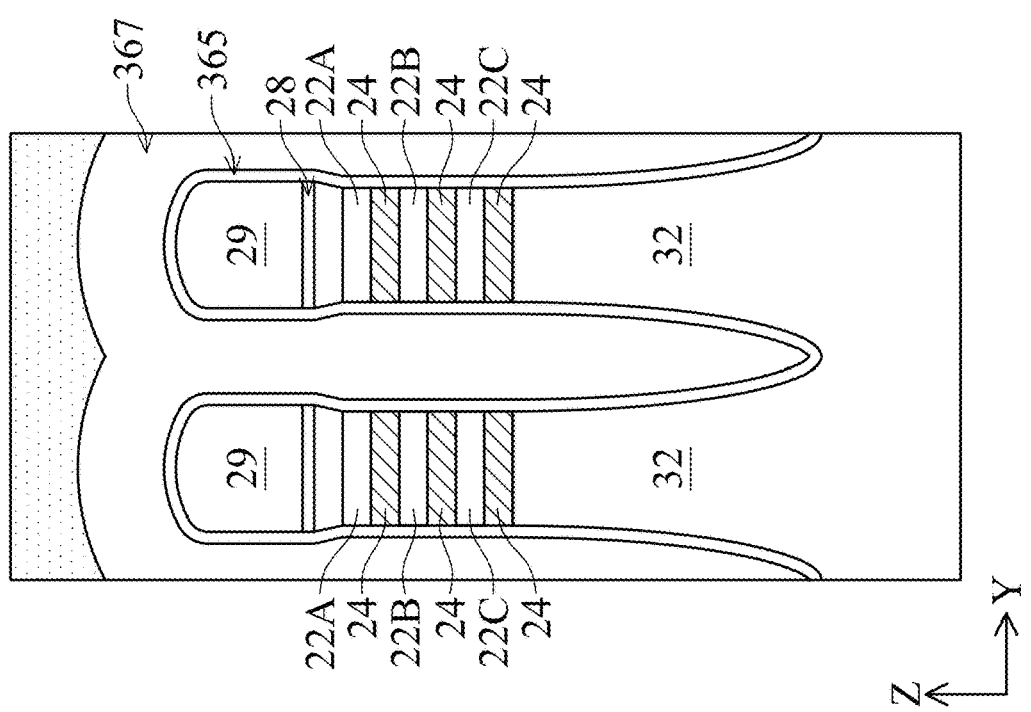
Figure 3H:
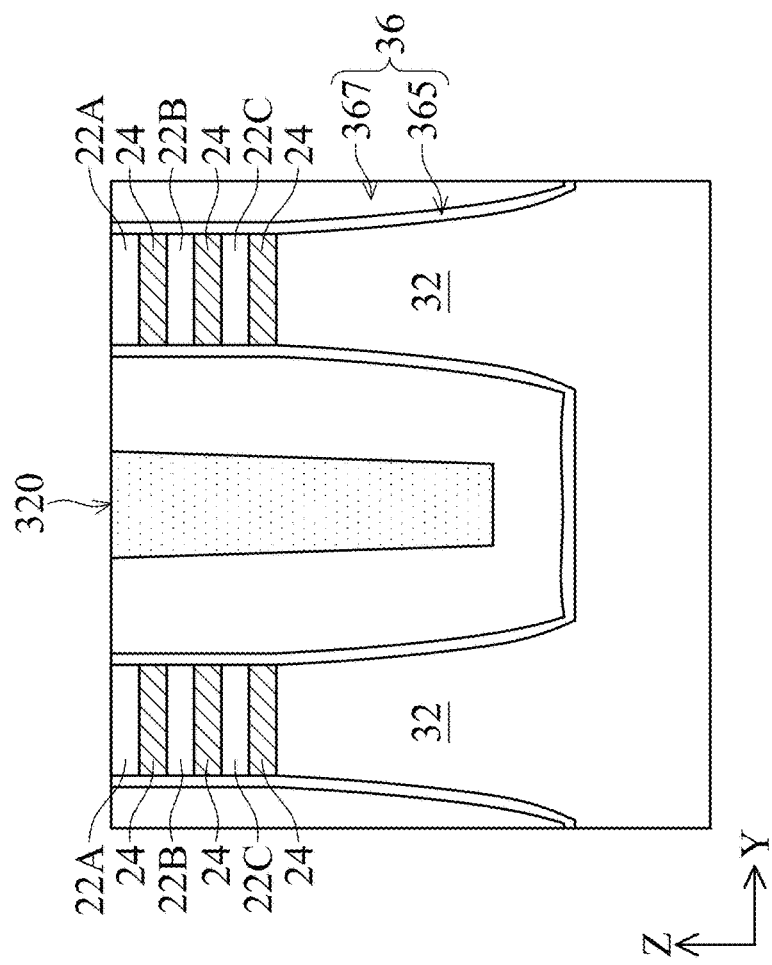
Figure 3G:
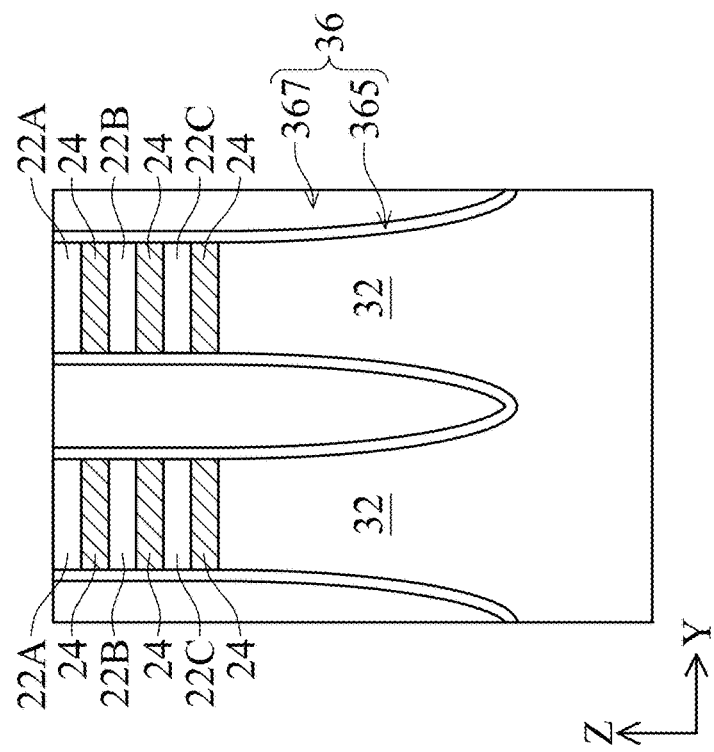
Figure 3I:
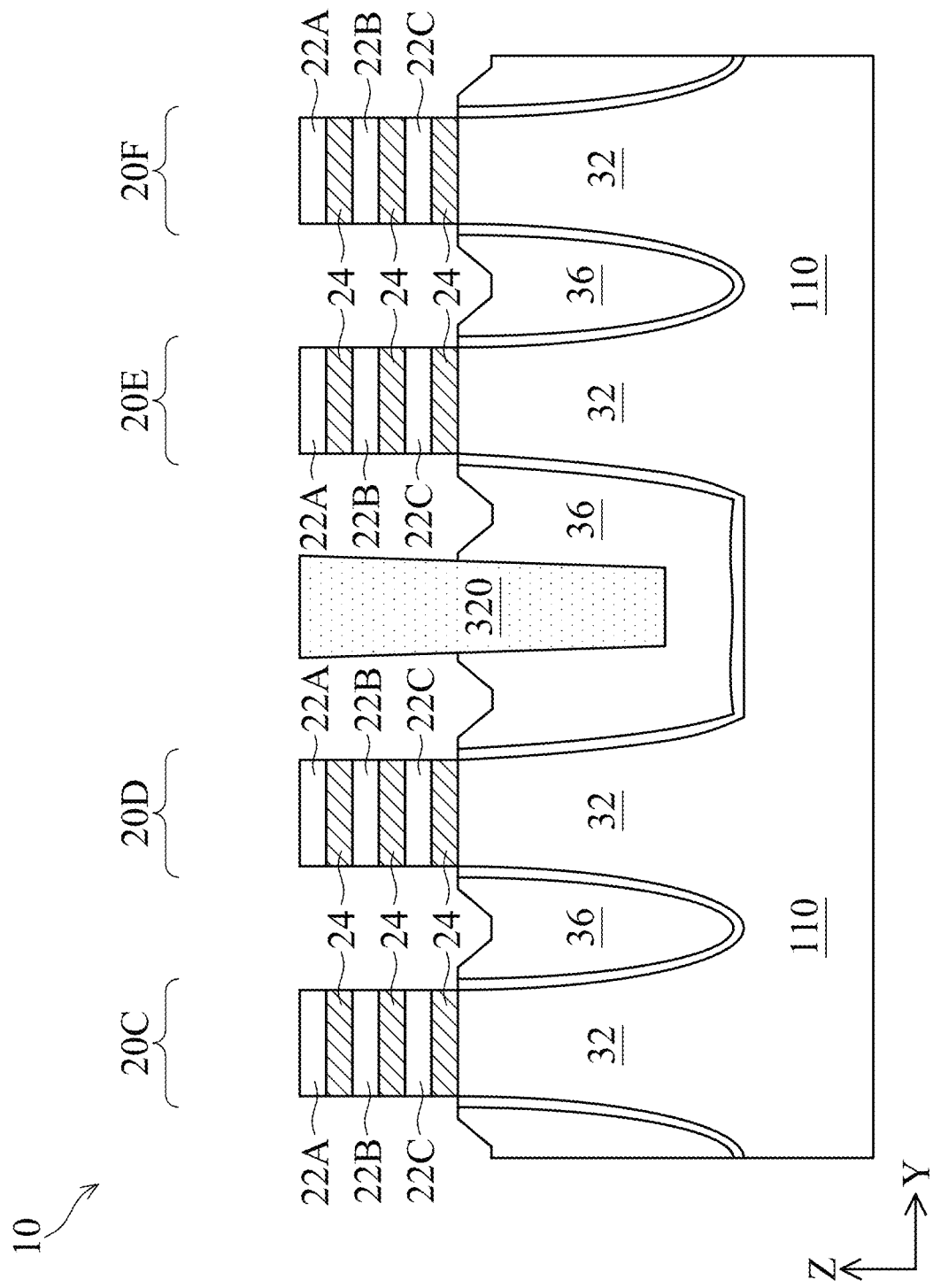
Figure 3K:
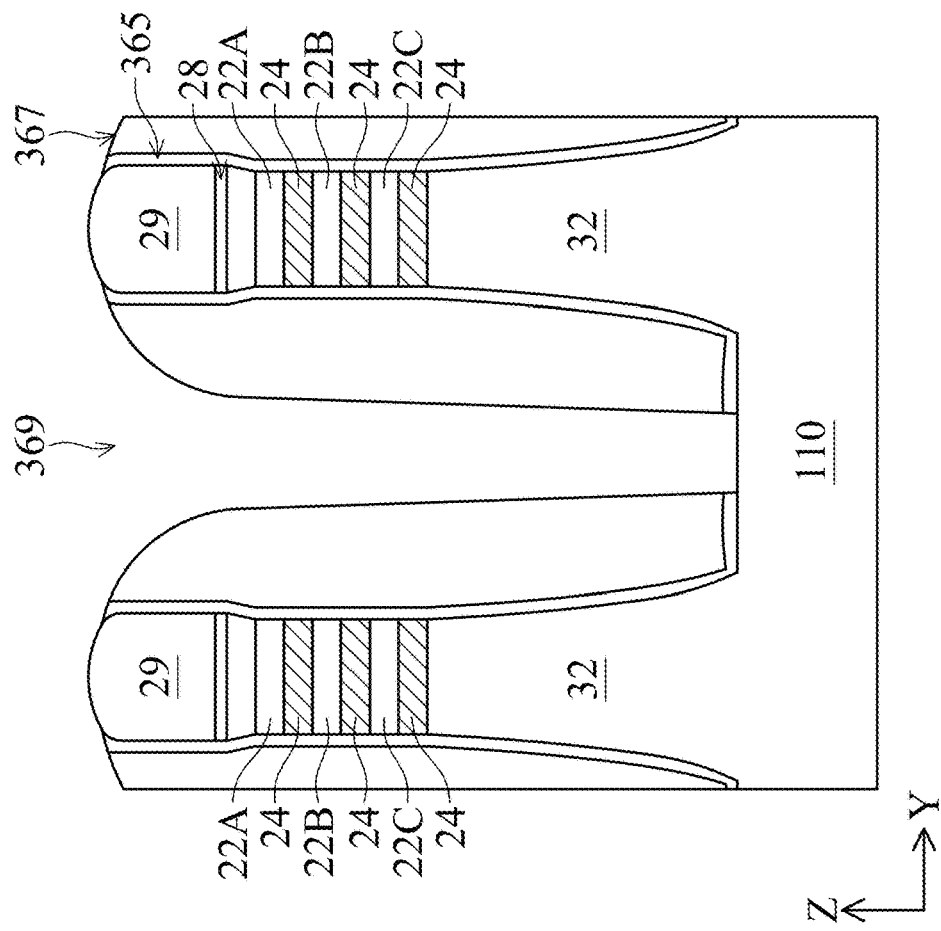
Figure 3J:
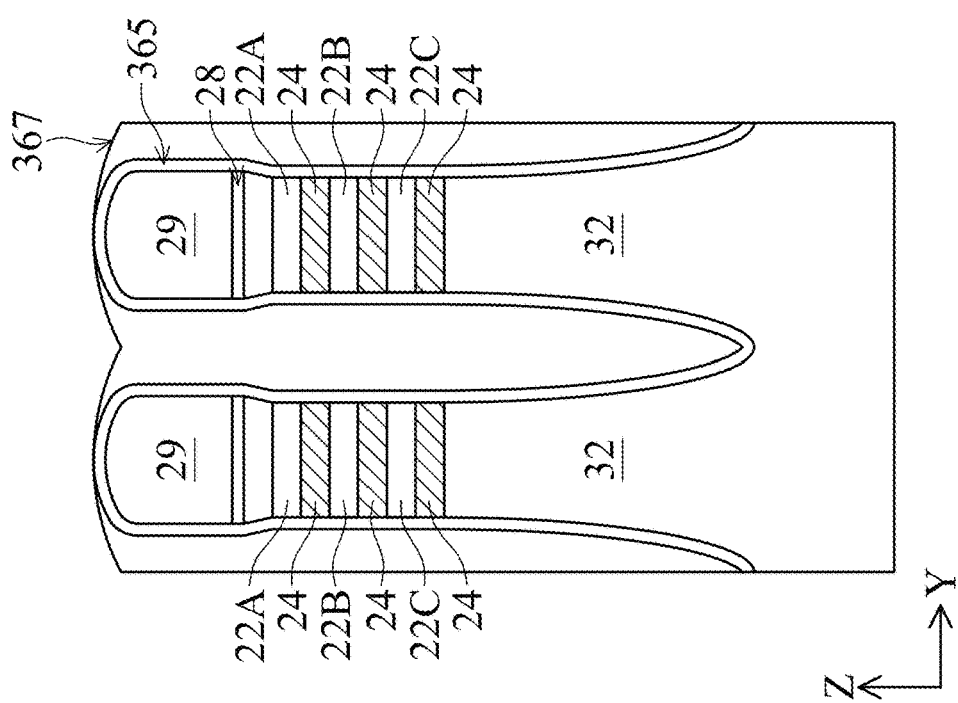
Figure 3M:
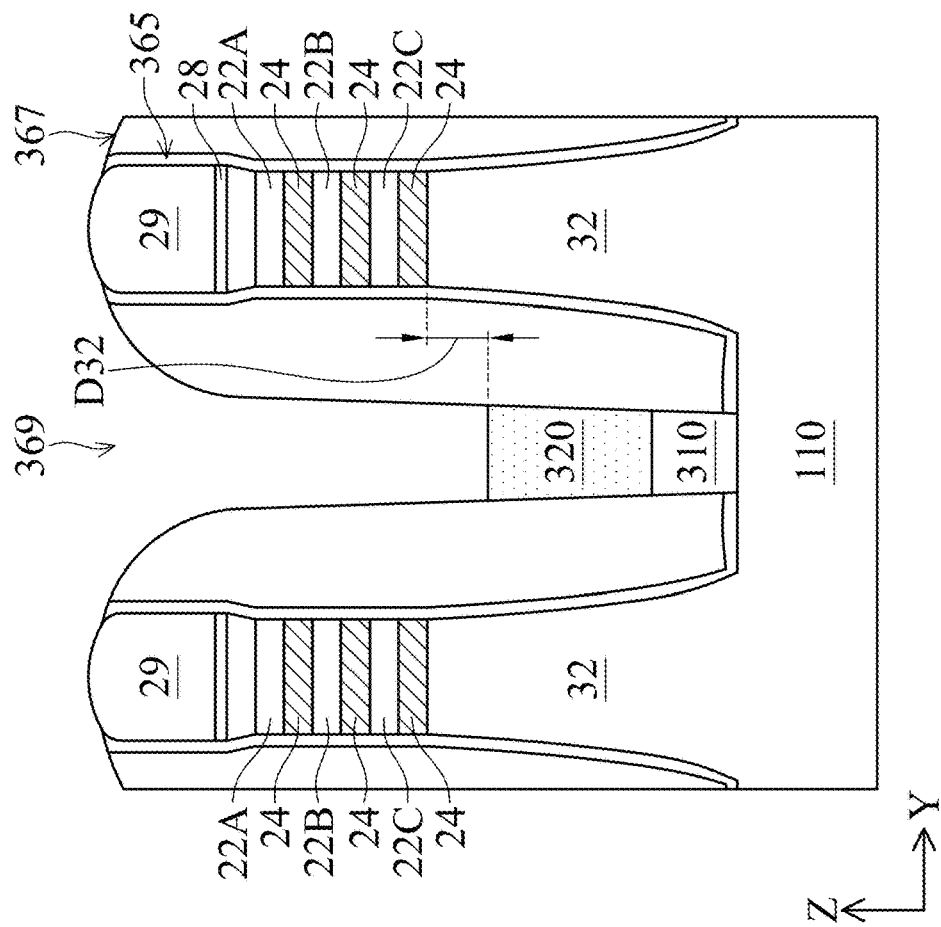
Figure 3L:
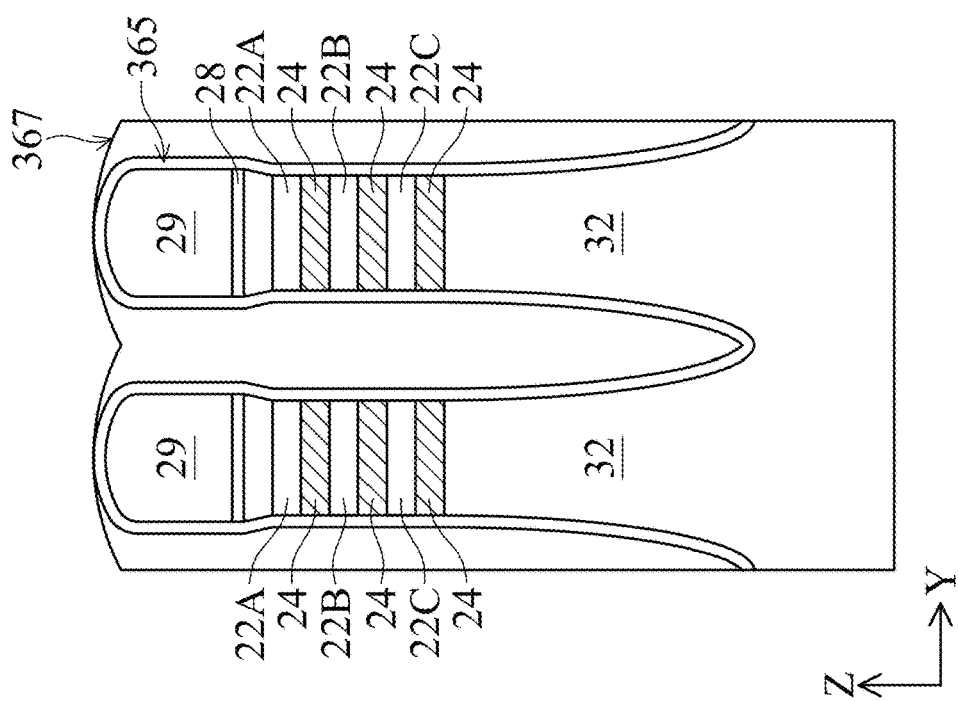
Figure 3O:
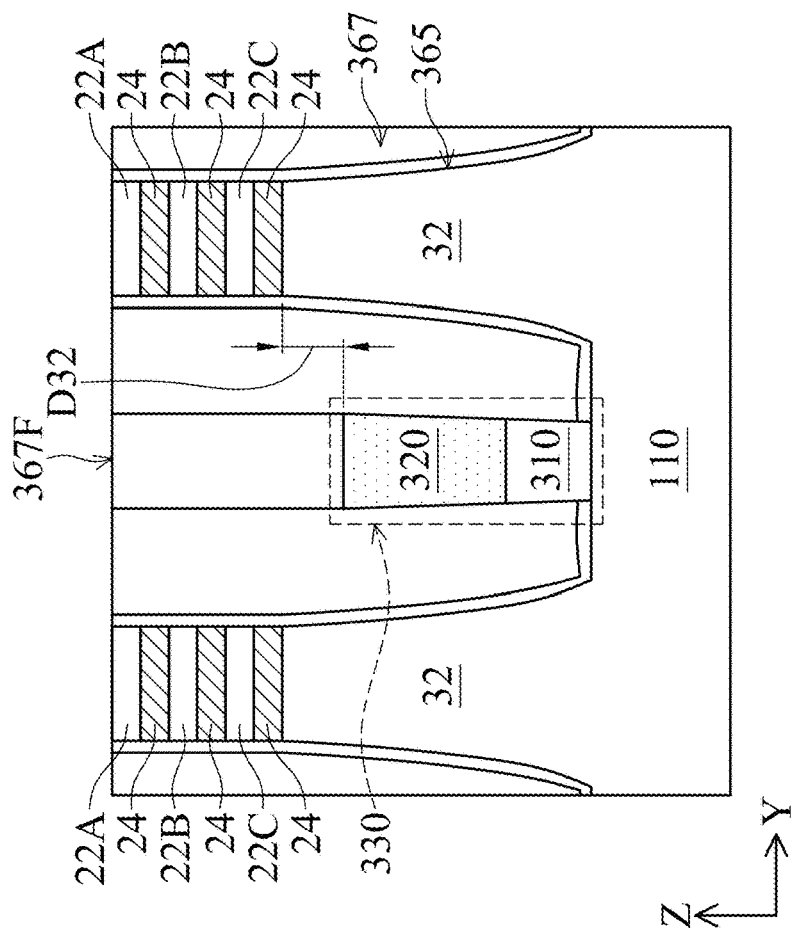
Figure 3N:
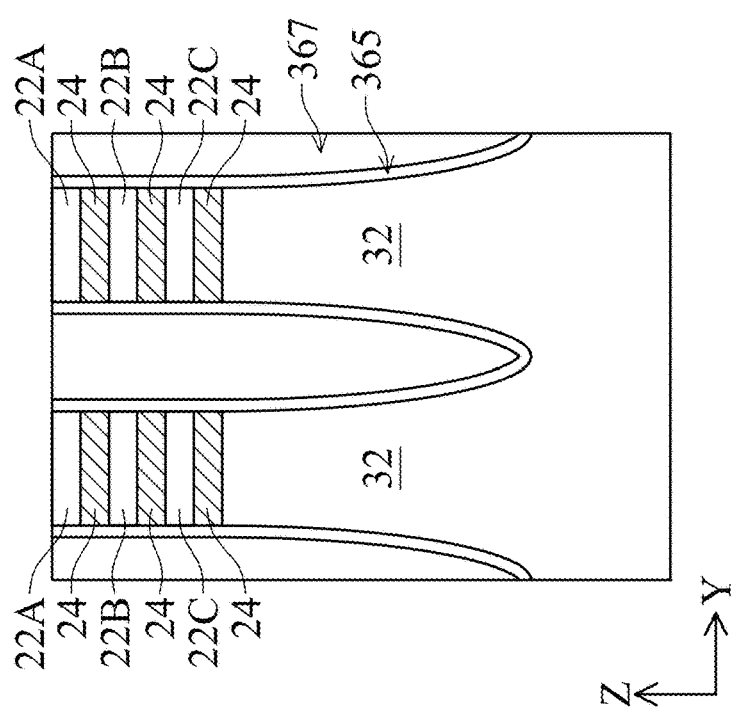
Figure 3P:
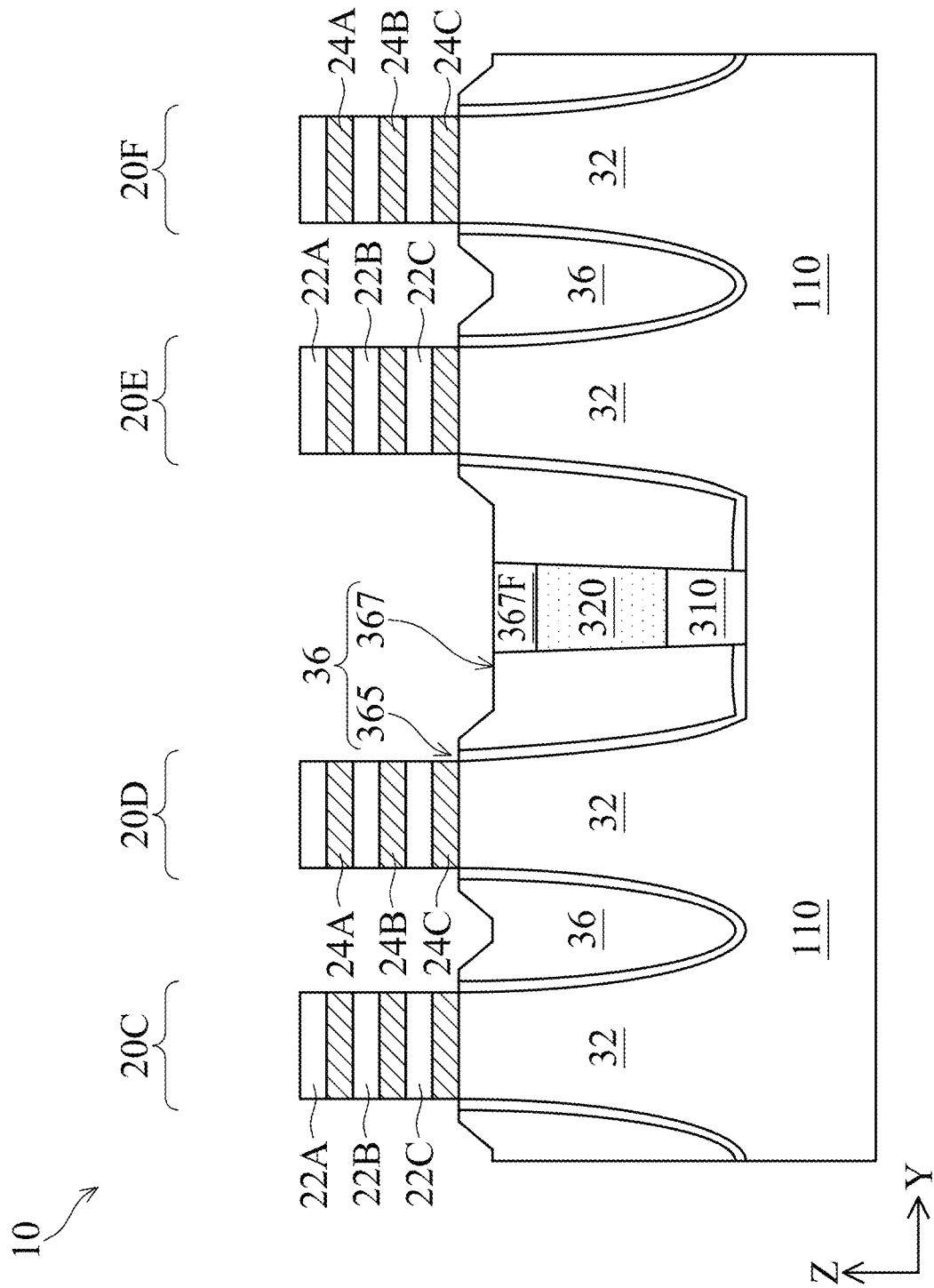
Figure 4A:
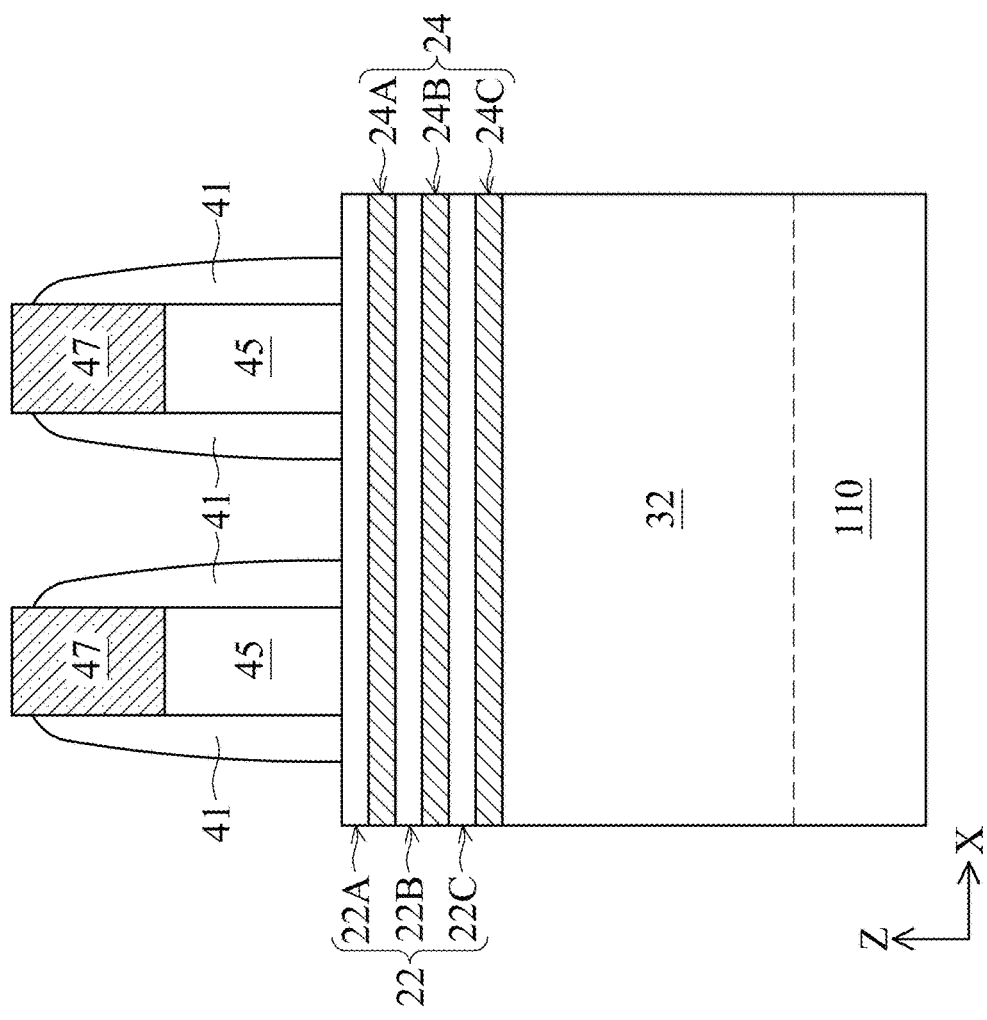
Figure 4B:
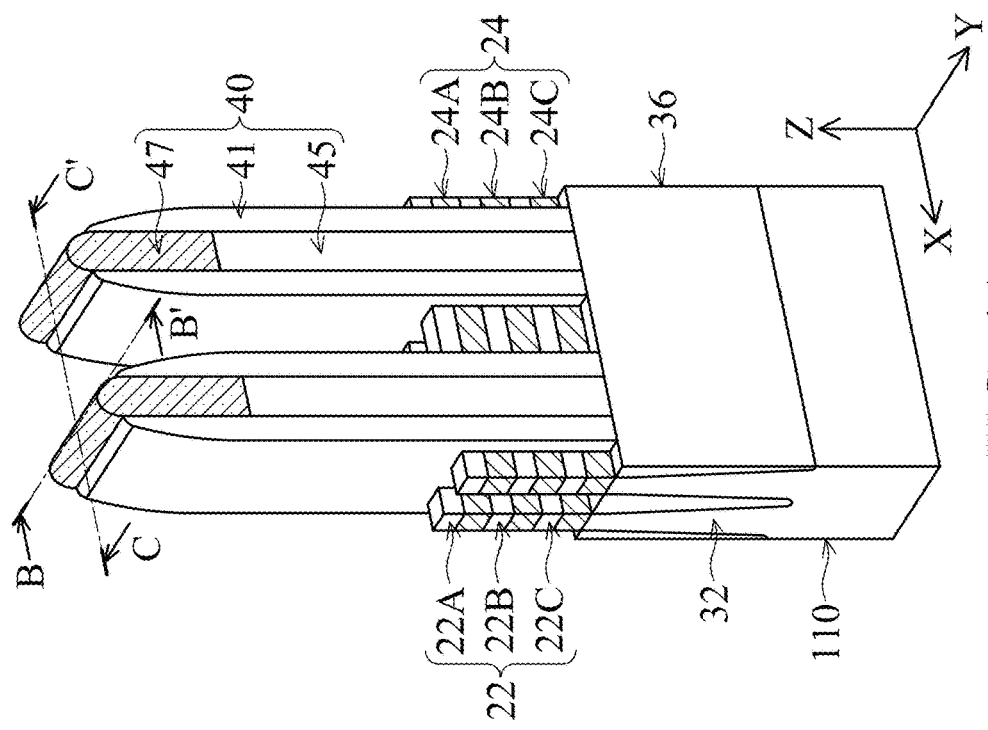
Figure 4D:
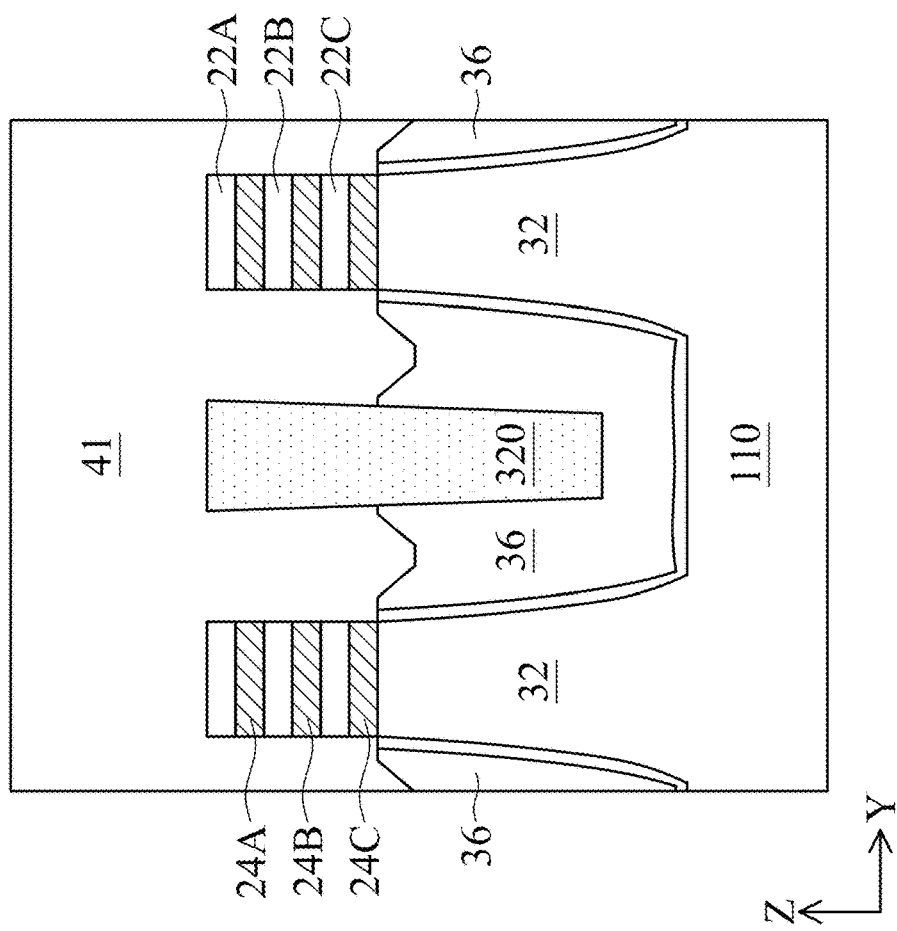
Figure 4C:
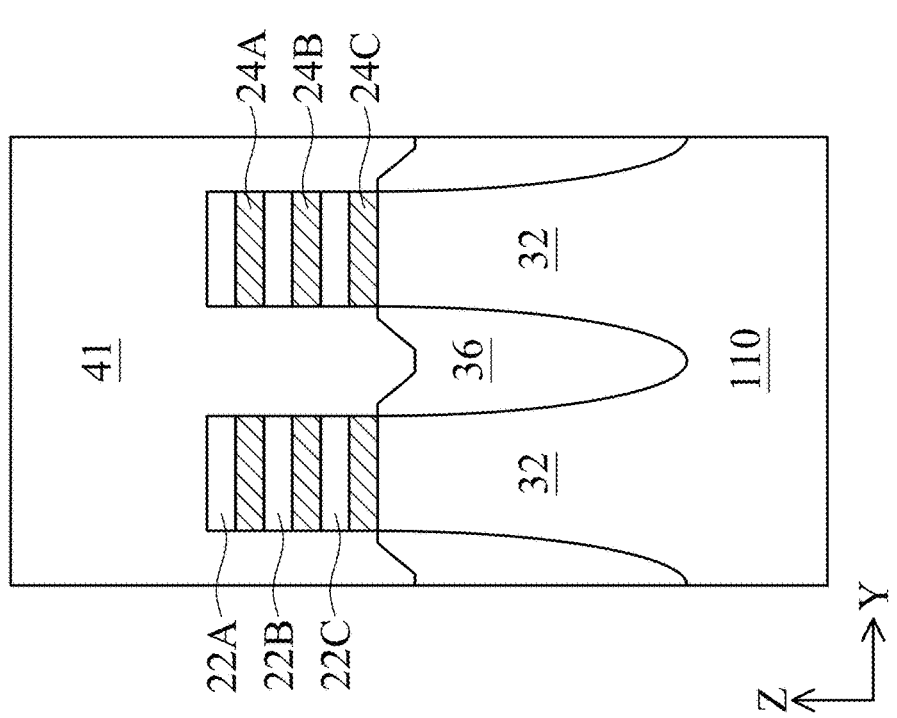

In FIGS. 3A-3N, fins 32, 320 are formed in the substrate 110 and nanostructures 22, 24 are formed in the multi-layer stack 25 corresponding to acts 1100, 1200 of FIG. 19. FIG. 3A illustrates neighboring fins 32 having short lateral separation, and FIG. 3B illustrates neighboring fins 32 having long lateral separation. In some embodiments, with reference to FIG. 3A, the nanostructures 22, 24 and the fins 32 may be formed by etching trenches in the multi-layer stack 25 and the substrate 110. The etching may be any acceptable etch process, such as a reactive ion etch (ME), neutral beam etch (NBE), the like, or a combination thereof. The etching may be anisotropic. First nanostructures 22A2-22C2 (also referred to as "channels" below) are formed from the first semiconductor layers 21, and second nanostructures 24A-24C are formed from the second semiconductor layers 23. Lateral distance (e.g., Y-direction) between neighboring fins 32 and neighboring nanostructures 22, 24 may be from about 18 nm to about 100 nm.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIG. 3A illustrates the fins 32 can have tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIG. 3A and FIG. 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof.

In some embodiments, as shown in FIGS. 3B-3D, a liner 365 may first be formed along surfaces of the substrate 110, the fins 32, and the nanostructures 22, 24. Thereafter, a fill material 367, such as silicon oxide, a nitride, the like or a combination thereof, may be formed over the liner. As shown in FIG. 3C, the liner layer 365 and the fill material 367 completely fill intervening space between the neighboring fins 32 separated by the short lateral distance. In FIG. 3D, the liner layer 365 and the fill material 367 partially fill the intervening space between the neighboring fins 32 separated by the long lateral distance. As such, an opening 369 is present between the neighboring fins 32 separated by the long lateral distance, as shown in FIG. 3D. Further illustrated in FIG. 3D and FIG. 3F, an oxide layer 28 and a hard mask layer 29 used in patterning the nanostructures 22, 24 and fins 32 may overlie the stacks of nanostructures 22, 24. In some embodiments, the liner 365 and the fill material 367 are further formed covering the hard mask layer 29 and the oxide layer 28.

In FIG. 3E and FIG. 3F, a seed material layer 320 is formed over the fill material 367. The seed material layer 320 is generally not present laterally between the neighboring fins 32 separated by the short lateral distance, shown in FIG. 3E, as the intervening space is completely filled by the fill material 367 and the liner layer 365. As shown in FIG. 3F, for the neighboring fins 32 separated by the long lateral distance, the seed material layer 320 fills the opening 369 between the neighboring fins 32. In some embodiments, the seed material layer 320 is or comprises a semiconductive material, such as silicon or the like, which may act as a seed layer during epitaxial growth of the source/drain regions 82 (described with reference to FIGS. 8C, 8D).

In FIGS. 3G and 3H, following deposition of the seed material layer 320, a removal operation is performed to remove material above an upper surface of the uppermost nanostructures 22A. The removal operation may include one or more etching and/or planarization operations. In some embodiments, the removal operation includes a single chemical mechanical planarization (CMP) operation that removes portions of the fill layer 367, the liner layer 365, the hard mask layer 29 and the oxide layer 28 above the upper surface of the nanostructures 22A. In some other embodiments, a combination of etching operations and CMP operations are used to remove the portions of the fill layer 367, the liner layer 365, the hard mask layer 29 and the oxide layer 28 above the upper surface of the nanostructures 22A. Following the removal operation, the upper surface of the fin 320 formed of the seed material layer 320 is substantially coplanar with the upper surfaces of the nanostructures 22A, as shown in FIG. 3H.

FIG. 3I shows a configuration in which transistors 20C-20F to be formed are separated by a short lateral distance (e.g., the transistors 20C, 20D or the transistors 20E, 20F) or by a long lateral distance (e.g., the transistors 20D, 20E). Following formation of the fin 320 embedded in the isolation region 36 between the fins 32 of the transistors 20D, 20E, the isolation regions 36 are recessed to a level at or near the upper surfaces of the fins 32 and/or the lower surfaces of the lowermost nanostructures 24. The recessing may include one or more etching operations, such as a first operation that recesses the fill layer 367 followed by a second operation that recesses the liner layer 365 (see FIG. 3G and FIG. 3H). In some embodiments, the isolation regions 36 are recessed by an acceptable etching process, such as an oxide removal using, for example, dilute hydrofluoric acid (dHF), which is selective to the insulation material and leaves the fins 32, 320 and the nanostructures 22, 24 substantially unaltered.

Following the recessing, the nanostructures 22, 24 and the fin 320 extend from the isolation regions 36 and are exposed. As shown in FIG. 3I, upper surfaces of the isolation regions 36 are concave following the recessing. In some embodiments, the upper surfaces of the isolation regions 36 may be substantially level or may be convex.

FIGS. 3J-3N illustrate formation of the fin 320 in accordance with various other embodiments of the disclosure.

In FIGS. 3J, 3K, the liner layer 365 and the fill layer 367 are formed in a manner similar to described with reference to FIGS. 3C, 3D. Following formation of the liner layer 365 and the fill layer 367, an additional removal operation is performed to remove horizontal portions of the liner layer 365 and the fill layer 367 overlying the upper surface of the substrate 110 in the opening 369, as shown in FIG. 3K. During the removal operation, horizontal portions of the fill layer 367 overlying the hard mask layer 29 and the liner layer 365 are removed, leaving the liner layer 365 intact, as shown in FIG. 3J. In some embodiments, as shown in FIG. 3K, horizontal portions of the liner layer 365 overlying the hard mask layer 29 are also removed following removal of the horizontal portions of the fill layer 367 overlying the hard mask layer 29. In some embodiments, the liner layer 367 remains covering the hard mask layer 29 in regions where the neighboring fins 32 are separated by the short lateral distance (FIG. 3J), and the horizontal portions of the liner layer 367 covering the hard mask layer 29 are removed in regions where the neighboring fins 32 are separated by the long lateral distance (FIG. 3K). Removal of the liner layer 365 and the fill layer 367 from the bottom of the opening 369 exposes the substrate 110, which may aid in formation of the fin 320 in subsequent operations described with reference to FIGS. 3L-3N.

In FIGS. 3J, 3K, after exposing the substrate 110 in the opening 369 between the fins 32 separated by the long lateral distance (FIG. 3K), one or more deposition operations are performed to form the fin 320 and a fin base 310 underlying the fin 320. In some embodiments, the fin base 310 is formed of a semiconductive material different from the fin 320. For example, the fin 320 may be formed of Si, SiC, SiCP, or the like, and the fin base 310 may be formed of SiGe. In some embodiments, deposition of the fin base 310 and the fin 320 may be or include depositing silicon germanium using a first ratio of precursors of silicon and germanium for a first time interval, followed by depositing silicon using a second ratio of precursors of silicon and germanium (e.g., substantially zero germanium precursor) for a second time interval following the first time interval. In some embodiments, the first time interval is shorter than the second time interval, such that height of the fin base 310 is in a range of about 10 nm to about 30 nm, and the height of the fin 320 is in a range of about 100 nm to about 200 nm. In some embodiments, in the second time interval, carbon and/or phosphorus precursors are also flowed to form the fin 320 of or including SiC and/or SiCP. In some embodiments, lateral sidewalls of the fin 320 and the fin base 310 are tapered, such that widths of the fin 320 and the fin base 310 decrease with greater proximity to the substrate 110. For the fins 32 separated by the short lateral distance (FIG. 3J), as the fill layer 367 and the liner layer 365 fill the entirety of space between the neighboring fins 32, generally no deposition of the semiconductive materials of the fin base 310 and the fin 320 occurs in the space between the neighboring fins 32. The fin base 310 and the fin 320 may be referred to collectively as a "buried fin 330," which is labeled in FIG. 3M. In some embodiments, the upper surface of the buried fin 330 is separated vertically from the upper surface of the fin 32 by a distance D32 greater than about 10 nm, such as in a range of about 10 nm to about 100 nm, as shown in FIG. 3K.

In FIGS. 3L, 3M, following formation of the buried fin 330, the unfilled portion of the opening 369 is filled to form fill portion 367F. In some embodiments, the fill portion 367F is formed by depositing a layer of silicon oxide, a nitride, combinations thereof, or the like in the opening 369. In some embodiments, a visible interface is present between sidewalls of the fill portion 367F and the fill layer 367, for example, as a result of forming the fill portion 367F and the fill layer 367 in separate operations. In some embodiments, the material of the fill portions 367F is substantially the same as the material of the liner layer 367 and different from the material of the fin 320. Following deposition of the material that forms the fill portion 367F, excess material overlying the uppermost nanostructures 22A is removed, for example, by a CMP operation, such that the upper surfaces of the nanostructures 22A are exposed.

FIG. 3N shows another view of the device 10 including the buried fin 330. FIG. 3N is similar in many respects to FIG. 3I, other than inclusion of the buried fin 330 in FIG. 3N. In the device 10 illustrated in FIG. 3I, the isolation region 36 between the fins 32 separated by the long lateral distance includes concave upper surfaces on either side of the fin 320. In FIG. 3N, the isolation region 36 in the region between the fins 32 separated by the long lateral distance may have a single concave upper surface including the upper surface of the fill portion 367F. In some embodiments, a central portion of the upper surface of the isolation region 36 described is substantially planar, and peripheral portions of the upper surface angle upward toward the upper surfaces of the fins 32 on either side of the buried fin 330.

Further in FIG. 3I and FIG. 3N, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

FIGS. 4A-10C illustrate formation of sacrificial gate structures 40, inner spacers 74, source/drain epitaxial regions 82 and replacement gate structures 200. FIGS. 4C, 5C, 6C, 7C, 8C, 9C illustrate views of the device 10 in intermediate stages of the various operations, where the views correspond to portions of the device 10 in which the fins 32 are separated by the short lateral distance. FIGS. 4D, 5D, 6D, 7D, 8D, 9D illustrate views of the device 10 in intermediate stages of the various operations, where the views correspond to portions of the device 10 in which the fins 32 are separated by the long lateral distance.

In FIGS. 4A-4D, dummy (or "sacrificial") gate structures 40 are formed over the fins 32, the fin 320 or the buried fin 330 (see FIG. 4D), and/or the nanostructures 22, 24, corresponding to act 1300 of FIG. 19. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 4A-4D illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as any of the gate structures 200.

Figure 5D:
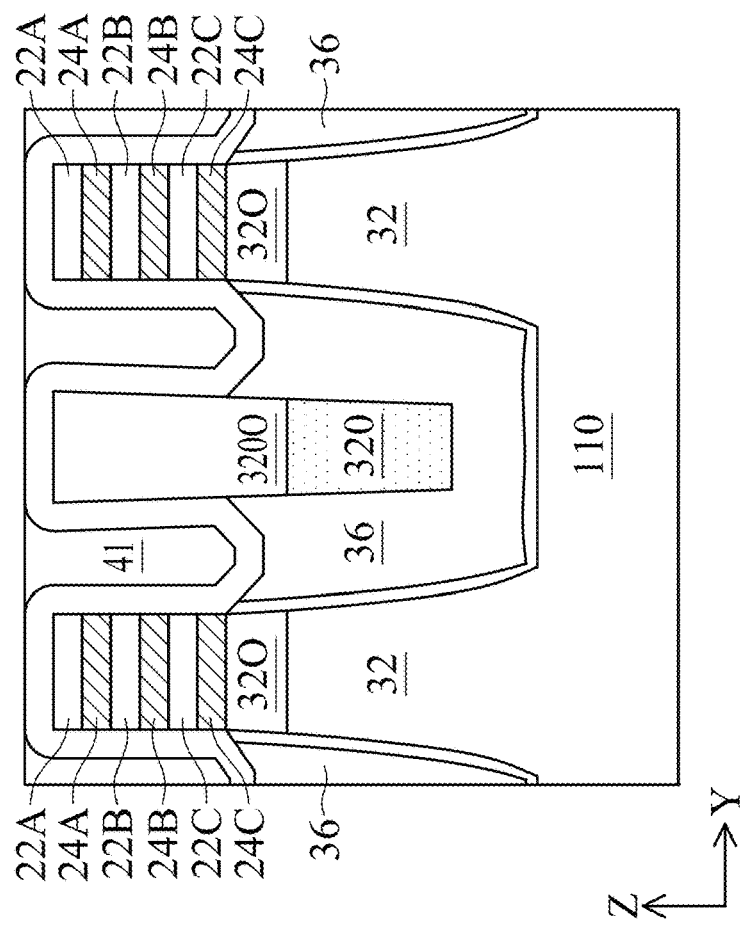
Figure 5C:
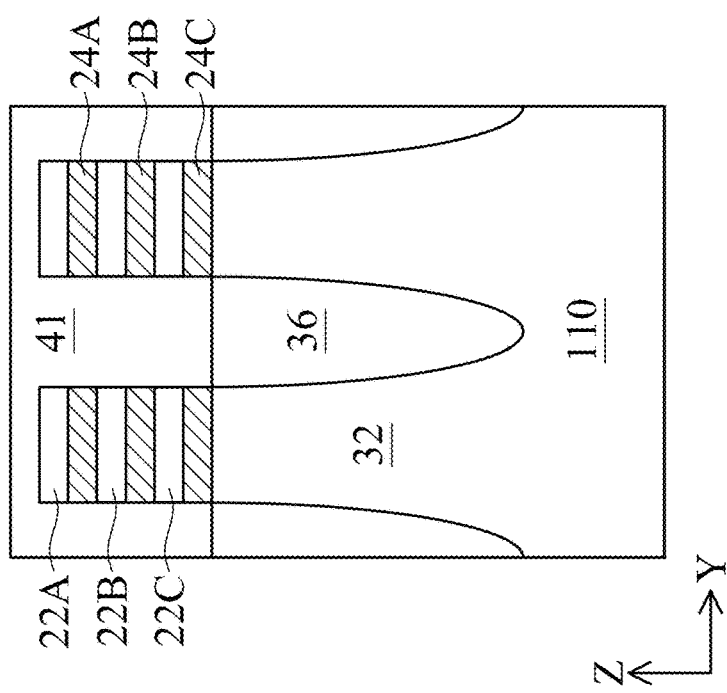
Figure 5E:
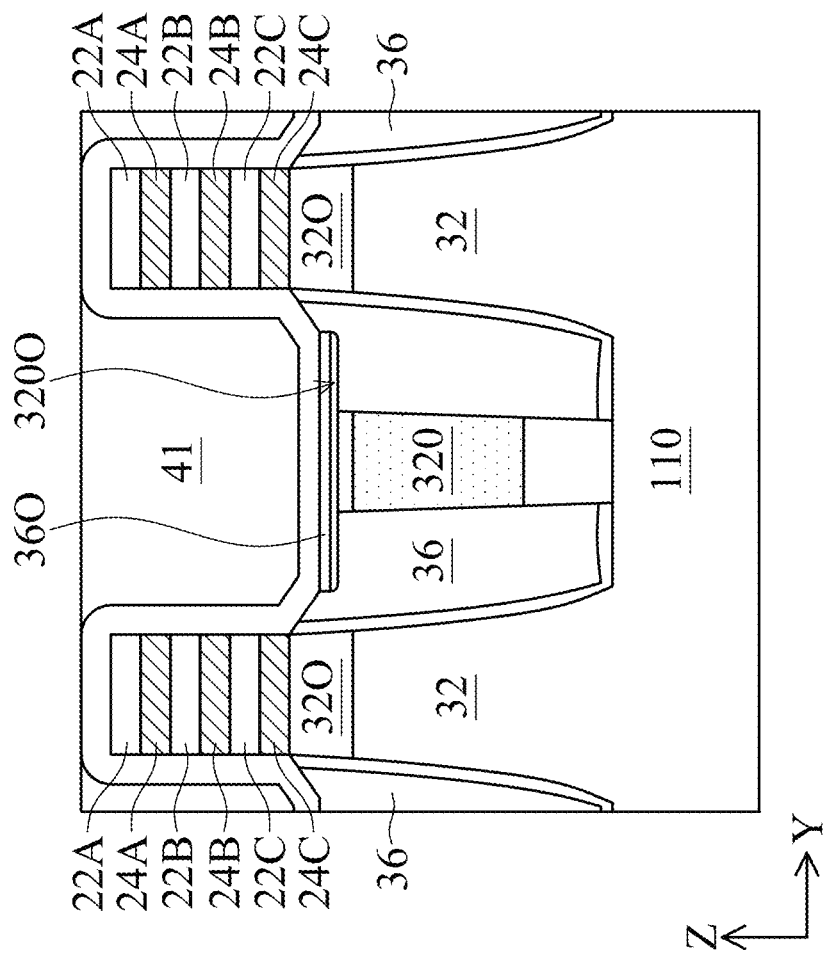
Figure 6B:
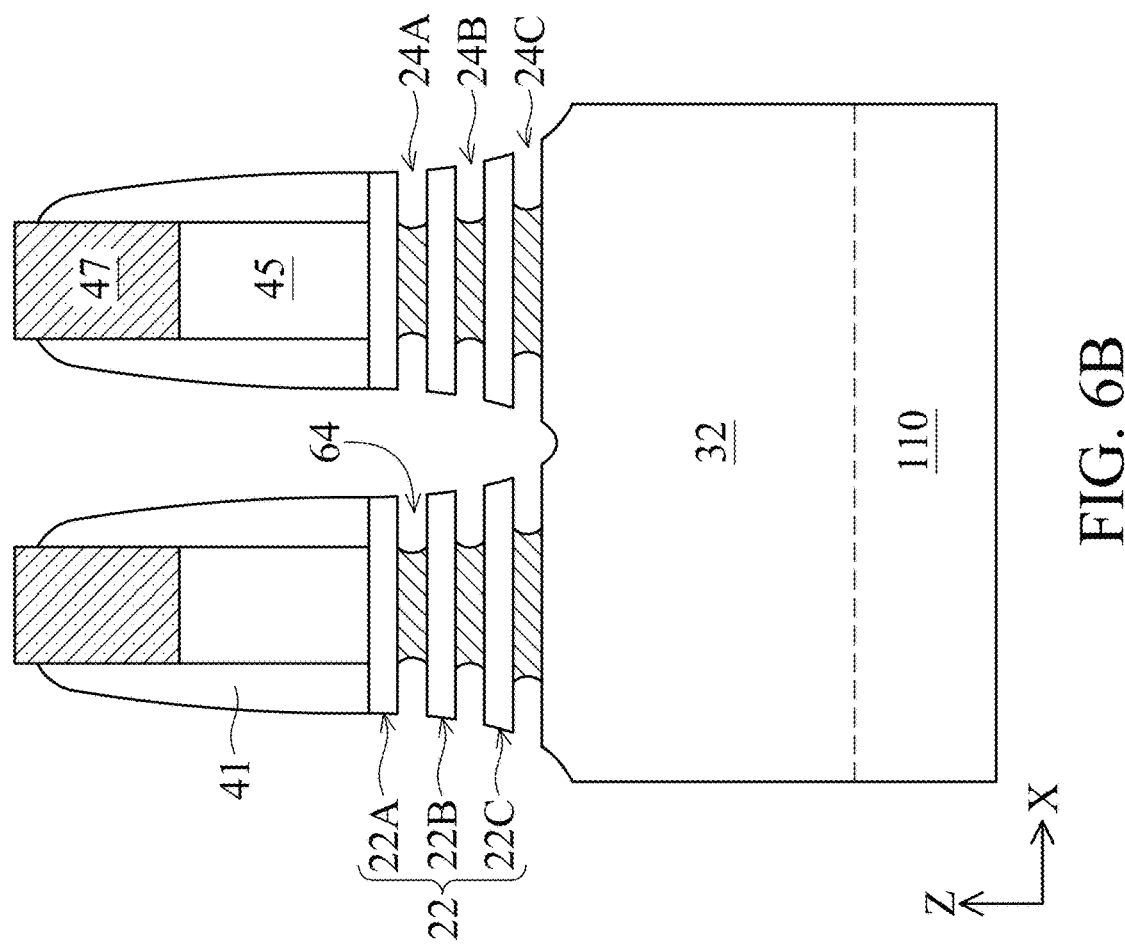
Figure 6A:
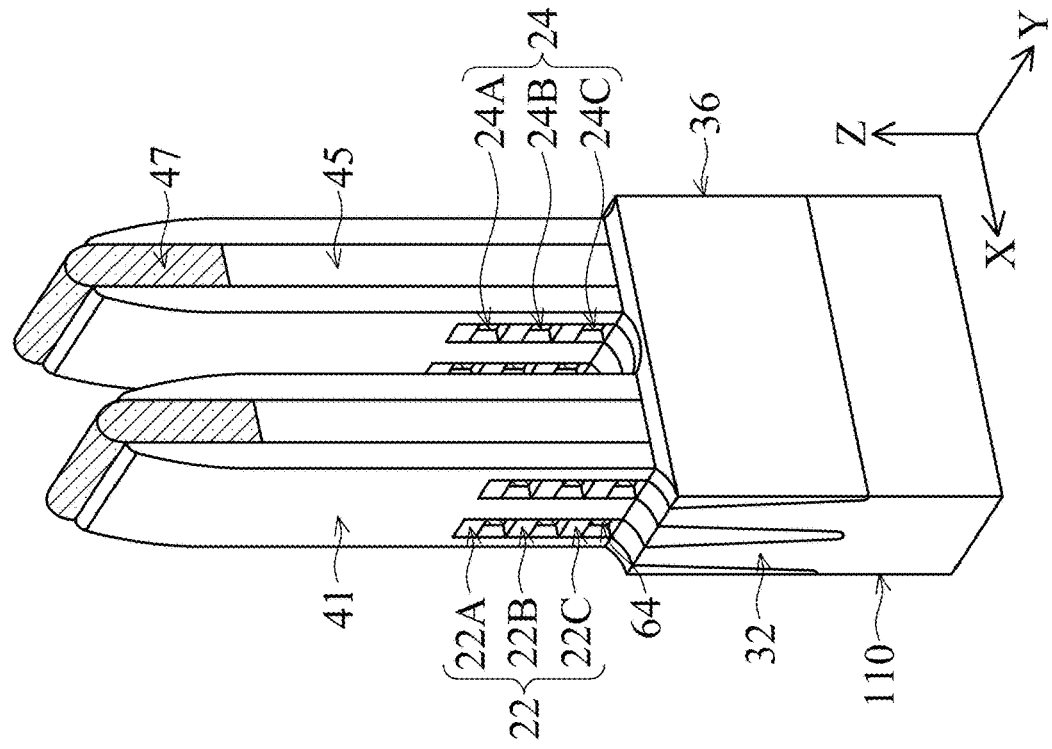
Figure 6D:
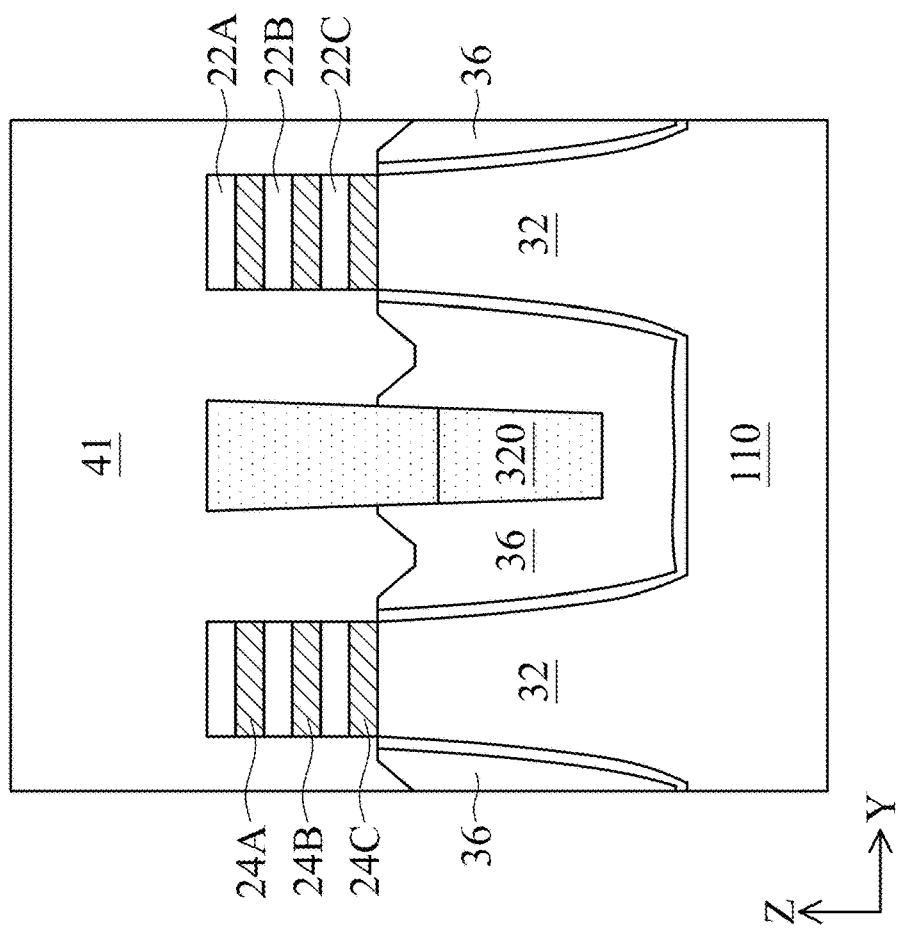
Figure 6C:
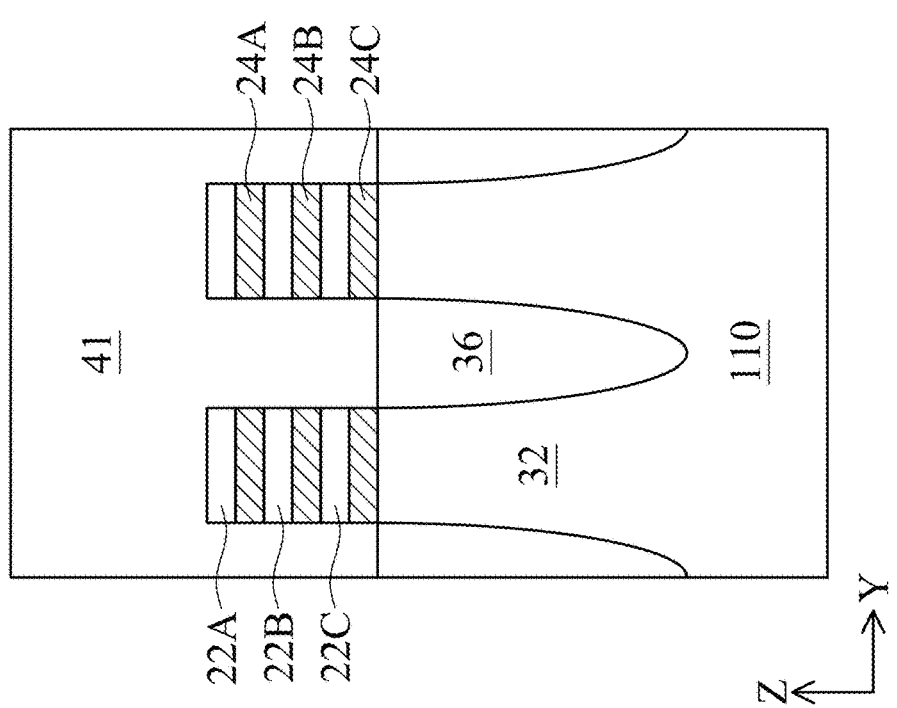
Figure 7B:
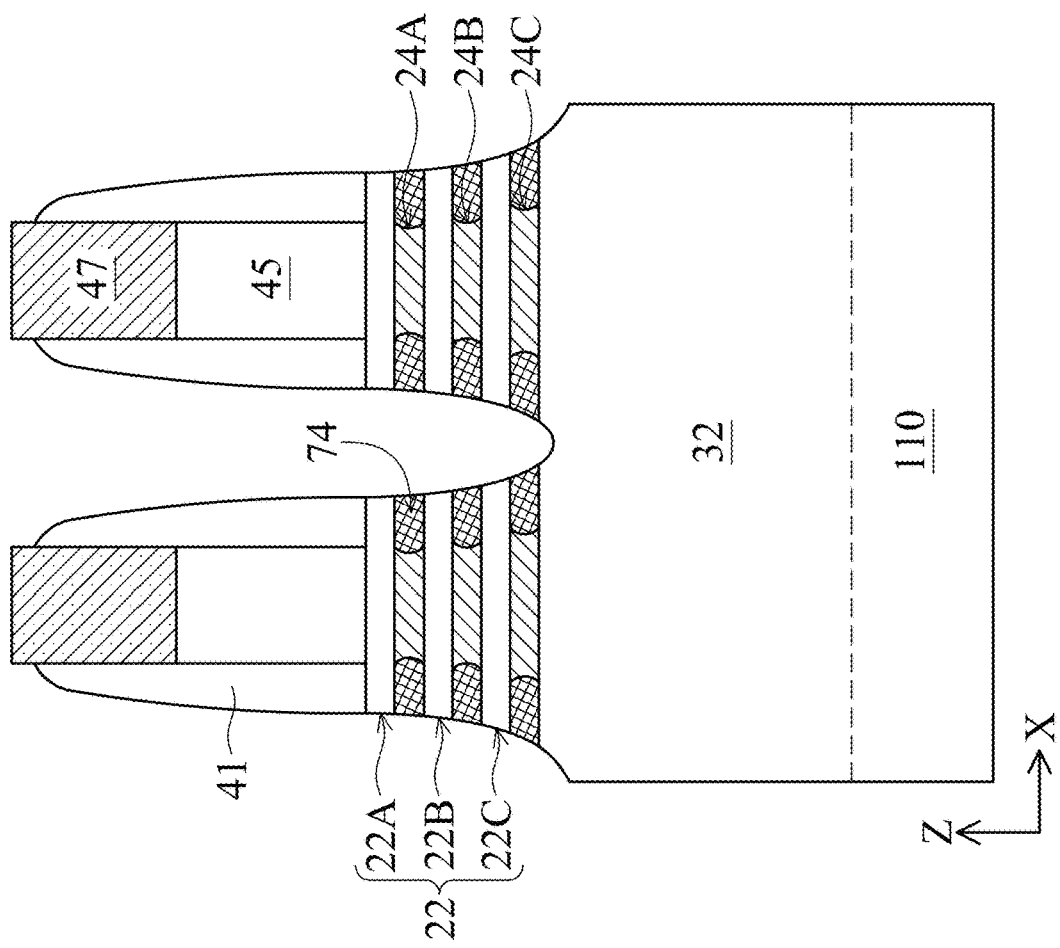
Figure 7A:
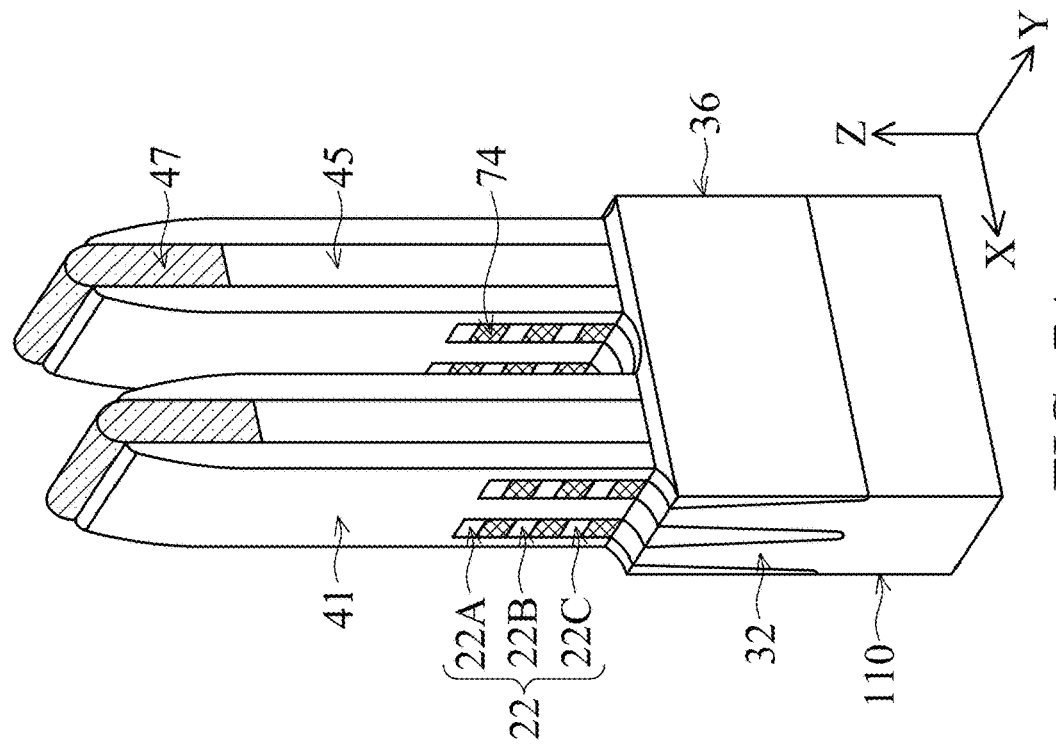
Figure 7D:
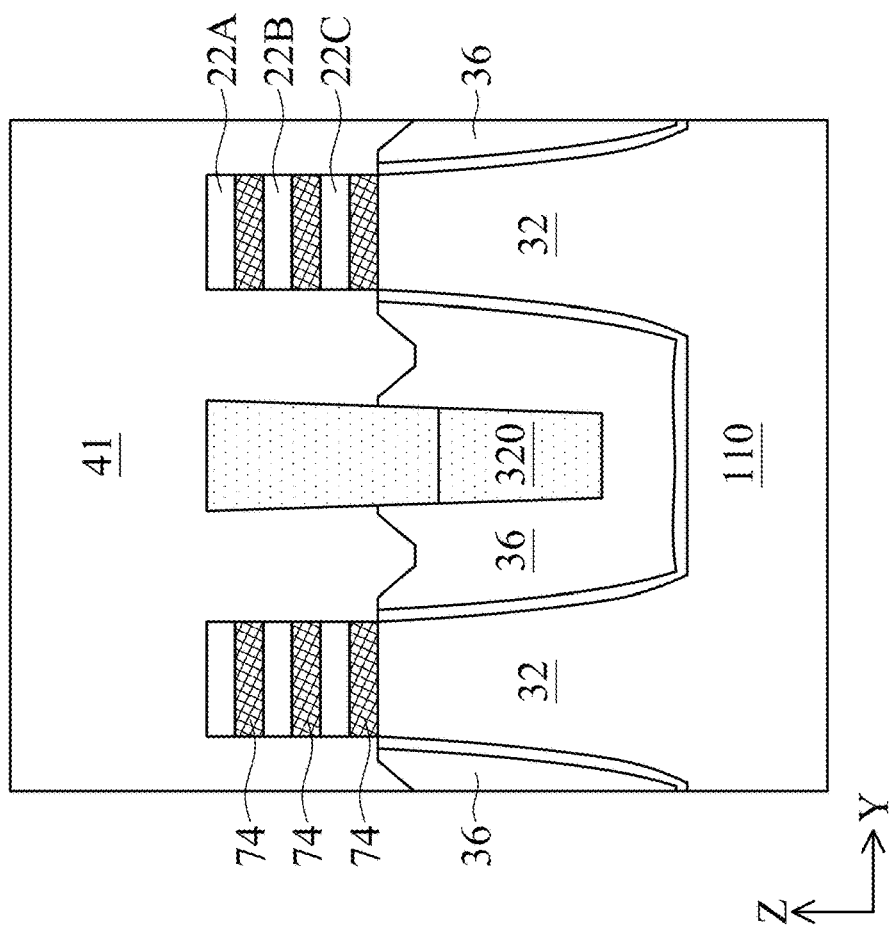
Figure 7C:
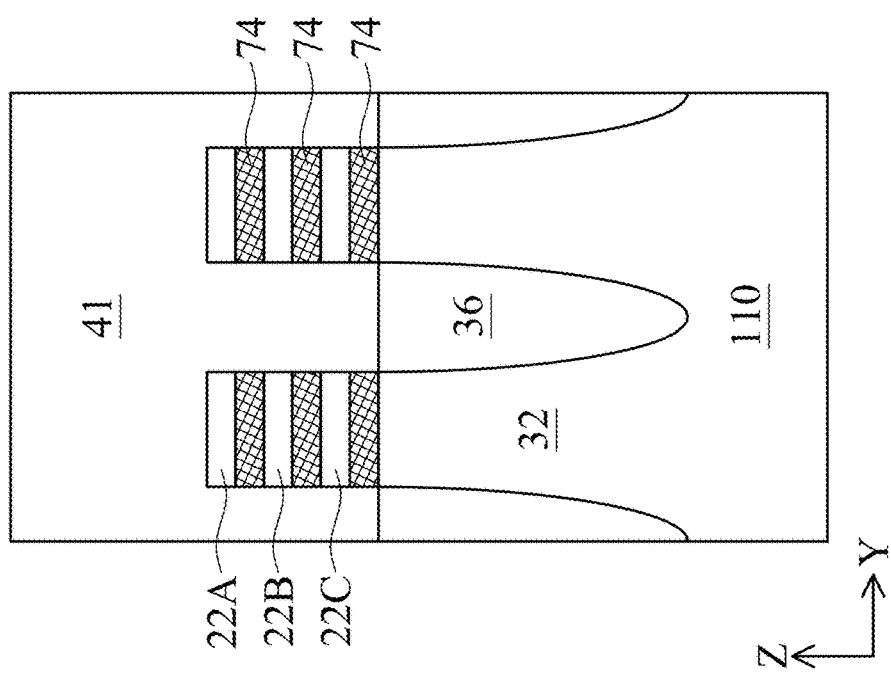

In FIGS. 5A-5E, an etching process is performed to etch the portions of protruding fins 32, fin 320 (FIG. 5D), fill portion 367F and buried fin 330 (FIG. 5E), and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. As shown in FIG. 5D, in some embodiments, following the etching process, exposed portions of the fins 32 and the fin 320 may be recessed to a level below the upper surfaces of the isolation regions 36. In FIG. 5E, according to various embodiments, following the etching process, exposed portions of the fins 32, a central region of the isolation region 36 overlying the buried fin 330, and the buried fin 330 may be recessed to a level lower than uppermost surfaces of the isolation regions 36. Due to the anisotropic nature of the etching process, peripheral regions of the isolation region 36 in which the buried fin 330 is embedded may be substantially unetched. The etching process leaves openings 320 in the fins 32, openings 3200 in the fin 320, and/or openings 360 in the isolation region 36 in which the buried fin 330 is embedded.

FIGS. 6A-6D and 7A-7D illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6D.

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7D.

FIGS. 8A-8E illustrate formation of source/drain regions 82 corresponding to act 1400 of FIG. 19. In the illustrated embodiment, the source/drain regions 82 are epitaxially grown from epitaxial material(s). In some embodiments, the source/drain regions 82 exert stress in the respective channels 22A2-22C2, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

In FIG. 8C, the fins 32 separated by the short lateral distance are shown with source/drain regions 82 formed thereon. The source/drain regions 82 include a P-type source/drain region 82P formed over one of the fins 32, and an N-type source/drain region 82N formed over another of the fins 32. As shown in FIG. 8C, the N-type source/drain region 82N may be formed prior to the P-type source/drain region 82P, as illustrated by presence of a protective layer 820N conformally surrounding first and second N-type epitaxial regions 821N, 822N. In some embodiments, the first N-type epitaxial region 821N is formed in a first epitaxial operation, then the second N-type epitaxial region 822N is formed over and laterally around the first N-type epitaxial region 821N. For example, the fin 32 on which the P-type source/drain region 82P is to be formed may be protected (e.g., masked) during the first epitaxial operation, then the N-type source/drain region 82N may be protected (e.g., masked) during the second epitaxial operation. In some embodiments, the N-type source/drain region 82N may be exposed during the second epitaxial operation.

The protective layer 820N, which may be an oxidation layer including an oxidized material of the second N-type epitaxial region 822N, may be formed by exposing the second N-type epitaxial region 822N to oxygen, for example, by introducing oxygen gas or water vapor. Following formation of the protective layer 820N, the P-type source/drain region 82P may be grown over the another of the fins 32, as shown. In some embodiments, a first P-type epitaxial region 821P is formed contacting the underlying fin 32, with the fin 32 acting as a seed layer for the first P-type epitaxial region 821P. Following formation of the first P-type epitaxial region 821P, a second P-type epitaxial region 822P may be formed over and around the first P-type epitaxial region 821P. The first and second P-type epitaxial regions 821P, 822P generally do not contact the protective layer 820N. Following formation of the second P-type epitaxial region 822P, a third P-type epitaxial region 823P is formed over and around the second P-type epitaxial region 822P. The third P-type epitaxial region 823P may physically contact the protective layer 820N, such that the source/drain regions 82N, 82P may be considered to be merged.

In FIG. 8D, as shown, for the region in which the fins 32 are separated by the long lateral distance, and having the fin 320 embedded in the isolation region 36 therebetween, the N-type source/drain region 82N and the P-type source/drain region 82P may be formed over the fins 32 shown. In some embodiments, the formation of the N-type and P-type source/drain regions 82N, 82P may be simultaneous with the formation of the N-type and P-type source/drain regions 82N, 82P shown in FIG. 8C, respectively. As such, many aspects of FIG. 8D may be similar to FIG. 8C. For example, the fins 32, 320 on which the P-type source/drain region 82P are to be formed may be protected (e.g., masked) during the first epitaxial operation, then the N-type source/drain region 82N may be protected (e.g., masked) during the second epitaxial operation. In some embodiments, the N-type source/drain region 82N may be exposed during the second epitaxial operation.

In the region shown in FIG. 8D, in addition to the fins 32 acting as seed layers for the formation of the first N-type and first P-type epitaxial regions 821N, 821P, the fin 320 buried in the isolation region 36 and exposed following etching (see FIG. 7D) also acts as a seed layer for the first P-type epitaxial regions 821P. Additional growth of the first P-type epitaxial region 821P overlying the fin 320 between the fins 32 allows for growth of an additional second P-type epitaxial region 822P overlying the first P-type epitaxial region 821P that overlies the fin 320. In some embodiments, the second P-type epitaxial region 822P overlying the fin 320 physically contacts the protective layer 820N, as shown. In some embodiments, the second P-type epitaxial region 822P overlying the fin 320 is taller than the second P-type epitaxial region 822P overlying the fin 32. Following formation of the second P-type epitaxial regions 822P, which may be laterally separated, the third P-type epitaxial region 823P may be formed over and around the second P-type epitaxial regions 822P. In some embodiments, the third P-type epitaxial region 823P is thicker in a region overlying the fin 32 than in a region overlying the fin 320, for example, due to difference in height of the second P-type epitaxial regions 822P overlying the fin 32 and the fin 320, respectively. Formation of the second N-type epitaxial region 822N in FIG. 8D may be substantially the same as in FIG. 8C. In some embodiments, a void (or seam) 825 is present in the second N-type epitaxial region 822N. In some embodiments, as shown in FIG. 8D, a protective layer 820P may be formed over the third P-type epitaxial region 823P, which may be an oxide of material of the third P-type epitaxial region 823P, and may be different from material of the protective layer 820N. In some embodiments, one or more of the second P-type epitaxial region 822P, the third P-type epitaxial region 823P and the protective layer 820P physically contact the protective layer 820N. In some embodiments, the first P-type epitaxial region 821P is separated from the protective layer 820N by the second P-type epitaxial region 822P.

Figure 8B:
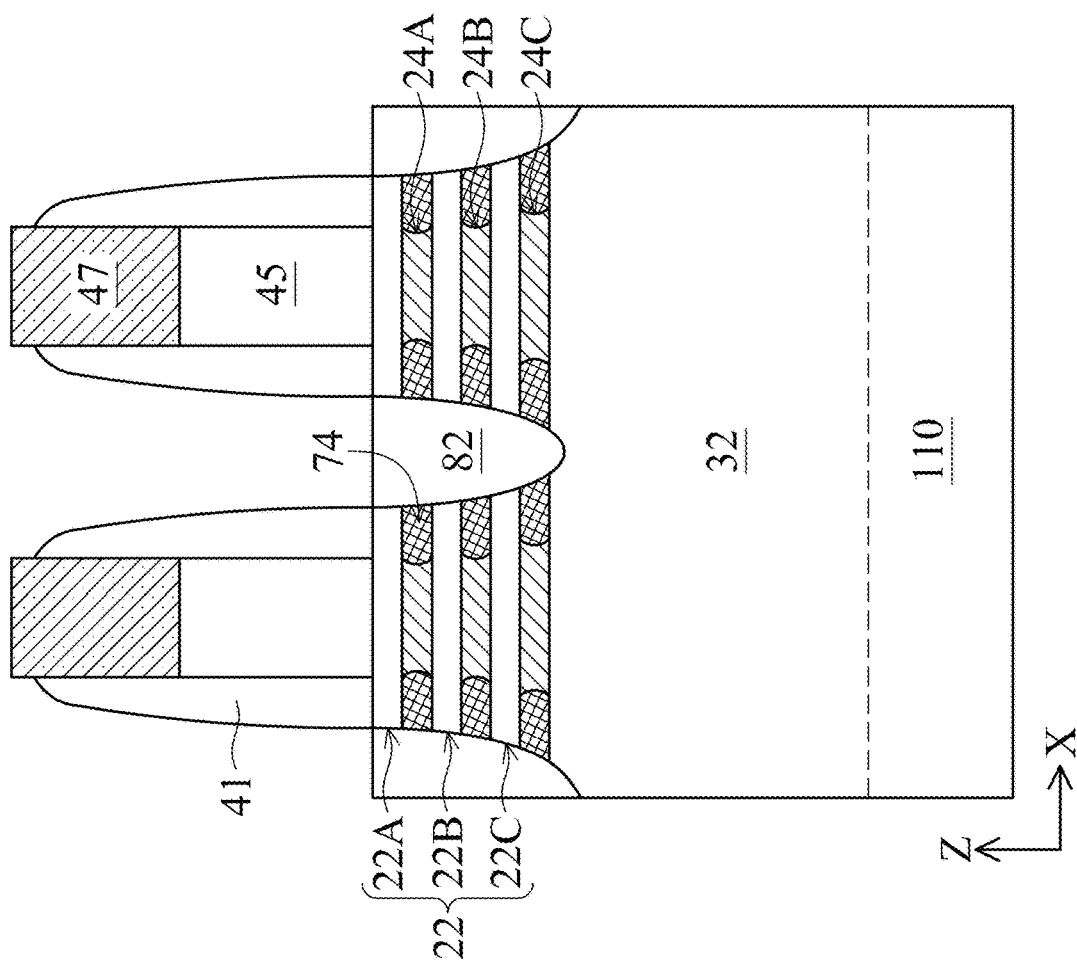
Figure 8A:
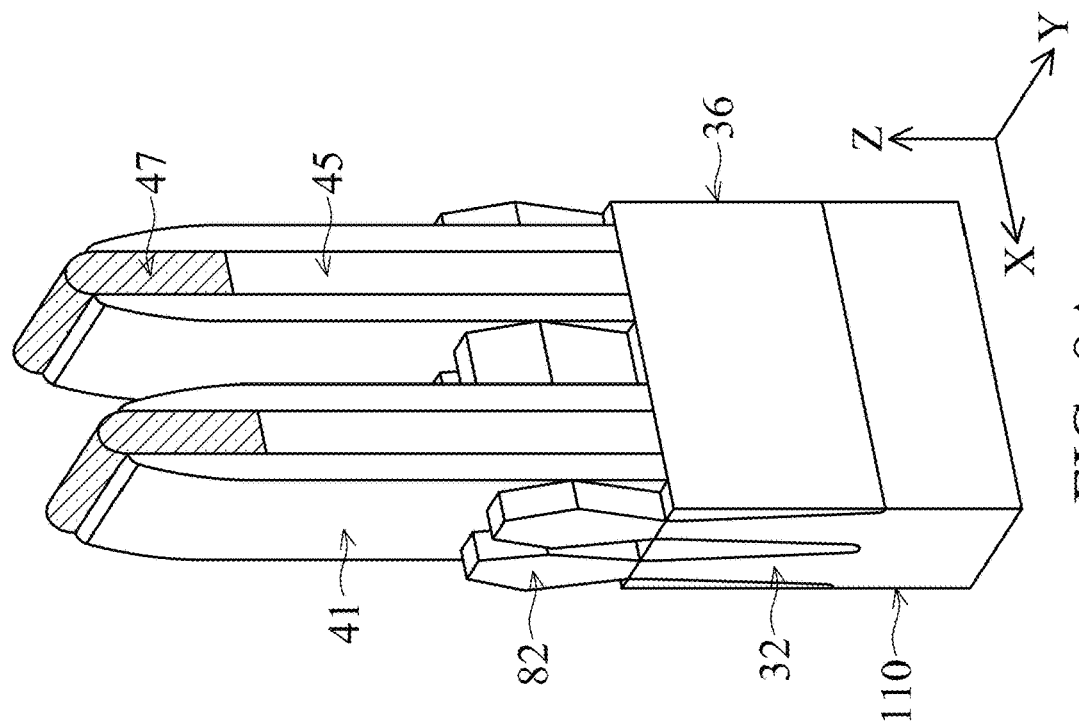
Figure 8E:
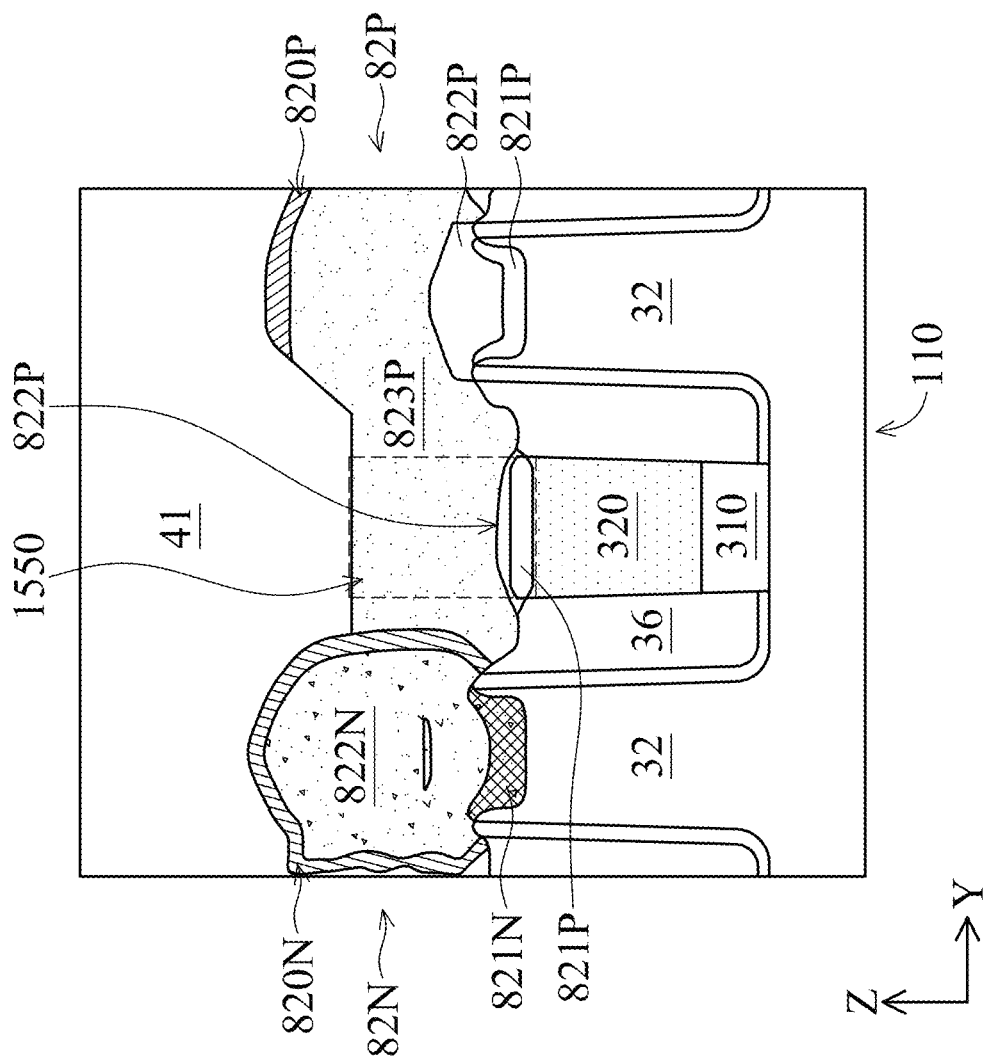

In FIG. 8E, which illustrates the N-type and P-type source/drain regions 82N, 82P formed over the fins 32 and the buried fin 330, many aspects may be similar to the configuration illustrated in FIG. 8D. In some embodiments, growth of the second P-type epitaxial region 822P over the buried fin 330 may be less than growth of the second P-type epitaxial region 822P over the fin 32, as shown. As such, following growth of the third P-type epitaxial region 823P over the second P-type epitaxial regions 822P, the third P-type epitaxial region 823P may have height over the buried fin 330 that is lower than height over the fin 32. In some embodiments, thickness of the third P-type epitaxial region 823P may be more uniform along the Y-axis than in the configuration shown in FIG. 8D. In some embodiments, the third P-type epitaxial region 823P formed over the buried fin 330 physically contacts the protective layer 820N. In some embodiments, the third P-type epitaxial region 823P separates the first and second P-type epitaxial regions 821P, 822P from the protective layer 820N.

In FIGS. 8D and 8E, the P-type source/drain 82P is formed over the fin 320 or the buried fin 330, respectively. In some embodiments, the N-type source/drain 82N is formed over the fin 320 and/or the buried fin 330, and the P-type source/drain 82P is formed over the fin 32 (e.g., the fin 32 on the left side of FIG. 8D or FIG. 8E). In such embodiments, the P-type source/drain 82P may be formed prior to the N-type source/drain 82N, and the protective layer 820P of the P-type source/drain 82P may be formed to isolate the P-type epitaxial regions 821P, 822P from the N-type epitaxial regions 821N, 822N. In some embodiments, the P-type source/drain 82P may include two P-type epitaxial regions 821P, 822P, and the N-type source/drain 82N may include three N-type epitaxial regions, including the first and second N-type epitaxial regions 821N, 822N and a third N-type epitaxial region (not separately illustrated). Growth of the N-type source/drain 82N over the fin 320 and/or the buried fin 330 and the fin 32 (e.g., the fin 32 on the right side of FIG. 8D or FIG. 8E) may be similar to the growth of the P-type source/drain 82P shown in FIG. 8D and FIG. 8E, in such embodiments.

Figure 9A:
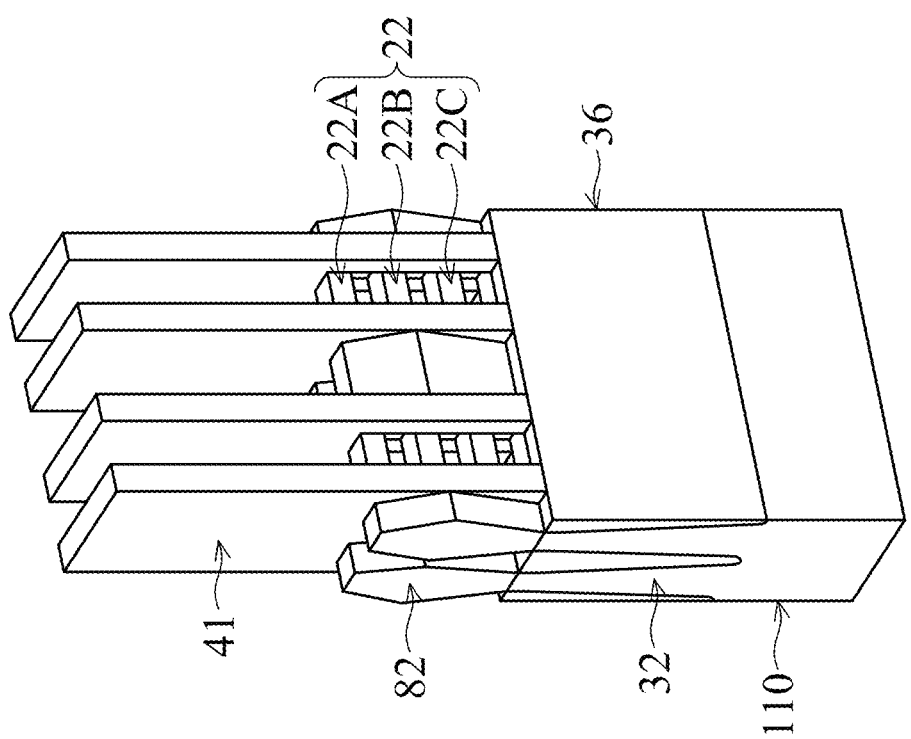
Figure 9C:
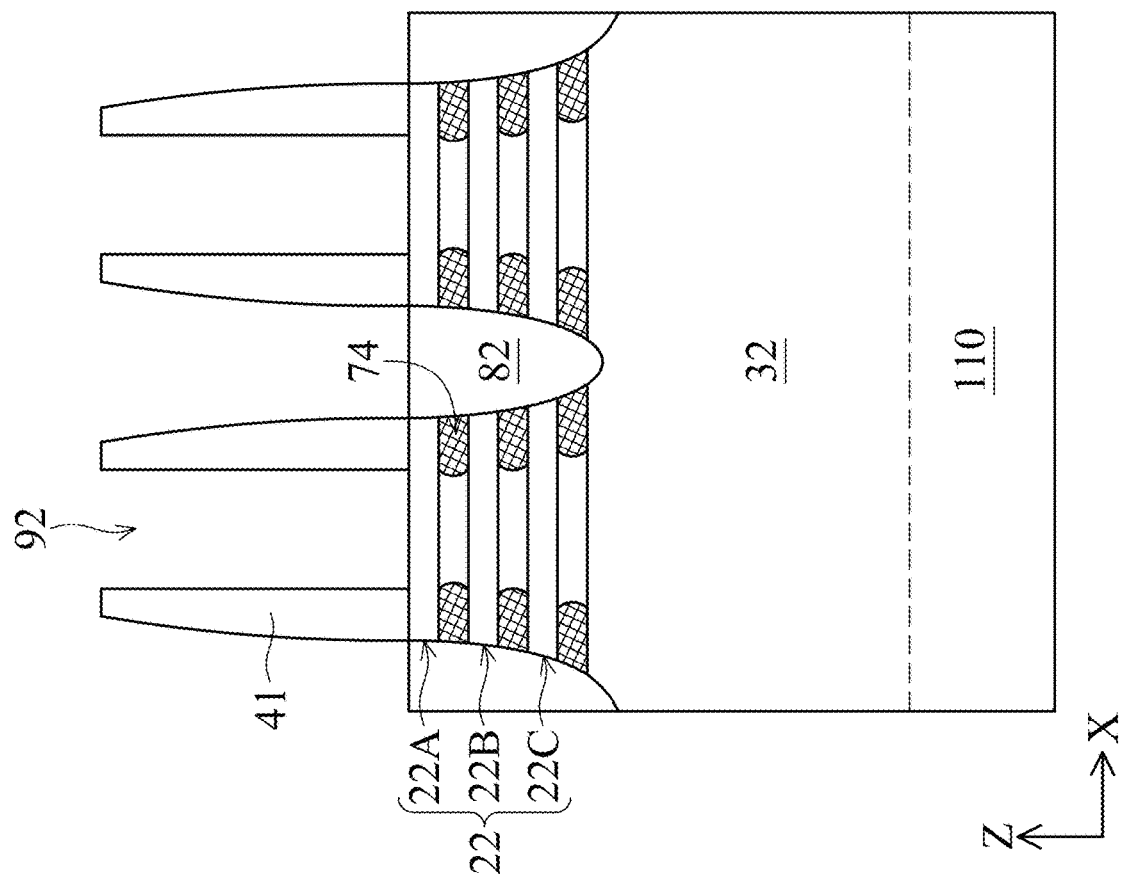
Figure 9B:
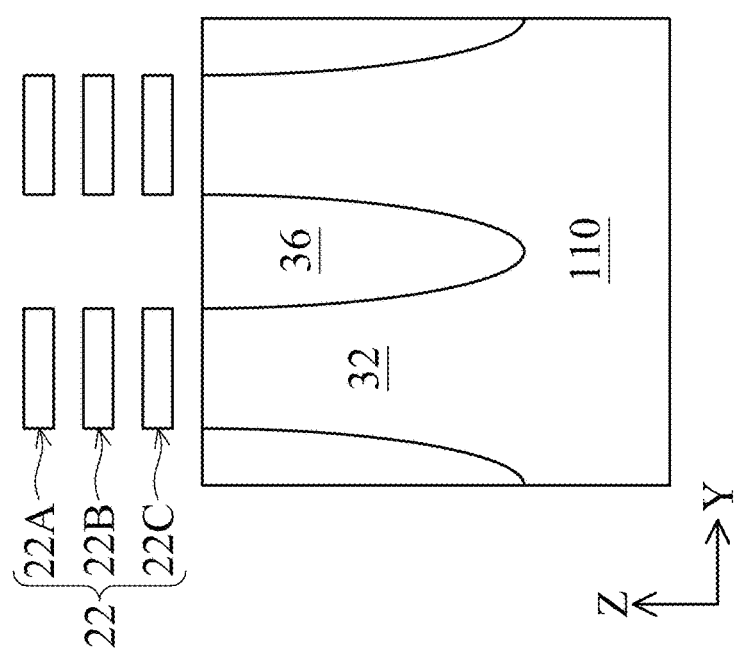

FIG. 9A, FIG. 9B, and FIG. 9C illustrate release of fin channels 22A-22C by removal of the nanostructures 24A-24C, the mask layer 47, and the dummy gate layer 45, which corresponds to act 1500 of FIG. 19. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110) and are stacked vertically. The nanosheets may be collectively referred to as the channels 22 of the nanostructure devices 20A, 20B formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs, such as the nanostructure device 20B and the nanostructure device 20A, respectively. However, in some embodiments the nanostructures 24 may be removed and the nanostructures 22 may be patterned to form channel regions of the nanostructure device 20A, and nanostructures 22 may be removed and the nanostructures 24 may be patterned to form channel regions of the nanostructure device 20B. In some embodiments, the nanostructures 22 may be removed and the nanostructures 24 may be patterned to form channel regions of the nanostructure device 20A, and the nanostructures 24 may be removed and the nanostructures 22 may be patterned to form channel regions of the nanostructure device 20B. In some embodiments, the nanostructures 22 may be removed and the nanostructures 24 may be patterned to form channel regions of both PFETs and NFETs.

In some embodiments, the nanosheets 22 of the nanostructure devices 20A, 20B are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10A:
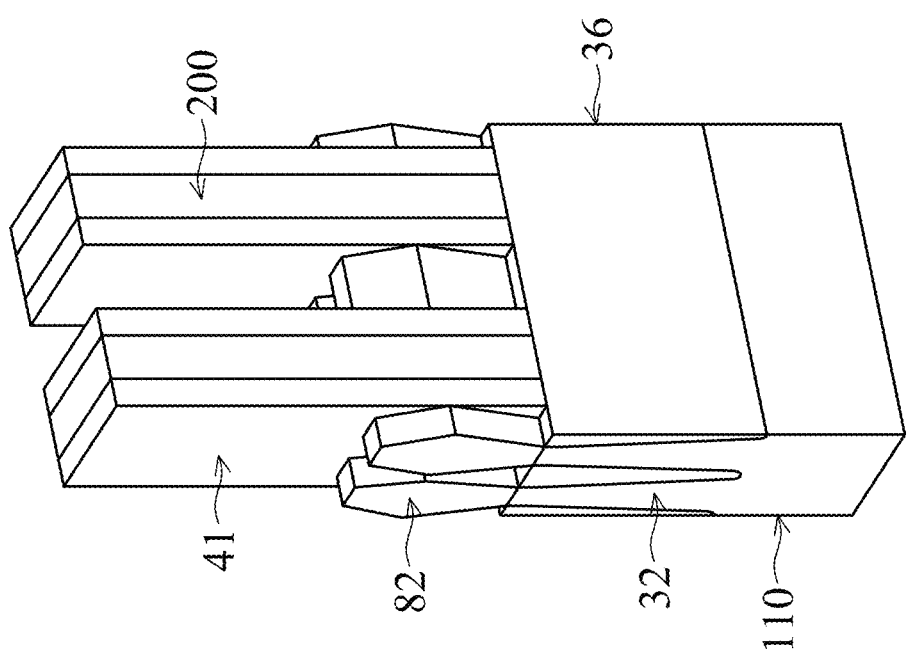
Figure 10C:
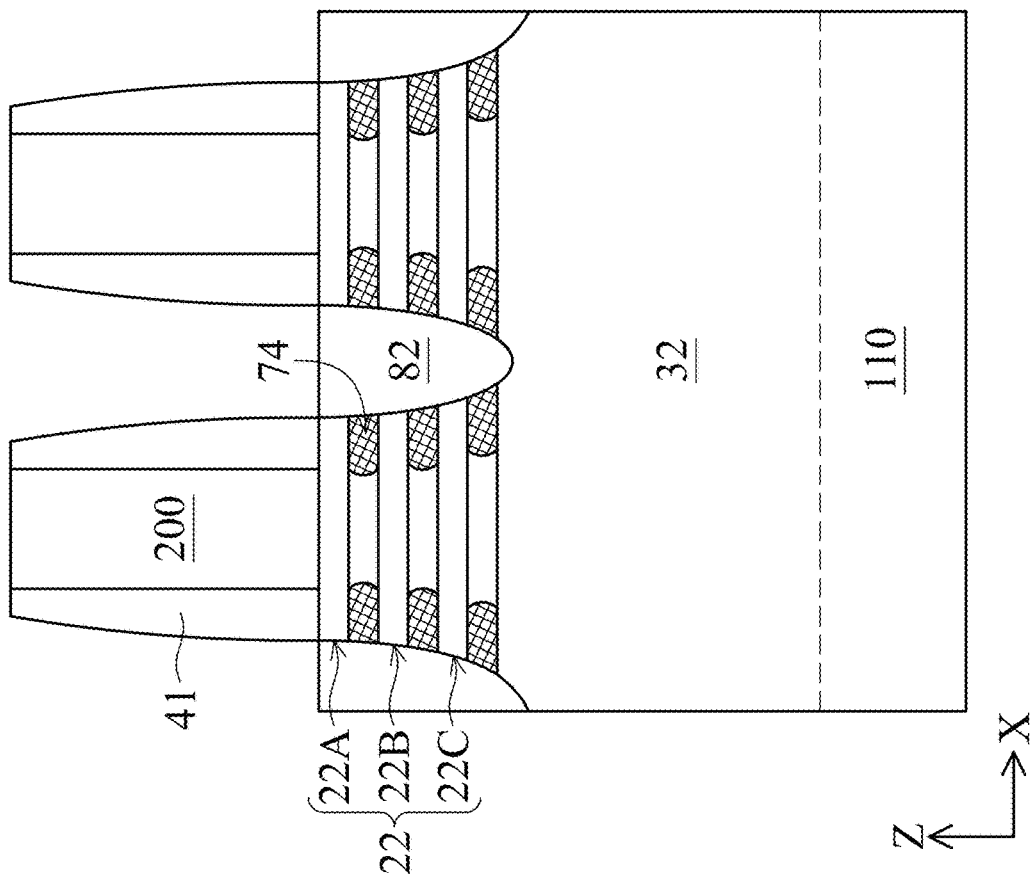
Figure 10B:
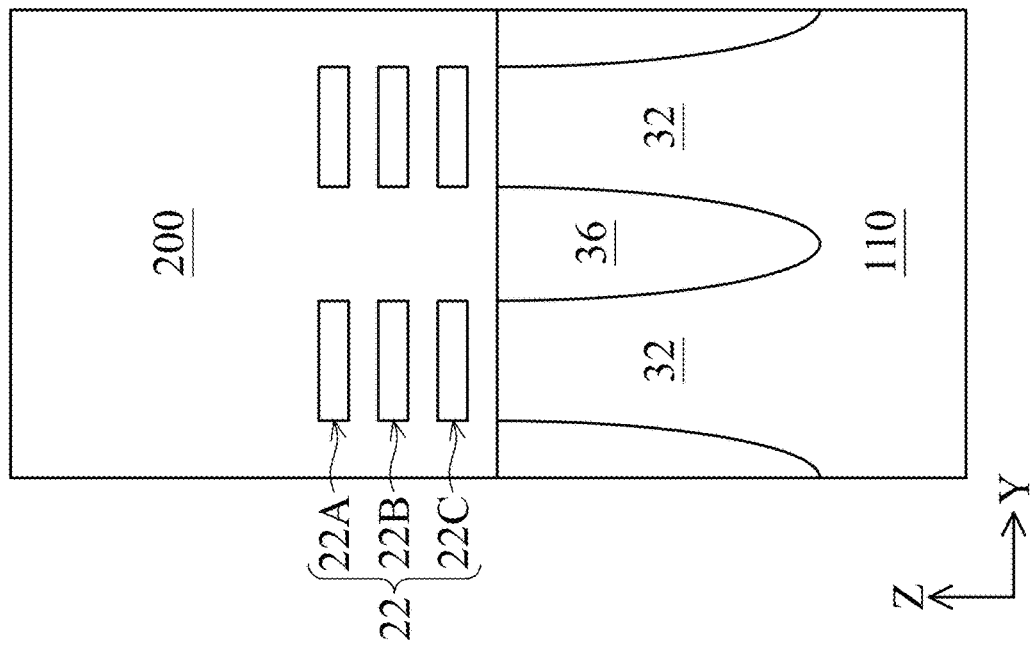

Next, in FIGS. 10A-10C, replacement gates 200, such as the gate structure 200, are formed, corresponding to act 1600 of FIG. 19. Each replacement gate 200 generally includes the first IL layer 210, the gate dielectric layer 600 and the gate fill layer 290. In some embodiments, the replacement gate 200 further includes work function metal layers.

Additional processing may be performed to finish fabrication of the nanostructure device 20A and/or the nanostructure device 20B. For example, gate contacts (not illustrated for simplicity) and the source/drain contacts 120 may be formed to electrically couple to the gate structures 200 and the source/drain regions 82, respectively, corresponding to act 1700 of FIG. 19. An interconnect structure may then be formed over the source/drain contacts 120 and the gate contacts corresponding to act 1800 of FIG. 19. The interconnect structure may include a plurality of dielectric layers surrounding metallic features, including conductive traces and conductive vias, which form electrical connection between devices on the substrate 110, such as the nanostructure devices 20A, 20B, as well as to IC devices external to the IC device 10.

FIGS. 11A-17 are perspective views illustrating backside processing of the device 10 in accordance with various embodiments, corresponding to operation 1800 of FIG. 19. Method 2000 shown in FIG. 20 illustrates detailed acts of operation 1800 of FIG. 19 in accordance with various embodiments. Some features may be omitted from the figures to simplify illustration. In the backside processing, the P-type and N-type source/drain regions 82P, 82N, which are merged over the fin 320 or the buried fin 330, are separated through etching by access through the fin 320 or the buried fin 330 from the backside of the device 10.

Figure 11A:
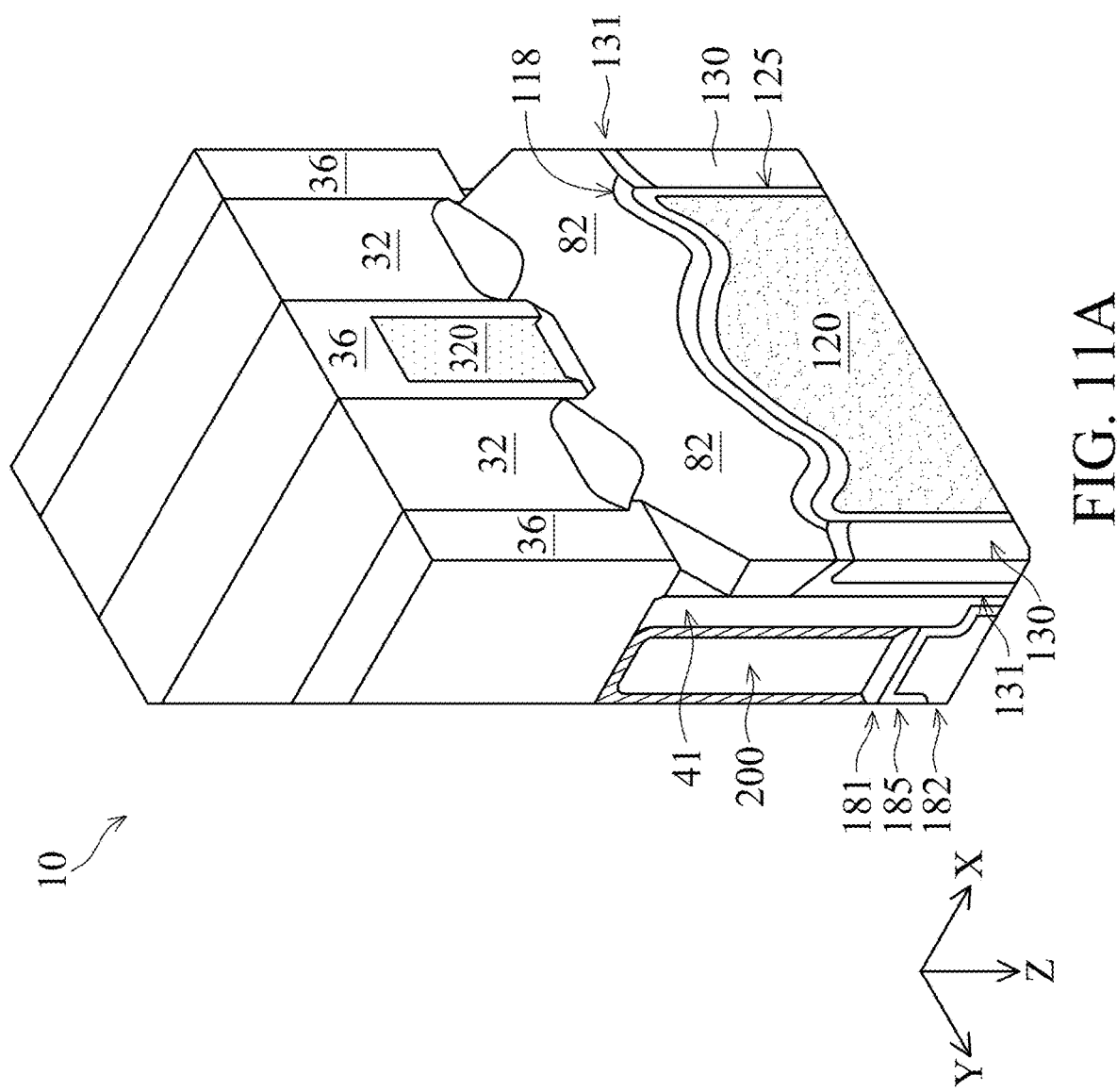

As shown in FIG. 11A, the device 10 includes the source/drain contact 120 formed in the ILD 130. In some embodiments, the source/drain contact 120 includes a glue layer 125, which may be formed conformally over the source/drain regions 82 and sidewalls of the ILD 130. In embodiments in which the etch stop layer 131 is present, the glue layer 125 may further cover sidewalls of the etch stop layer 131. A silicide layer 118 may also be present between the source/drain contact 120 and the source/drain regions 82, and may be or include an alloy of a metal of the source/drain contact 120 and the material of the source/drain regions 82. In some embodiments, instead the common source/drain contact 120 shown in FIG. 11A, two source/drain contacts 120 that are electrically isolated from each other may be formed on respective sides of the merged source/drain region 82.

Figure 11B:
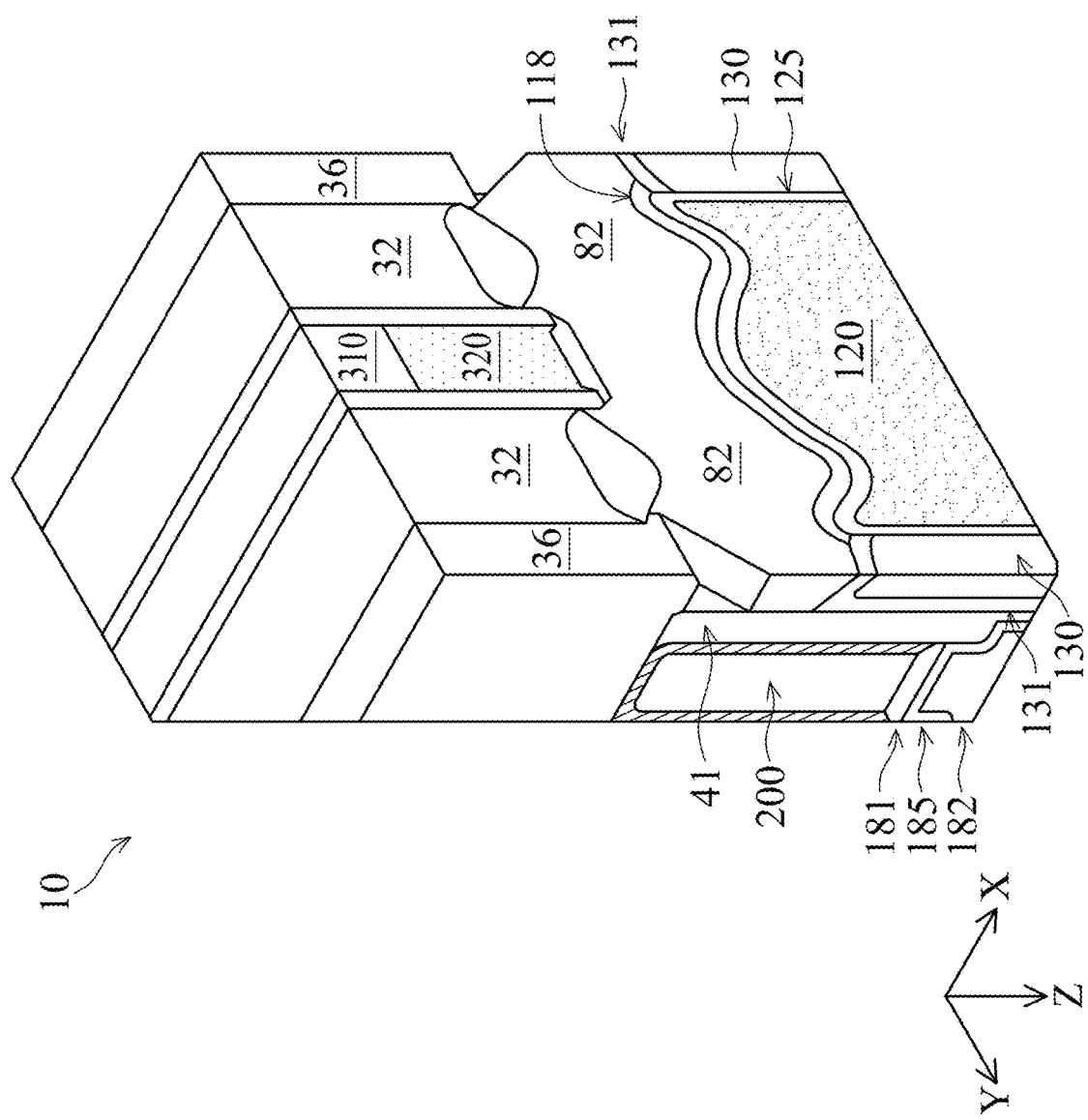

In FIGS. 11A, 11B, the device 10 is flipped in orientation compared to what is shown in FIG. 10A. The device 10 may be inverted by attaching a carrier wafer (not shown) to the upper surface of the device 10, and rotating the device 10 to expose the substrate 110. As shown in FIGS. 11A, 11B, following inverting of the device 10, the substrate 110 is removed to expose the fins 32 and the isolation regions 36 (FIGS. 11A, 11B), and the fin base 310 (FIG. 11B), corresponding to act 2100 of FIG. 20. The substrate 110 may be removed by any suitable process, including grinding, CMP, etching or the like. The removal may stop upon reaching the isolation regions 36. In FIG. 11B, by including the fin base 310, termination of the removal may be conveniently set at a point when the fin base 310 is reached. At this point, the fin 320 may be unexposed, e.g., covered by material of the isolation region 36, as shown in FIG. 11A, or covered by material of the fin base 310, as shown in FIG. 11B.

Figure 12A:
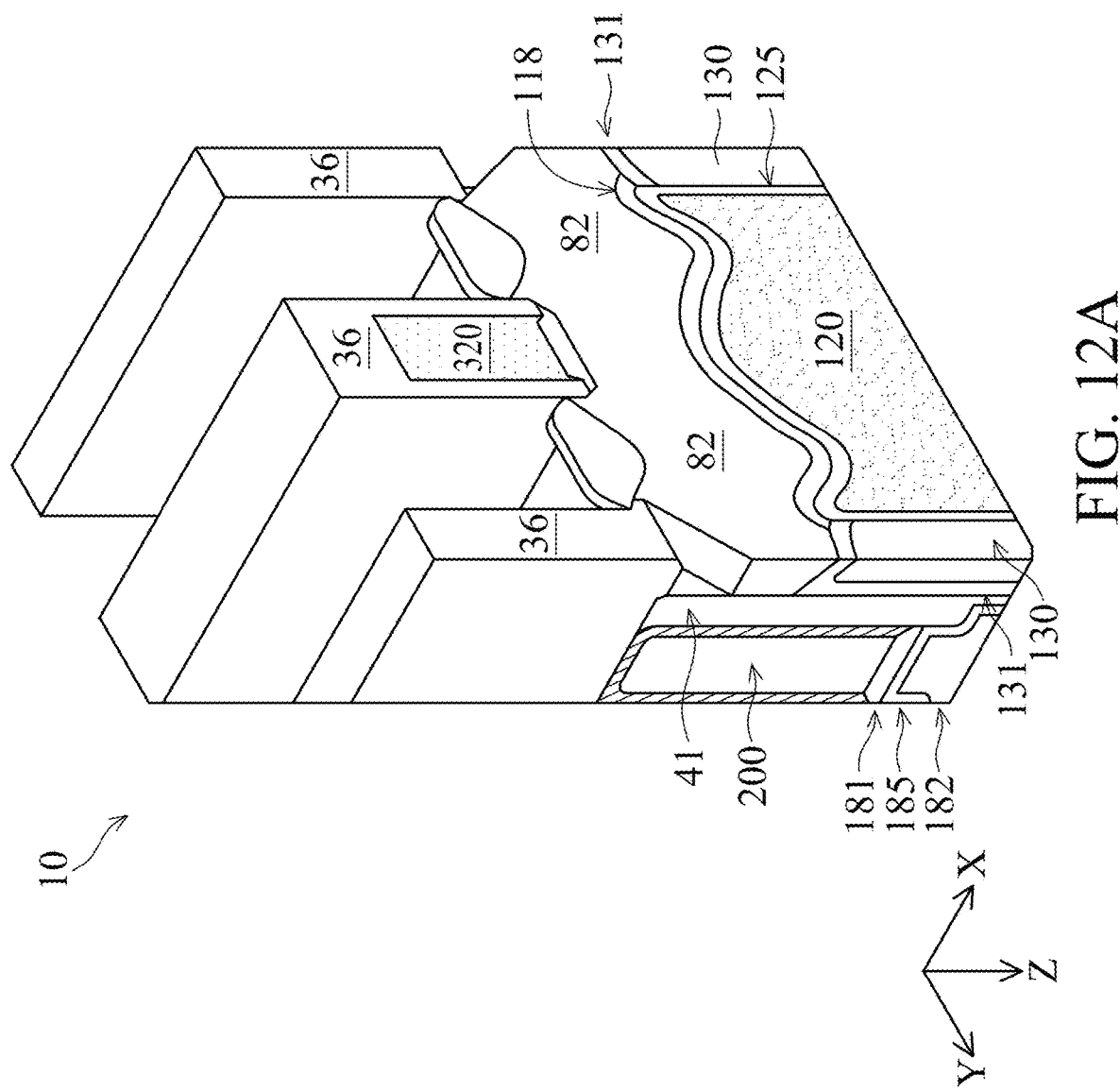
Figure 12B:
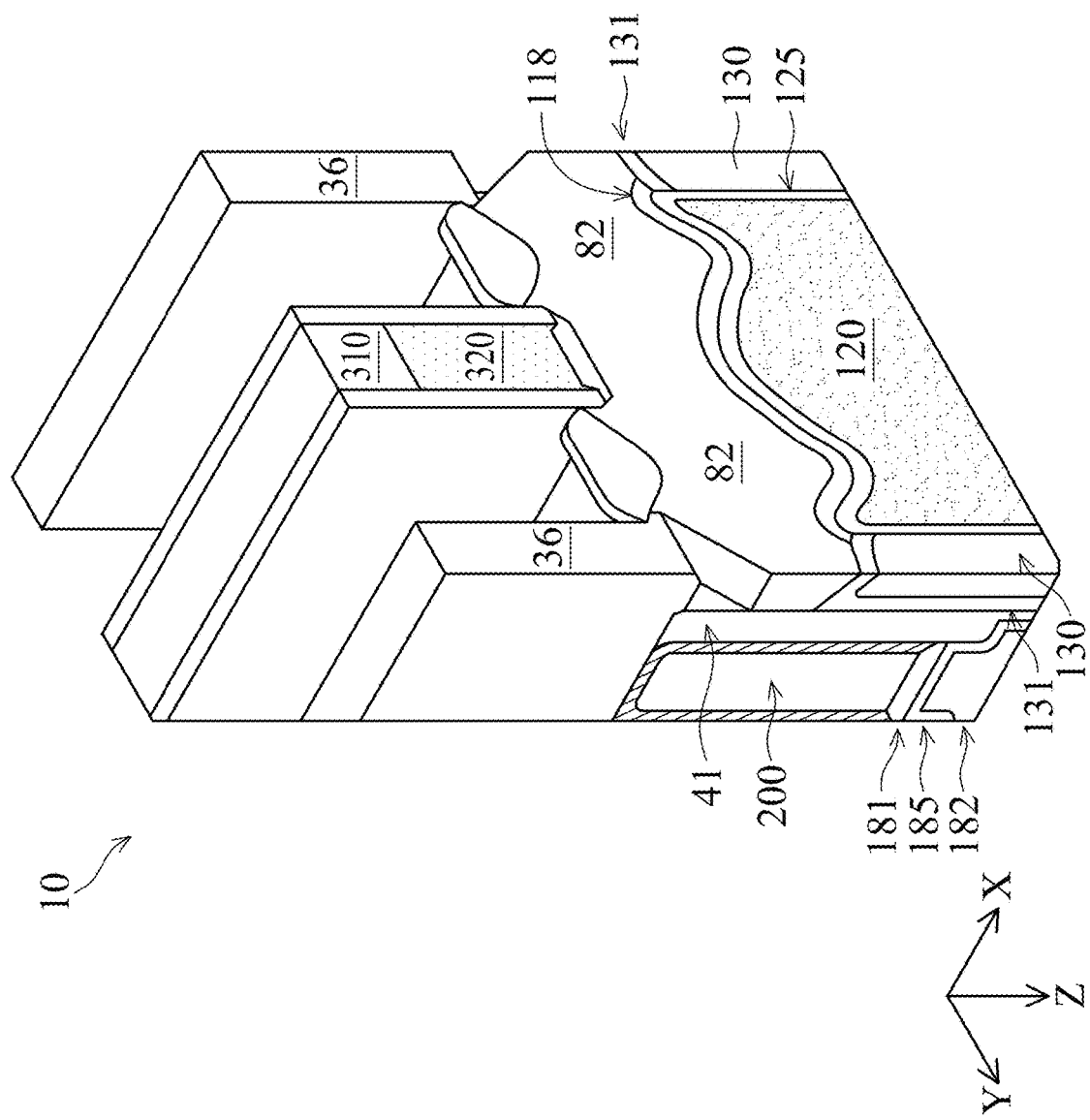

In FIGS. 12A, 12B, following removal of the substrate 110, the fins 32 are removed, which exposes the gate structures 200 and the source/drain regions 82, corresponding to act 2200 of FIG. 20. In some embodiments, the fins 32 are removed by one or more etching processes, which may be more selective to the semiconductive material of the fins 32 than to the dielectric material of the isolation regions 36. The etching may be any acceptable etch process, such as a reactive ion etch (ME), neutral beam etch (NBE), the like, or a combination thereof. The etching may be anisotropic. In FIG. 12B, the fin 320 is protected by the fin base 310, which has a different etch selectivity than the fins 32. For example, the fin base 310 may be or include silicon germanium, while the fins 32 may be silicon. In FIG. 12A, the fin 320 is protected by the isolation region 36 during etching of the fins 32.

Figure 13:
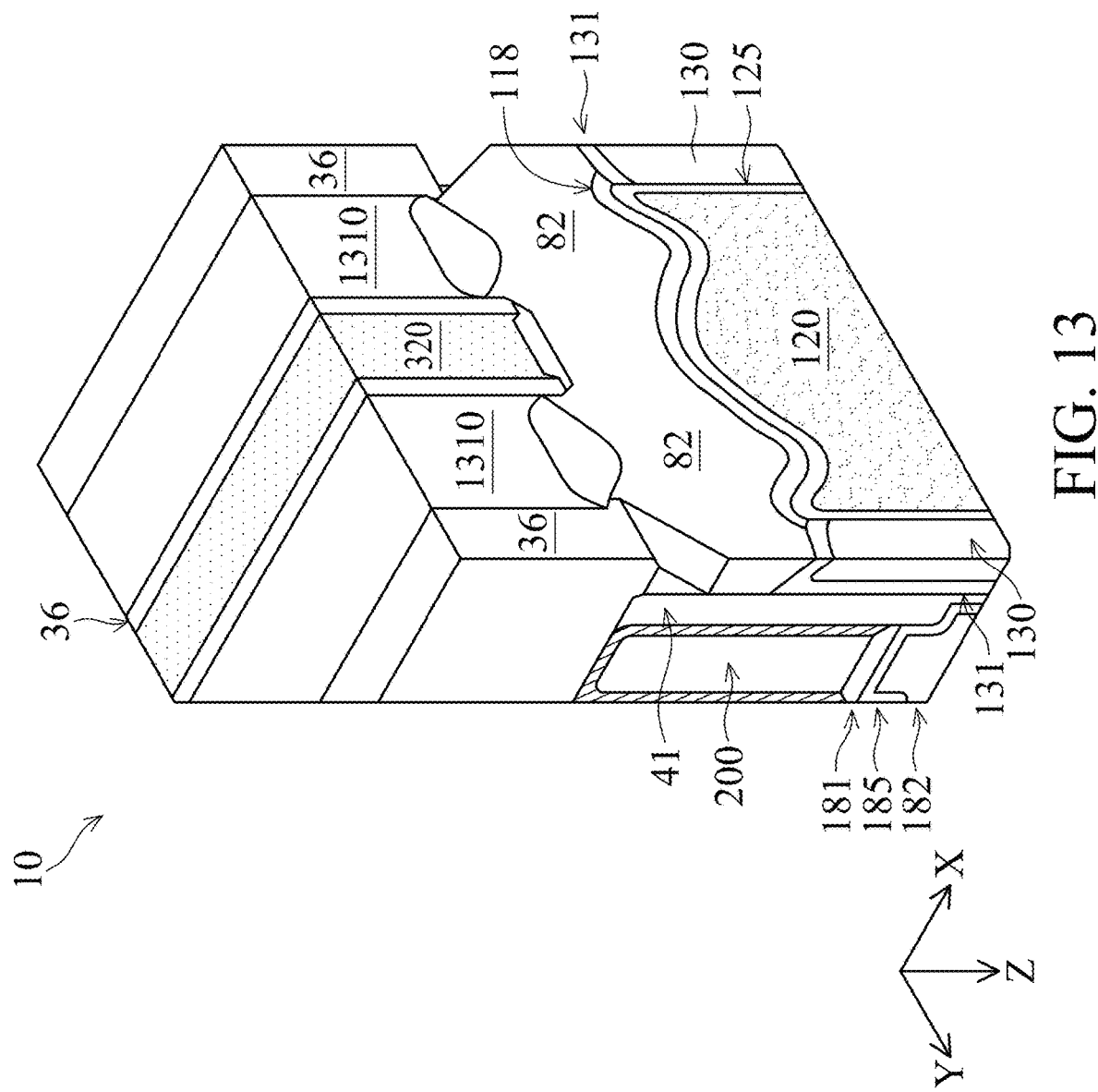

In FIG. 13, following removal of the fins 32, replacements fins 1310, which may be dielectric fins 1310, are formed in openings left by the etching operation of FIG. 12A or FIG. 12B, corresponding to act 2300 of FIG. 20. In some embodiments, the replacement fins 1310 are formed by one or more deposition processes, such as a CVD, ALD, or other suitable deposition process. The replacements fins 1310 may contact the source/drain regions 82 and sidewalls of the isolation regions 36. In subsequent operations, the fin 320 or the buried fin 330, and the isolation regions 36 may be removed. As such, the replacement fins 1310 are or comprise material having different etch selectivity than the materials of the fins 32 and the isolation regions 36. For example, the isolation regions 36 may be or comprise silicon oxide, the fin 320 may be or include silicon or silicon germanium, and the replacement fins 1310 may be or comprise a nitride, such as silicon nitride. Following formation of the replacement fins 1310, a removal operation, such as etching, grinding or CMP, may be performed to planarize the surfaces of the replacement fins 1310 and the isolation regions 36, and to expose the backside of the fin 320, corresponding to act 2400 of FIG. 20.

Figure 14:
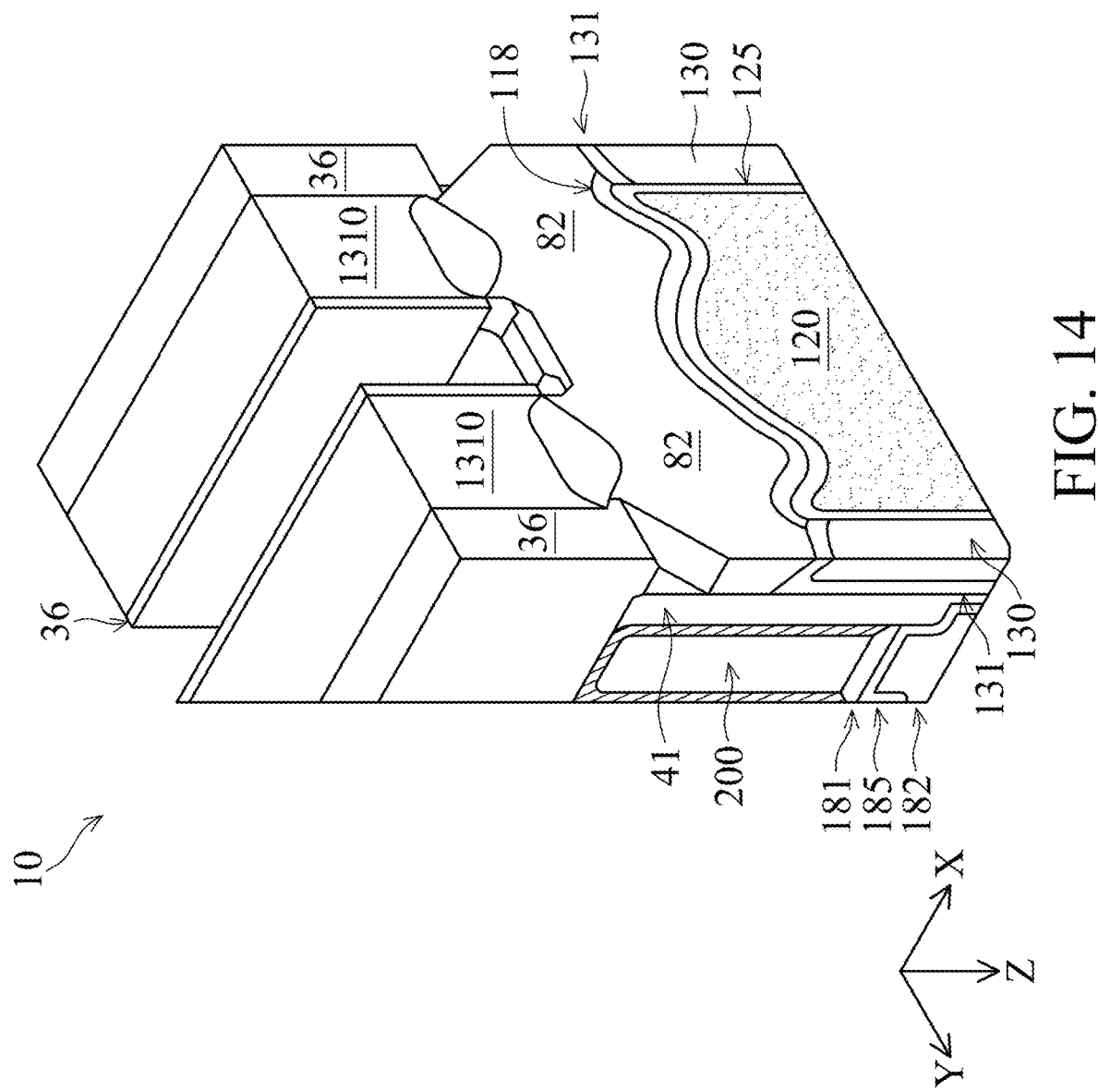

In FIG. 14, following formation of the replacement fins 1310 and exposing of the fin 320, the fin 320 is removed to expose the source/drain regions 82, as shown, corresponding to act 2500 of FIG. 20. The fin 320 may be removed by one or more removal operations, such as an etching operation. The buried fin 330, which includes the fin base 310 and the fin 320 having different materials, may be removed by two or more removal operations, such as etching operations. In some embodiments, the fin 320 or the buried fin 330 is removed by a reactive ion etch (ME), neutral beam etch (NBE), the like, or a combination thereof. The etching may be anisotropic. Following removal of the fin 320 or the buried fin 330, one or more layers of the fill material 367 or the liner layer 365 may remain on sidewalls of the replacement fins 1310, as shown. In some embodiments, the isolation regions 36 are also removed prior to separating the source/drain regions 82. By only removing the fin 320 or the buried fin 330, size of each source/drain region 82 following separation may be greater than if the isolation regions 36 were also removed.

Figure 15:
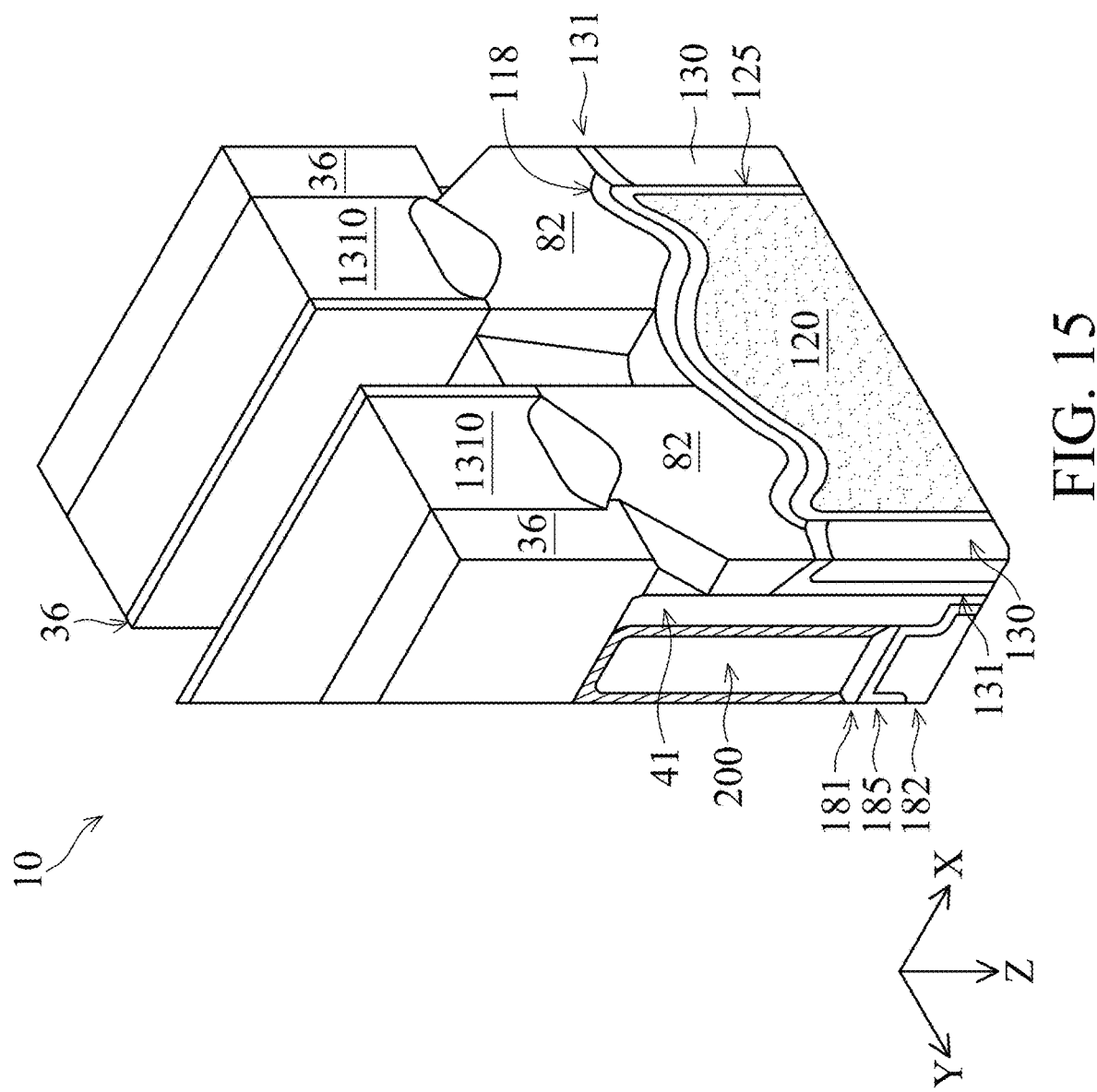

In FIG. 15, following removal of the fin 320, the source/drain regions 82 are separated by one or more removal processes, corresponding to act 2600 of FIG. 20. In some embodiments, the source/drain regions 82 are separated by performing one or more etching operations through the opening left by removing the fin 320. The removal process may terminate upon reaching the silicide layer 118, when present (as shown in FIG. 15), upon reaching the glue layer 125, when present, or upon reaching the source/drain contact 120 when the silicide layer 118 and the glue layer 125 are not present. In some embodiments, in which two source/drain contacts 120 are formed that are electrically isolated from (e.g., separated from) each other, the two source/drain contacts 120 may be separated by, for example, the ILD 130. In such embodiments, the removal process may terminate upon reaching the ILD 130 between the source/drain contacts 120. In some embodiments, the removal process includes an etching operation, such as reactive ion etch (ME), neutral beam etch (NBE), the like, or a combination thereof. In some embodiments, the etching operation is anisotropic. In some embodiments, due to the anisotropic nature of the etching operation, sidewalls of the source/drain regions 82 facing the opening left by the etching operation are substantially planar, and may be vertical or tapered. In some embodiments, the sidewalls of the source/drain regions 82 that are in contact with the second isolation region 360 are substantially coplanar with sidewalls of the isolation region 36 contacting the second isolation region 360. Separating the source/drain regions 82 reduces size of the source/drain regions 82, which reduces capacitance (e.g., gate-source capacitance CGS or gate-drain capacitance CGD) between the source/drain regions 82 and the gate structures 200 respectively associated therewith. Increasing the lateral distance between the source/drain regions 82 reduces capacitance (e.g., source-drain capacitance CSD) between the source/drain regions 82.

Figure 16A:
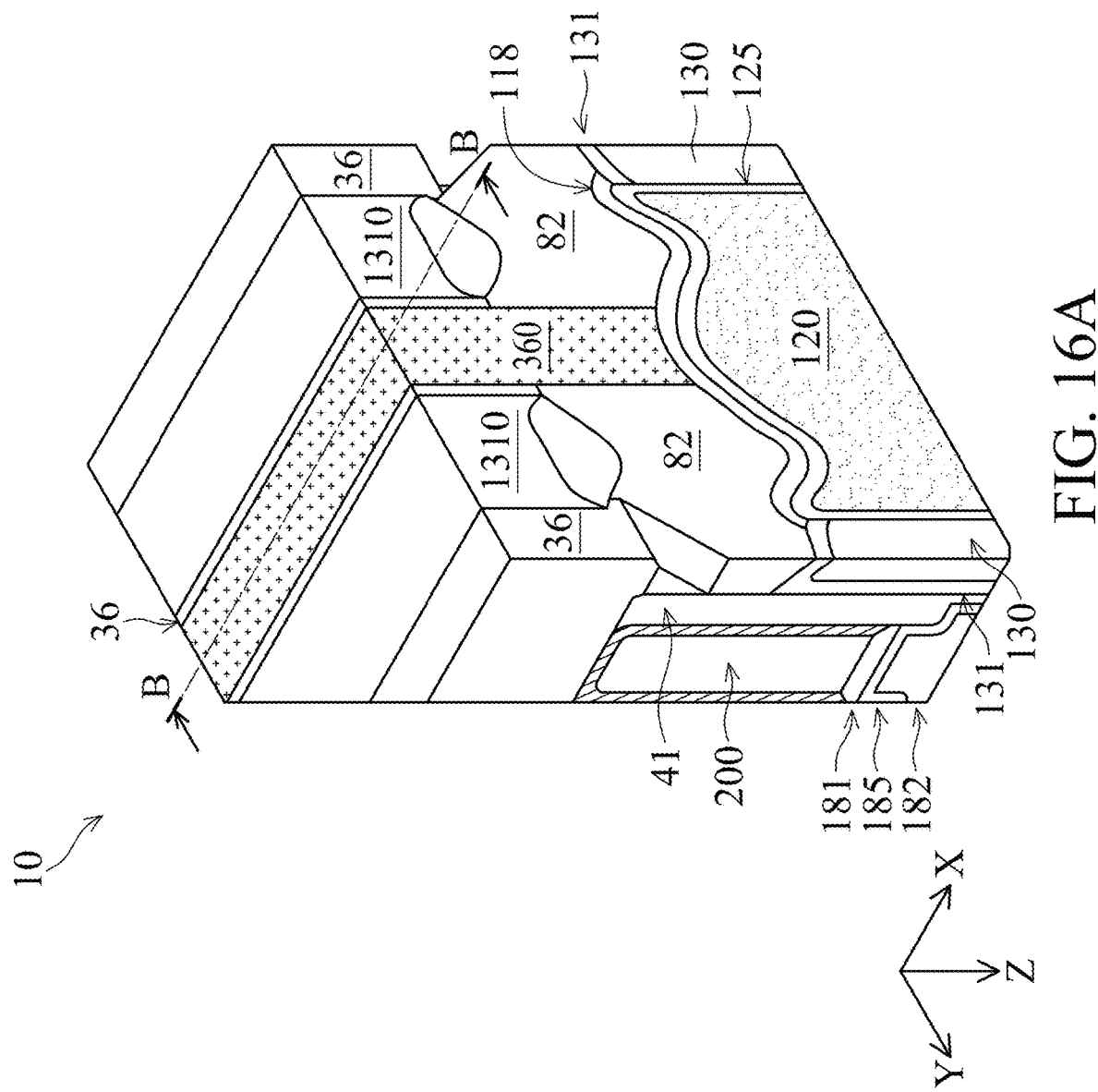

In FIG. 16A, following separation of the source/drain regions 82, a second isolation region 360 is formed by filling the opening left by removing the fin 320 or the buried fin 330 and separating the source/drain regions 82, corresponding to act 2700 of FIG. 20. In some embodiments, the second isolation region 360 is formed by one or more deposition processes, such as a CVD, ALD, the like, or a combination thereof. The second isolation region 360 may be or include the same material(s) as the fill material 367 of the isolation region 36. The second isolation region 360 substantially fills the opening described. In some embodiments, lateral sidewalls (facing the Y-direction) of the second isolation region 360 are in contact with sidewalls of the fill material 367 of the isolation region, and are further in contact with sidewalls of the source/drain regions 82. Further lateral sidewalls (facing the X-direction) of the second isolation region 360 may contact the spacer layer 41.

Figure 16B:
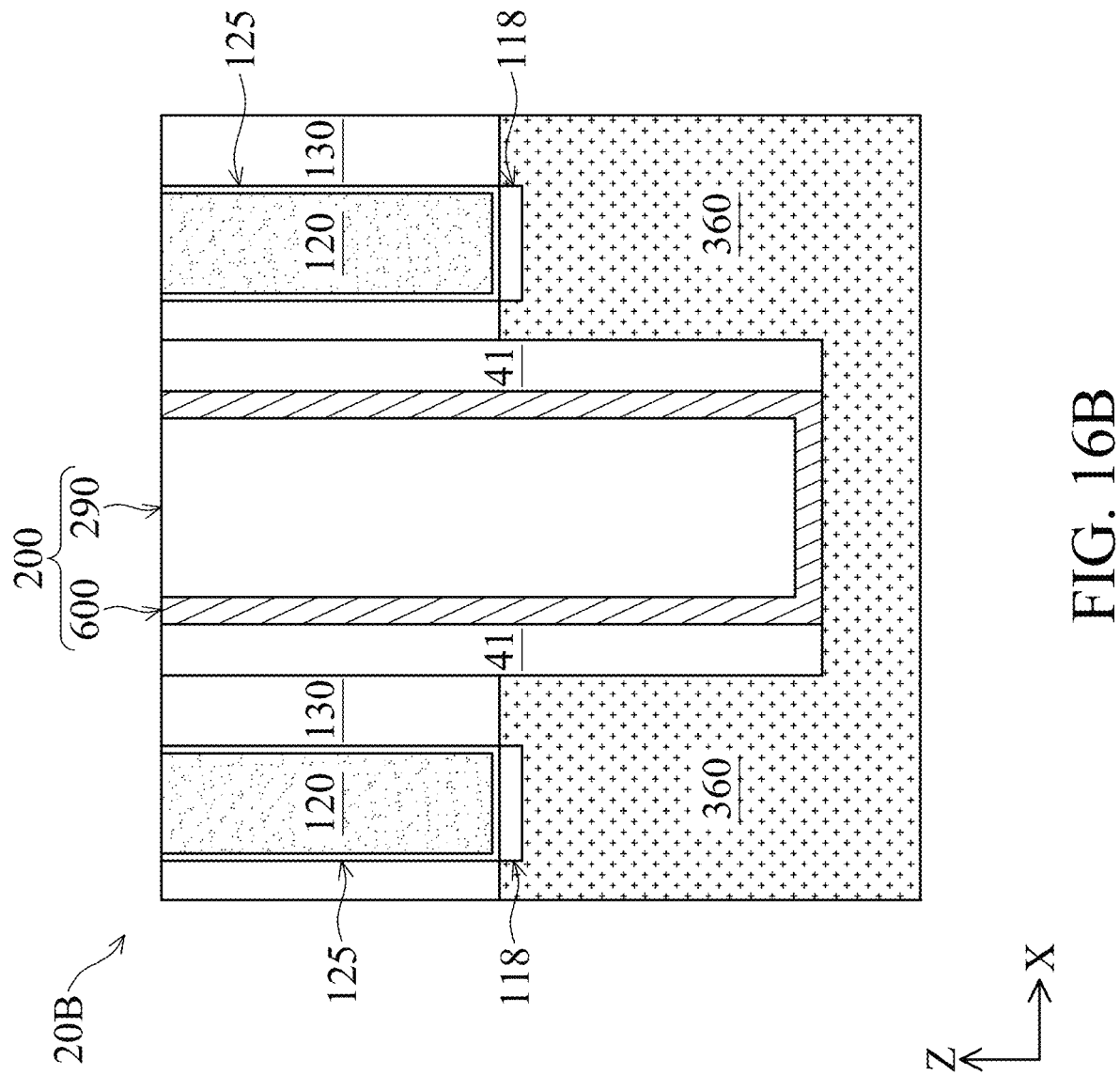

FIG. 16B shows a cross-sectional side view of the device 10 taken along the line B-B shown in FIG. 16A. The line B-B is taken between the fins 32 separated by the long lateral distance, through the second isolation region 360. In some embodiments, the gate structure 200 and the spacer layer 41 are embedded in the second isolation region 360, as shown. The second isolation region 360 may wrap around the gate structure 200 and the spacer layer 41, such that lateral sidewalls of the spacer layer 41 contact the second isolation region 360, and bottom surfaces of the spacer layer 41 and the gate structure 200 contact the second isolation region 360. In some embodiments, the bottom surface of the gate dielectric layer 600 contacts the second isolation region 360. In some embodiments, an interfacial layer, such as the first IL 210 contacts the second isolation region 360.

Figure 16C:
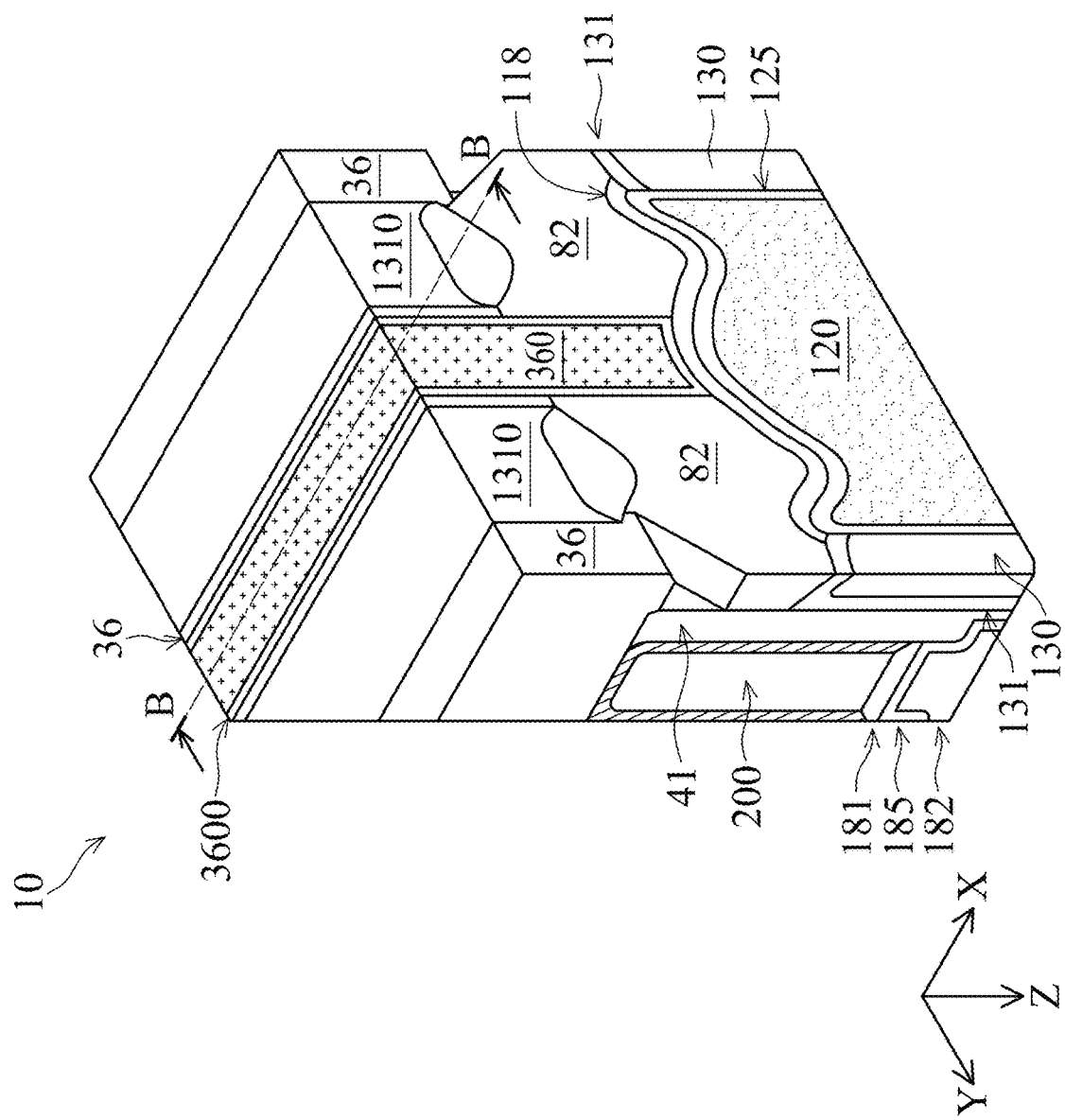
Figure 16D:
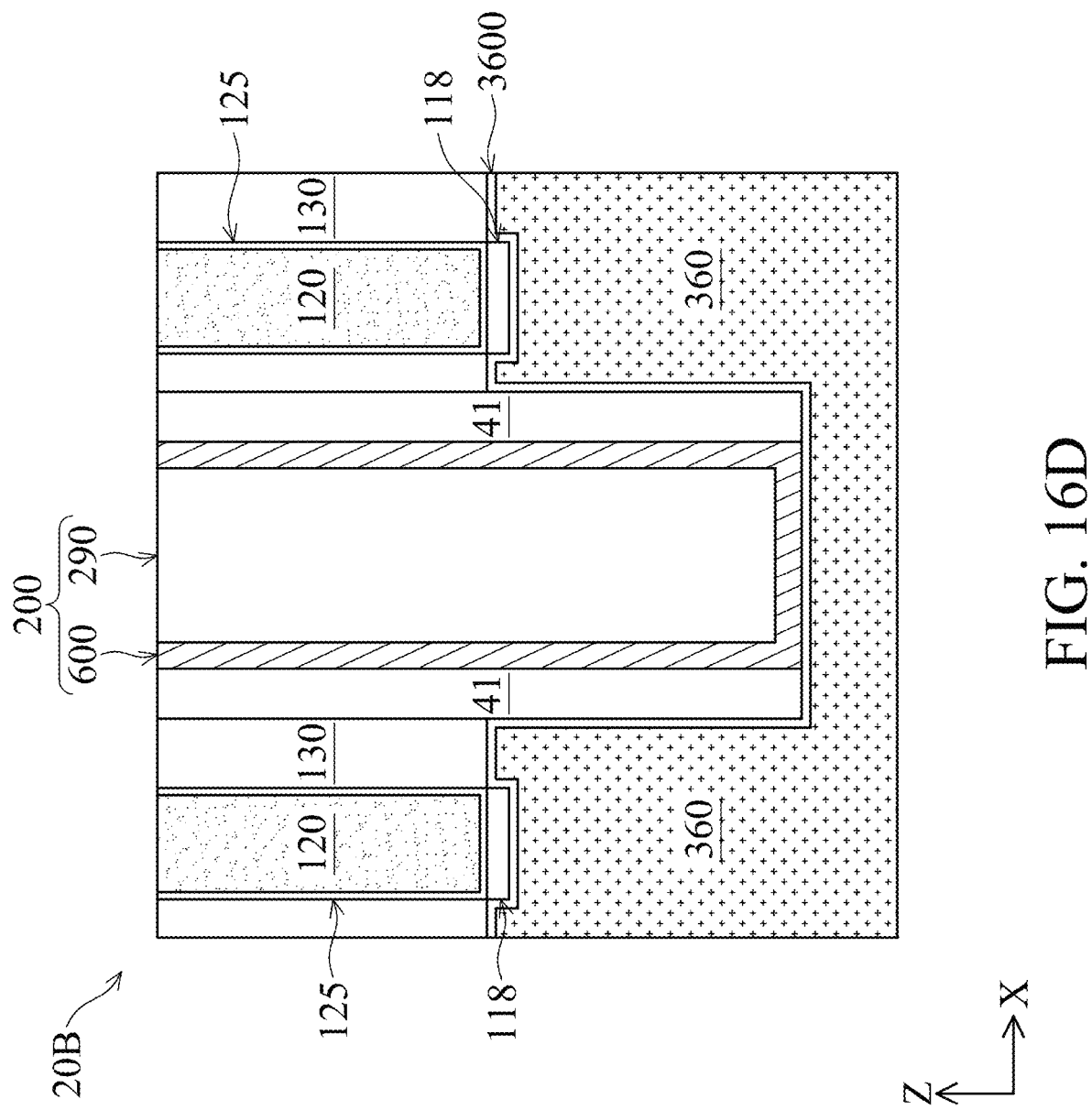

FIGS. 16C, 16D show perspective and side views of the device 10 in accordance with various embodiments. In some embodiments, deposition of the second isolation region 360 is preceded by deposition of a liner layer 3600, which may be formed conformally in the opening described prior to forming the second isolation region 360. The liner layer 3600 may include a dielectric material, which may be a low-k dielectric material or a high-k dielectric material. In some embodiments, the material of the liner layer 3600 is different from the material of the second isolation region 360. In some embodiments, a visible interface is present between the liner layer 3600 and the second isolation region 360. As shown in FIG. 16C, the liner layer 3600 may be positioned between the silicide 118 and the second isolation region 360. In some embodiments in which the silicide 118 is not present, the liner layer 3600 may be in contact with the glue layer 125. As shown in FIG. 16D, the liner layer 3600 may be in contact with the spacer layer 41, the gate dielectric layer 600, the silicide and the ILD 130. The liner layer 3600 may further be in contact with the source/drain regions 82 and the replacement fins 1310, as shown in FIG. 16C.

Figure 17:
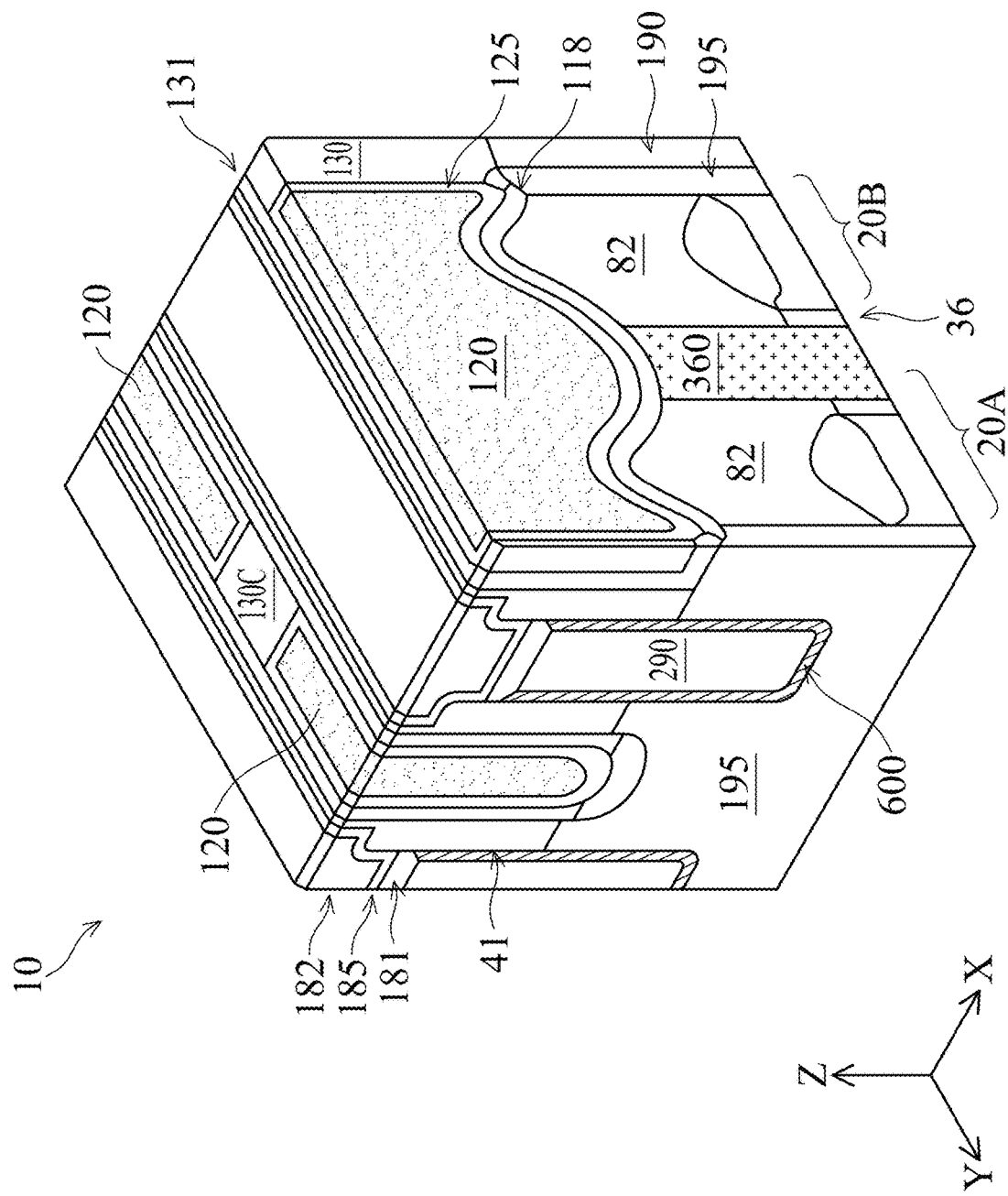

In FIG. 17, the device 10 is flipped again, and further processing may be performed to form interconnect structures (not shown) that electrically connect the transistors 20A, 20B to other circuit components. Prior to flipping the device 10, backside interconnect structures may also be formed to provide electrical connection to other circuit components and/or ground/power rails. As shown in FIG. 17, the second isolation region 360 may have an upper surface that is concave due to the convex bottom surface of the silicide 118. Generally, the shape of the upper surface of the second isolation region 360 follows the shape of the source/drain region 82N or 82P that was formed over the fin 320 (see FIG. 8D, FIG. 8E). Similarly, when the liner layer 3600 is present (see FIG. 16C), the upper surface of the liner layer 3600 may be concave due to the convex bottom surface of the silicide 118.

Further to FIG. 17, while portions of the source/drain regions 82 contacting the second isolation region 360 are illustrated as single material regions, in some embodiments, one or more of the source/drain region 82 portions on either lateral side of the second isolation region 360 may include a first type epitaxial region and a second type epitaxial region separated by a protective layer. For example, referring to FIG. 8D and FIG. 8E, as shown by region 1550 in both figures, an anisotropic cut through the opening left by the fin 320 may not completely remove portions of the second and/or third P-type epitaxial regions 822P, 823P in contact with the protection layer 820N. The region 1550 in FIG. 8D and FIG. 8E illustrates material of the P-type source/drain region 82P that is removed in act 2600 shown in FIG. 15. As such, material of the P-type source/drain region 82P that is between the region 1550 and the protective layer 820N remains following etching that separates the source/drain regions 82.

FIG. 18 is a detailed view of a portion of the gate structure 200. Each replacement gate 200, as illustrated in FIG. 18, generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 18, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 18, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A, 20B.

With further reference to FIG. 18, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200B, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfSiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 18, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 18 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

Embodiments may provide advantages. Inclusion of the fin 320 or the buried fin 330 improves separation of the source/drain regions 82 during backside processing that etches through the source/drain regions 82. The fin 320 or the buried fin 330 provides a seed during epitaxial growth of the source/drain regions 82 that ensures proper merger of the source/drain regions 82, which prevents overetching into, for example, the ILD 130 during the separation etch. The buried fin 330 including the fin base 310 further provides an advantage of simplified processing due to the presence of the fin base 310 as a stop layer during thinning of the substrate 110. As the fin base 310 has different etch selectivity than the fins 32, 320, the fin base 310 may also protect the fin 320 during removal of the fins 32.

In accordance with at least one embodiment, a device includes a substrate, a first semiconductor channel over the substrate, and a second semiconductor channel over the substrate and laterally separated from the first semiconductor channel. The device includes at least one gate structure covering and wrapping around the first semiconductor channel and the second semiconductor channel. A first source/drain region abuts the first semiconductor channel on a first side of the gate structure. A second source/drain region abuts the second semiconductor channel on the first side of the gate structure. An isolation structure is under and between the first source/drain region and the second source/drain region, and includes a first isolation region in contact with bottom surfaces of the first source/drain region and the second source/drain region, and a second isolation region in contact with sidewalls of the first source/drain region and the second source/drain region, and extending from a bottom surface of the first isolation region to upper surfaces of the first source/drain region and the second source/drain region.

In accordance with at least one embodiment, a method includes: forming a multilayer lattice of alternating first semiconductor layers and second semiconductor layers over a substrate; forming a first fin and a second fin over and in the substrate by etching the multilayer lattice and the substrate; forming a first opening between the first fin and the second fin by depositing a layer of an isolation region over the substrate, the first fin and the second fin; forming a third fin in the first opening; forming a gate structure over the first fin, the second fin and the third fin; forming a merged source/drain region over the first fin, the second fin and the third fin; exposing the first fin and the second fin by removing the substrate; removing the first fin and the second fin; exposing the third fin by etching the layer of the isolation region; forming a second opening by removing the third fin; and forming a first source/drain region and a second source/drain region by etching the merged source/drain region through the second opening.

In accordance with at least one embodiment, a method includes: forming on and in a substrate a first fin stack including a first vertical stack of channels over a first fin and a second fin stack including a second vertical stack of channels over a second fin; forming a buried fin having a fin base contacting the substrate between the first fin and the second fin, and a third fin overlying the fin base made of a different material than the fin base; forming a merged source/drain region over the first fin, the second fin and the third fin; exposing the fin base by removing the substrate; forming a first opening by removing the third fin; and forming a second opening separating the merged source/drain region by etching through the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first semiconductor channel over the substrate; and
a second semiconductor channel over the substrate and laterally separated from the first semiconductor channel;
at least one gate structure covering and wrapping around the first semiconductor channel and the second semiconductor channel;
a first source/drain region abutting the first semiconductor channel on a first side of the gate structure;
a second source/drain region abutting the second semiconductor channel on the first side of the gate structure;
an isolation structure under and between the first source/drain region and the second source/drain region, including:
a first isolation region in contact with bottom surfaces of the first source/drain region and the second source/drain region; and a second isolation region in contact with sidewalls of the first source/drain region and the second source/drain region, and extending from a bottom surface of the first isolation region to upper surfaces of the first source/drain region and the second source/drain region; and a source/drain contact over the first source/drain region and the second source/drain region, wherein the source/drain contact includes a glue layer in contact with the second isolation region.

2. The device of claim 1, wherein the sidewall of the first source/drain region contacting the second isolation region and a sidewall of the first isolation region contacting the second isolation region are substantially coplanar.

3. The device of claim 1, wherein the second isolation region is in contact with a bottom surface of the at least one gate structure.

4. The device of claim 3, wherein the second isolation region is in contact with sidewalls of a gate spacer layer abutting the at least one gate structure.

5. The device of claim 1, wherein the glue layer is formed of a metal nitride.

6. The device of claim 1, further comprising a silicide layer in contact with the source/drain contact and the second isolation region.

7. The device of claim 1, wherein the silicide layer is formed of cobalt silicide or tin silicide.

8. The device of claim 1, further comprising:
a first replacement fin abutting the first isolation region and the first source/drain region; and
a second replacement fin abutting the first isolation region and the second source/drain region.

9. A device, comprising:
a substrate;
a first semiconductor channel over the substrate; and
a second semiconductor channel over the substrate and laterally separated from the first semiconductor channel;
at least one gate structure covering and wrapping around the first semiconductor channel and the second semiconductor channel;
a first source/drain region abutting the first semiconductor channel on a first side of the gate structure;
a second source/drain region abutting the second semiconductor channel on the first side of the gate structure;
an isolation structure under and between the first source/drain region and the second source/drain region, including:
a first isolation region in contact with bottom surfaces of the first source/drain region and the second source/drain region; and
a second isolation region in contact with sidewalls of the first source/drain region and the second source/drain region, and extending from a bottom surface of the first isolation region to upper surfaces of the first source/drain region and the second source/drain region;
a source/drain contact over the first source/drain region and the second source/drain region, the source/drain contact including a glue layer in contact with the second isolation region;
a silicide layer in contact with the source/drain contact and the second isolation region;
a first replacement fin abutting the first isolation region and the first source/drain region; and
a second replacement fin abutting the first isolation region and the second source/drain region.

10. The device of claim 9, wherein the sidewall of the first source/drain region contacting the second isolation region and a sidewall of the first isolation region contacting the second isolation region are substantially coplanar.

11. The device of claim 9, wherein the second isolation region is in contact with a bottom surface of the at least one gate structure.

12. The device of claim 11, wherein the second isolation region is in contact with sidewalls of a gate spacer layer abutting the at least one gate structure.

13. The device of claim 9, wherein the source/drain contact includes a glue layer in contact with the second isolation region.

14. A device, comprising:
a first stack of semiconductor channels and a second stack of semiconductor channels laterally separated from each other;
at least one gate structure wrapping around the first stack of semiconductor channels and the second stack of semiconductor channels;
a first source/drain region abutting the first stack of semiconductor channels on a first side of the gate structure;
a second source/drain region abutting the second stack of semiconductor channels on the first side of the gate structure; and
an isolation structure between the first source/drain region and the second source/drain region, including:
a first isolation region in contact with bottom surfaces of the first source/drain region and the second source/drain region; and
a second isolation region in contact with sidewalls of the first source/drain region and the second source/drain region, and extending from a bottom surface of the first isolation region to upper surfaces of the first source/drain region and the second source/drain region.

15. The device of claim 14, wherein the sidewall of the first source/drain region contacting the second isolation region and a sidewall of the first isolation region contacting the second isolation region are substantially coplanar.

16. The device of claim 14, wherein the second isolation region is in contact with a bottom surface of the at least one gate structure.

17. The device of claim 16, wherein the second isolation region is in contact with sidewalls of a gate spacer layer abutting the at least one gate structure.

18. The device of claim 14, further comprising a source/drain contact over the first source/drain region and the second source/drain region.

19. The device of claim 18, further comprising a silicide layer in contact with the source/drain contact and the second isolation region.

20. The device of claim 18, wherein the source/drain contact includes a glue layer in contact with the second isolation region.

* * * * *